US007513920B2

(12) United States Patent
Siddiqui et al.

(10) Patent No.: US 7,513,920 B2
(45) Date of Patent: *Apr. 7, 2009

(54) FREE RADICAL-FORMING ACTIVATOR ATTACHED TO SOLID AND USED TO ENHANCE CMP FORMULATIONS

(75) Inventors: Junaid Ahmed Siddiqui, Richmond, VA (US); Robert J. Small, Tuscon, AR (US); Daniel Hernandez Castillo, Laveen, AR (US)

(73) Assignee: DuPont Air Products NanoMaterials LLC, Tempe, AZ (US)

( * ) Notice: Subject to any disclaimer, the term of this patent is extended or adjusted under 35 U.S.C. 154(b) by 534 days.

This patent is subject to a terminal disclaimer.

(21) Appl. No.: 11/264,027

(22) Filed: Nov. 2, 2005

(65) Prior Publication Data

US 2006/0117667 A1    Jun. 8, 2006

Related U.S. Application Data

(63) Continuation-in-part of application No. 10/759,666, filed on Jan. 16, 2004, now Pat. No. 7,077,880, and a continuation-in-part of application No. 10/361,822, filed on Feb. 11, 2003, now Pat. No. 7,029,508, which is a continuation-in-part of application No. 10/074,757, filed on Feb. 11, 2002, now abandoned.

(51) Int. Cl.
*C09G 1/02* (2006.01)
*C09G 1/04* (2006.01)

(52) U.S. Cl. .............................. 51/307; 51/308; 51/309; 106/3; 438/691; 438/692; 438/693

(58) Field of Classification Search .................. 51/307, 51/308, 309; 106/3; 438/692, 693, 691
See application file for complete search history.

(56) References Cited

U.S. PATENT DOCUMENTS

| | | | |
|---|---|---|---|
| 2,630,410 A | 3/1953 | Clapsadle et al. |
| 3,007,878 A | 11/1961 | Alexander et al. |
| 3,139,406 A | 6/1964 | Mindick et al. |
| 3,252,917 A | 5/1966 | Mindick et al. |
| 3,293,093 A | 12/1966 | Jones et al. |
| 3,620,126 A | 11/1971 | Moore, Jr. |
| 3,745,126 A | 7/1973 | Moore, Jr. |
| 3,922,393 A | 11/1975 | Sears, Jr. |
| 4,252,671 A | 2/1981 | Smith |
| 4,478,742 A | 10/1984 | Payne |
| 4,769,073 A | 9/1988 | Tastu et al. |
| 4,959,113 A | 9/1990 | Roberts |
| 5,084,071 A | 1/1992 | Nenadie et al. |
| 5,225,034 A | 7/1993 | Yu et al. |
| 5,234,880 A | 8/1993 | Cook et al. |
| 5,302,356 A | 4/1994 | Shadman et al. |
| 5,340,370 A | 8/1994 | Cadien et al. |
| 5,354,490 A | 10/1994 | Yu et al. |
| 5,445,996 A | 8/1995 | Kodera et al. |
| 5,527,423 A | 6/1996 | Neville et al. |
| 5,735,963 A | 4/1998 | Obeng |
| 5,759,917 A | 6/1998 | Grover et al. |
| 5,773,364 A | 6/1998 | Farkas et al. |
| 5,783,489 A | 7/1998 | Kaufman et al. |
| 5,785,868 A | 7/1998 | Li et al. |
| 5,891,205 A | 4/1999 | Picardi et al. |
| 5,948,697 A | 9/1999 | Hata |
| 5,958,228 A | 9/1999 | Tokushima et al. |
| 5,958,288 A | 9/1999 | Mueller et al. |
| 5,958,794 A | 9/1999 | Bruxvoort et al. |
| 5,976,480 A | 11/1999 | Mangold et al. |
| 5,980,775 A | 11/1999 | Grumbine et al. |
| 5,997,620 A | 12/1999 | Kodama et al. |
| 6,015,506 A | 1/2000 | Streinz et al. |
| 6,022,400 A | 2/2000 | Izumi et al. |
| 6,030,425 A | 2/2000 | Hata |
| 6,068,787 A | 5/2000 | Grumbine et al. |
| 6,117,026 A | 9/2000 | Hayashi et al. |
| 6,117,775 A | 9/2000 | Kondo et al. |
| 6,117,783 A | 9/2000 | Small et al. |
| 6,140,239 A | 10/2000 | Avanzino et al. |
| 6,156,661 A | 12/2000 | Small et al. |
| 6,159,076 A | 12/2000 | Sun et al. |
| 6,177,026 B1 | 1/2001 | Wang et al. |
| 6,214,098 B1 | 4/2001 | Lee |
| 6,235,693 B1 | 5/2001 | Cheng et al. |
| 6,248,704 B1 | 6/2001 | Cheng et al. |
| 6,251,150 B1 | 6/2001 | Small et al. |

(Continued)

FOREIGN PATENT DOCUMENTS

EP       0 831 136 A2    3/1998

(Continued)

OTHER PUBLICATIONS

RGR Bacon "The Initiation of Polymerisation Processes by Redox Catalysts" Quarterly Reviews, p. 287-310.

(Continued)

*Primary Examiner*—Michael A Marcheschi
(74) *Attorney, Agent, or Firm*—Morgan Lewis & Bockius LLP

(57) ABSTRACT

A CMP composition having: a fluid comprising water and at least one oxidizing compound that produces free radicals when contacted with an activator; and a plurality of particles having a surface and comprising at least one activator selected from ions or compounds of Cu, Fe, Mn, Ti, or mixtures thereof disposed on said surface, wherein at least a portion of said surface comprises a stabilizer. Preferred activators are selected from inorganic oxygen-containing compounds of B, W, Al, and P, for example borate, tungstate, aluminate, and phosphate. The activators are preferably ions of Cu or Fe. Surprisingly, as little as 0.2 ppm and 12 ppm of activator is useful, if the activator-containing particles are suspended in the fluid as a slurry. Advantageously, certain organic acids, and especially dihydroxy enolic acids, are included in an amount less than about 4000 ppm. Advantageously, activator is coated onto abrasive particles after the particles have been coated with stabilizer.

7 Claims, No Drawings

U.S. PATENT DOCUMENTS

| | | | |
|---|---|---|---|
| 6,270,395 | B1 | 8/2001 | Towery et al. |
| 6,293,848 | B1 | 9/2001 | Fang et al. |
| 6,299,795 | B1 | 10/2001 | Liu et al. |
| 6,313,039 | B1 | 11/2001 | Small et al. |
| 6,332,831 | B1 | 12/2001 | Shemo et al. |
| 6,362,104 | B1 | 3/2002 | Wang et al. |
| 6,375,545 | B1 | 4/2002 | Yano et al. |
| 6,383,065 | B1 | 5/2002 | Grumbine et al. |
| 6,399,492 | B1 | 6/2002 | Andreas et al. |
| 6,435,947 | B2 | 8/2002 | Mueller et al. |
| 6,461,227 | B1 | 10/2002 | Fang |
| 6,468,428 | B1 | 10/2002 | Nishii et al. |
| 6,498,131 | B1 | 12/2002 | Small et al. |
| 6,541,384 | B1 | 4/2003 | Sun et al. |
| 6,544,307 | B2 | 4/2003 | Shimamoto et al. |
| 6,692,362 | B2 | 2/2004 | Drees et al. |
| 6,722,950 | B1 | 4/2004 | Dabral et al. |
| 6,743,267 | B2 | 6/2004 | Jernakoff et al. |
| 6,752,844 | B2 | 6/2004 | Miller et al. |
| 6,797,624 | B2 | 9/2004 | Lee |
| 6,884,723 | B2* | 4/2005 | Sinha et al. ............... 438/691 |
| 6,896,710 | B2 | 5/2005 | Grunwald |
| 7,014,669 | B2* | 3/2006 | Small et al. ............... 51/307 |
| 7,029,508 | B2* | 4/2006 | Scott et al. ............... 51/307 |
| 7,077,880 | B2* | 7/2006 | Siddiqui ............... 51/307 |
| 2001/0036804 | A1* | 11/2001 | Mueller et al. ............... 451/526 |
| 2001/0037821 | A1 | 11/2001 | Staley et al. |
| 2002/0017063 | A1 | 2/2002 | Beitel et al. |
| 2003/0162398 | A1 | 8/2003 | Small et al. |
| 2004/0006924 | A1 | 1/2004 | Scott et al. |
| 2004/0029495 | A1 | 2/2004 | Small et al. |
| 2005/0155296 | A1 | 7/2005 | Siddiqui |
| 2007/0037892 | A1* | 2/2007 | Belov ............... 516/79 |

FOREIGN PATENT DOCUMENTS

| | | | |
|---|---|---|---|
| EP | 0 844 290 | A1 | 5/1998 |
| EP | 0 846 742 | A2 | 6/1998 |
| EP | 0 984 048 | A2 | 3/2000 |
| EP | 1 020 488 | A2 | 7/2000 |
| EP | 1 020 501 | A2 | 7/2000 |
| EP | 1 036 836 | A1 | 9/2000 |
| EP | 1 072 662 | A1 | 1/2001 |
| EP | 1 302 522 | | 4/2003 |
| WO | 96/38262 | | 12/1996 |
| WO | 99/53532 | | 10/1999 |
| WO | WO99/61540 | | 12/1999 |
| WO | 01/30928 | A1 | 5/2001 |
| WO | 01/32794 | A1 | 5/2001 |
| WO | 02/33736 | A1 | 4/2002 |
| WO | WO03/068882 | | 8/2003 |

OTHER PUBLICATIONS

HJH Fenton "Oxidation of Tartaric Acid in Presence of Iron" 1894, 65 p. 899-910.

MCR Symons "Evidence for Formation of Free-Radical Intermediates in Some Reactions Involving Periodate" (1955) pp. 2794-2796.

Cheves Walling "Free Radicals in Solution" John Wiley & Sons (1957) pp. 564-579.

Abstract for "Comparison of Mineral and Soluble Iron Fenton's Catalysts for the Trichloromethylene" by Teel et al., Water Research vol. 35(4) 2001, p. 977-984.

"The Chemistry of Silica" by R. .K. Iler, Wiley Interscience (1979), p. 410-411.

Benjamin S. Lane and K. Burgess "A Cheap Catalytic, Scalable, and Environmentally Benign Method for Alkene Epoxidations" American Chem. Soc. vol. 123(12), 2001, p. 2933-2934.

"Mechanistic Apects of Chemical Mechanical Polishing of Tungsten Using Ferric Ion Based Alumina Slurries" by Raghunath et al., ESP, vol. 96-22, pp. 1-15.

"Electrochemical Aspects of the Chemical Mechanical Planarization of Tungsten" by Basak et al., ESP vol. 96-22, pp. 137-148.

B. Mueller et al., "Polishing Surfaces for Integrated Circuits" Chemtech. Feb. 1998, p. 38-46.

Landis et al. Thin Solids Films, 220, p. 1 "Integrating of Chemical Mechanical Polishing into CMOS Integrated Circuit Manufacturing" date unknown.

* cited by examiner

US 7,513,920 B2

FREE RADICAL-FORMING ACTIVATOR ATTACHED TO SOLID AND USED TO ENHANCE CMP FORMULATIONS

RELATED APPLICATIONS

This application claims priority to and is a continuation-in-part of U.S. application Ser. No. 10/361,822 filed Feb. 11, 2003 now U.S. Pat. No. 7,029,508, which is in turn a continuation-in-part of U.S. application Ser. No. 10/074,757 filed Feb. 11, 2002 now abandoned, the entire contents of which are each incorporated herein for all purposes by express reference thereto. This application also claims priority to U.S. application Ser. No. 10/759,666 filed Jan.16, 2004 now U.S. Pat. No. 7,077,880, which is incorporated herein for all purposes by express reference thereto, and of which the instant application is a continuation-in-part.

FIELD OF THE INVENTION

The invention relates generally to a system that is useful in chemical mechanical polishing or planarization (hereafter CMP) processes, and an associated method of polishing a substrate using the system. More particularly, the invention relates to a composition comprising a fluid, a oxidizing agent capable of producing inorganic oxygen-containing free radical, and a free radical-inducing activator ion or salt which is affixed to a solid in contact with the composition, and which when contacted by the oxidizing agent increases the rate at which the oxidizing agent produces free radical. The composition is useful in the polishing of various layers, such as metal layers, on substrates.

BACKGROUND OF THE INVENTION

A semiconductor wafer generally has a substrate surface on which one or more integrated circuits is formed. The substrate surface is desirably as flat, or planar, as possible before the surface is processed to form the integrated circuits. A variety of semiconductor processes such as for example photolithography are used to form the integrated circuits on the flat surface, during which the wafer takes on a defined topography. The topography is subsequently planarized, because an irregular surface, because the surface has an excess of material deposited thereon, or the surface havs imperfections which seriously impede subsequent fabrication processes. Thus, it is necessary to polish the wafer surface to render it as planar or uniform as possible and to remove surface imperfections.

CMP is now widely known to those skilled in the art and has been described in numerous patents and open literature publications. In a typical CMP process, a substrate (e.g., a wafer) is placed in contact with a rotating polishing pad attached to a platen. One method has the wafer held in place on a mount using negative pressure, such as vacuum, or hydrostatic or pneumatic pressure, where the mount is situated near or over a polishing pad. A CMP slurry, typically an abrasive and chemically reactive mixture, is supplied to the pad during CMP processing of the substrate. During the CMP process, the pad (fixed to the platen) and substrate are rotated while a wafer carrier system or polishing head applies pressure (downward force) against the substrate. The slurry accomplishes the planarization (polishing) process by chemically and mechanically interacting with the substrate film being planarized due to the effect of the rotational movement of the pad relative to the substrate. Polishing is continued in this manner until the desired film on the substrate is removed with the usual objective being to effectively planarize the substrate. For such a semiconductor wafer, a typical CMP process involves polishing the metal in a controlled manner to preferentially etch certain conductors, insulators or both over the oxide beneath the metal, such that the metal is substantially coplanar with the oxide and remains in the grooves or stud vias of the oxide. After CMP, the substantially coplanar surface is ready for further processing.

Economic forces are requiring the use of faster processing. One approach has involved increasing the downward pressure on the wafer carrier in order to increase material removal rates. This approach is generally disfavored as the requisite downward pressure is considered too high and too likely to cause wafer damage. Another approach has involved increasing the amount of oxidizing agent used in the CMP slurry in an effort to increase chemical removal of targeted material. This approach is largely disfavored as the use of increased amounts of oxidizing agents increase material costs and also detrimentally add to the handling issues and environmental issues associated with many oxidizing agents and also increase costs. Additional approaches have involved using various protected combinations of oxidizers, chelators, corrosion inhibitors, solvents, and other chemicals in the slurry, various abrasives including for example a zirconium abrasive or mixed abrasives, and/or using point-of-use mixing techniques. These approaches are generally undesirable, as they typically complicate CMP in terms of tooling and process control for example, consume more process time, and/or increase costs.

It is generally known that oxidizers admixed in a solution can provide synergistic etching rates. While ferric salts, cerium salts, peroxides, persulfates, or hydroxylamines form the oxidizing capacity of most commercially available CMP slurries, those of ordinary skill in the art have long known that certain of these oxidizers can be admixed with others in this group and also with other oxidizers, and the resulting composition can show synergistic results. For example, the compositions claimed in U.S. Pat. No. 6,117,783 to Small et al., which claims priority to a provisional application filed Jul. 25, 1996, the contents of which is incorporated herein by reference thereto, claims a CMP slurry having a hydroxylamine compound and hydrogen peroxide, and teaches in the specification that the two have a synergistic effect.

Many slurries use a metal ion, typically Fe ions or Ce ions, as an oxidizer, alone or in combination with another oxidizer. However, both iron and cerium, as well as other metal ions, causes metallic contamination of substrates. U.S. Pat. No. 5,773,364 describes a CMP slurry where oxidizers include ferric nitrate or cerium nitrate, and note the problem that metal ions are created as a result of the oxidizing process. U.S. Pat. No. 5,958,288 suggests limiting the amount of ferric nitrate to from about 0.001 to about 2.0 weight percent, where the slurry comprises another oxidizer The ferric ion contamination may be exceedingly difficult to subsequently remove. Raghunath et al showed in Mechanistic Aspects Of Chemical Mechanical Polishing Of Tungsten Using Ferric Ion Based Alumina Slurries, in the Proceedings of the First International Symposium on Chemical Mechanical Planarization, 1997, that alumina slurries containing ferric salts is conducive to the formation of an insoluble layer of ferrous tungstate on tungsten. The industry has developed methods to remove a portion of the metallic contamination, for example by: physical desorption by solvents; changing the surface charge with either acids or bases so that Si—OH or M—OH group can be protonated (made positive) in acid or made negative with bases by removing the proton; ion competition, for example removing adsorbed metal ions by adding acid (i.e. ion exchange); subsequent oxidation of metals to change the chemical bonds between the impurities and substrate surface; and subsequent etching the surface, wherein the impurity and a certain thickness of the substrate surface is removed, as described in U.S. Pat. No. 6,313,039. There have been various post-CMP cleaners developed to remove metallic contamination, but removal of all undesired metal ions is substantially beyond the range of cleaners, and as the size of the structures continues to decrease, even a very small number of metallic atoms deposited on a surface will result in undesired shorts or current leakage. Additionally, metal ion-containing fluids and many post-CMP cleaners are environmentally undesirable and expensive treatment may be needed prior to waste disposal of used product.

Another problem with many soluble metal oxidizers is that they react with and cause degradation of other oxidizers. When a metal-containing oxidizer is admixed with a non-metal-containing oxidizer, for example hydrogen peroxide in a solution, the two often react in an undesirable fashion, and the oxidizing capacity of the mixture declines rapidly, but without any rigorous predictability, with time. For example, ferric nitrate reacts with hydrogen peroxide in CMP formulations at essentially all usable pHs, making the formulation oxidizing capacity fall with time, which complicates polishing since there is a non-uniformity problem, and also causing formation of undesired products. It is known that if the pH is above about 5, iron precipitates as $Fe(OH)_3$ which rapidly catalytically decomposes hydrogen peroxide to oxygen, without forming hydroxyl radicals.

Therefore, despite the known advantages of having multiple oxidizers, for example a metal-containing oxidizer admixed with either another metal-containing oxidizer or with a non-metal-containing oxidizer, there has been a tendency in the industry to reduce the amount of metal ions in CMP slurries. For example, Rodel, a large commercial manufacturer of CMP slurries that at point of use are designed to be used with non-metal-containing oxidizers such as peroxides and persulfates, had about 30 ppm of metals, primarily iron, in the liquid portion of an MSW1000™ slurry produced in 1995. While this iron would have functioned as a promoter, it is likely the manufacturer did not add the iron, but rather the iron was in the solution as a result of impurities. Later generations of Rodel slurries, for example the Rodel MSW1500™ slurry that was sold in 2002, has only 4.2 ppm iron, according to their web-site. Even where soluble iron ions, e.g., ferric nitrate, are added to increase rates, such as described in U.S. Pat. No. 5,958,288, the preferred amount of ferric nitrate added to a hydrogen peroxide solution is very small, that is, 0.01 to about 0.05 weight percent, or about 100 ppm to about 500 ppm. Another method of reducing metallic contamination is to use sequential CMP polishing steps using sequential formulations that have decreasing amounts of metal, so that metal deposited from earlier formulations in a CMP process are removed by CMP with subsequent formulations that are metal-free. For example, a Rodel CMP slurry, the MSW2000™, has a first formulation having 12 ppm Fe, and a second formulation that has less than 0.3 ppm Fe. However, use of sequential formulations adds additional costs to processing, as well as adding complexity to the required equipment.

There is another mechanism for synergy that has been described in co-owned U.S. published applications 20040029495, 20040006924, and 20030162398, the disclosures of which are incorporated herein by disclosure thereto. In these applications, various metals are absorbed onto abrasives in an ionic form. The synergy is based on Fenton's reaction, where the relatively benign oxidizers generate very strong, short-lived, non-organic, oxygen-containing free radicals. The classic Fenton's reaction is the production of free radicals as a byproduct of the oxidation of soluble ferrous ions by hydrogen peroxide. The useful pH for classical Fenton's reaction utilizing soluble iron ions is pH 3 and pH 6, particularly 4 to 5.

It is clear that the industry is moving away from metals, for example iron, in the fluids. Also, when iron or other metal-containing formulation is admixed with non-metal-containing oxidizers, the "pot-life" of the formulation is very short, so mixing is generally point-of-use mixing, which complicates CMP processes and equipment and can create start-up problems even after a temporary interruption on the processing. Further developments in the field of CMP technology are desired.

SUMMARY OF THE INVENTION

Selected objects of this invention are to provide a system wherein 1) higher polishing rates of conductors, insulators, barriers, and/or other surfaces are achieved from a combination of chemicals and abrasives than were otherwise achievable, 2) acceptable polishing rates of conductors, insulators, barriers, and/or other surfaces are achieved from a combination of chemicals and abrasives at lower concentrations than were achieved in the prior art; 3) provide a system where CMP can be performed at commercially acceptable removal rates with commercially acceptable uniformity in the polished product; 4) provide a system where CMP can be performed at commercially acceptable removal rates with commercially acceptable uniformity in the polished product and with substantially no metallic ion contamination of the substrate; 5) provide a system where CMP can be performed at commercially acceptable removal rates with commercially acceptable uniformity in the polished product, wherein the chemicals used are environmentally friendly, easily recoverable, or both; 6) provide a system of increasing the effectiveness of oxidizers and/or cleaners; 7) provide a method of recovering and re-using selected components of the system which are otherwise considered consumable components; and/or 8) provide a one-component system that exhibits usable shelf life for a period of at least 24 hours; and/or 9) provide an additive which increases the effectiveness of various commercial CMP slurries, beneficially without introducing additional compounds to the slurry fluid, and/or provide formulations for use in polishing that have essentially no dissolved metals, low amounts of abrasive, and low amounts of oxidizer, wherein said abrasives have residue removal rates and nonuniformity comparable or exceeding the prior art slurries which used considerably more chemicals. These objects of the invention are not exhaustive, and it is realized that not all objects of the invention will be reached by any one system.

Various specific embodiments for CMP of a substrate using various systems of the current invention are disclosed below, and the description will often include one or more preferred components. It is recognized that the preferred components can be substituted with one or more components of the same class, where various acceptable substitutes are described in later. For example, in most embodiments, the preferred transition metal is iron. Other useful transition metals include ceria, copper, and silver, used alone or in combination with one another and/or with iron. The preferred abrasive is generally colloidal silica. Other useful particles include alumina in various forms, ceria in various forms, spinels, and the like, alone or in combination with silica. The preferred oxidizer may be for example hydrogen peroxide, persulfate, or periodic acid, but any of these, combination of these, and/or other per type oxidizers that react with the transition metals associated with particles can be used. It is also recognized and is part of the invention that two or more embodiments can be combined, that is, a single system is formed having the criteria defining a plurality of below-defined embodiments, so long as the criteria defining the embodiments do not conflict. As used here, unless otherwise specified, the terms "coated", "absorbed on", and "associated with" mean having a transition metal of the current invention (an activator metal ion) associated on a surface of the object that is coated, where the activator metal ion is different than the substrate. The coating is not derived from the substrate and may be placed upon the surface via mechanical, physical, electrical, or chemical means. An intermediate layer of material, in particular a layer (molecule or molecules) of stabilizer, may be present between activator metal and the surface of the substrate. Its not clear what form the iron would be in if suspended from the substrate via an stabilizer moiety (or "chain") comprising boron-oxygen, aluminum-oxygen, tungsten-oxygen, phosphorus-oxygen, or titanium-oxygen, in particular whether it would be of the form of an ion or as a single molecule of activator-oxide. At this level, there is no easy mechanism to tell. Although a coating may be of any thickness, typically the coating has a thickness smaller than that of the substrate, and is usually believed to be between one and only several molecules or atoms in thickness. Unless otherwise specified, (e.g., unless attached to the surface of the abrasive via a stabilizer molecule or moiety, for example) the transition metal activator is believed to be present as an ion or salt, for example ferric or ferrous iron, where the ion or salt is attached to the surface of a particle. More specifically, unless otherwise specified, the transition metal activator is not an oxide, when being used in the composition. If the coated abrasive is dried, we realize the absorbed activator may at least in part be converted to an oxide, but with sufficiently long immersion in water the activator will again become an ion.

Generally, in many of the embodiments discussed below, the emphasis is on minimizing components and/or concentrations in slurries. Each embodiment, combinable with other embodiments, can either comprise, consist essentially, or consist of the listed components (where water is always present but may or may not be listed). Unless specifically stated otherwise, all % are weight %, any mention of transition metal coated or absorbed on a surface means transition metal ions or salts (not oxides) adhering to or absorbed on a abrasive, all particles sizes are number average particle size, which may be determined utilizing known techniques such as transmission electron microscopy (TEM). The mean particle diameter refers to the average equivalent spherical diameter when using TEM image analysis, i.e., based on the cross sectional area of the particles 1. Slurry CMP Method With Stabilizer-Modified Activator-Coated Particles: Without being bound by theory, we believe that the most effective mechanism to stabilize the transition metal-coated particles is to have stabilizers be attached to the particle, partially shielding the particle (through steric and/or electrodynamic forces) from oxidizer in the fluid. As used here, the term "stabilizer" means an agent effective to help maintain the abrasive as a sol in an aqueous medium. (In subsequent sections of this application, the term "stabilizer" will be used to refer to chelating additives, which have a different function which is to stabilize the oxidizer and to minimize metal contamination of the substrate.) Stabilizers have a stabilizing influence on for example a coated silica slurry by retarding settling. Inorganic stabilizers are highly preferred. Such coatings are advantageously resistant to attack by free radicals. Suitable stabilizers include ions containing boron, aluminum, tungsten, titanium, with boron being most preferred. Some preferred absorbed stabilizer ions are borate, titanate, tungstate, or aluminate.

Silanols which can be bound to the abrasive particles can form a stabilizing coating on the particle, where the silanol bound to the particle is stable and comprises a sterically effective blocking group, making this material when bound to for example silica resistant to attack by free radicals. Exemplary stabilizers which can form bonds with the abrasive include the traditional halogenated trialkylsilanes and halogenated trialkoxysilanes, for example chlorotrimethylsilane and chlorotrimethoxysilane. The silica-containing stabilizers can be added before the activator ions are absorbed onto the abrasive, or after the activator ions are absorbed onto the abrasive, so long as if added afterward the silanes do not bond directly with the absorbed activator ions. In one embodiment, the short chain stabilizers comprise a chelating moiety to trap iron ions, copper ions, or the like. This will promote stability, but the transition metals may be too loosely held to the particle during polishing, and such chelating elements are therefore not expected to reduce iron ion contamination of a substrate during polishing.

The stabilizer may be a phosphorous-containing ion (e.g., from pyrophosphoric acid or from phosphoric acid) that is tightly bound to the abrasive, e.g., the alumina or silica, preferably silica. Preferably, however, the stabilizer comprises at least one member selected from the group consisting of B, W and Al. In addition to the stabilizer, the abrasive will also have absorbed on its surface the at least one transition metal ion selected from the group consisting of Ag, Ce, Cu, Fe, Mn, Ti, W and/or V, provided that the at least one stabilizer and the at least one catalyst are not simultaneously W. The preferred absorbed transition metal ions or salts are iron and copper.

The stabilizer may comprise stannate ions absorbed onto the abrasive.

In this particular case, in an alternate embodiment, wherein the surface of the abrasive is modified by absorbed borate, tunstate, and/or aluminate, the transition metal coated onto the surface can be a molecular species, for example an oxide, and/or the transition metal can be an absorbed ion or salt.

The most preferred stabilizer comprises B, which can be provided from for example boric acid, and the most preferred transition metal ion coated onto the abrasive comprises iron. It is preferred that at least 1%, more preferably 40-95%, even more preferably 80-99+% of available surface sites on the abrasive be occupied by the stabilizer and the catalyst. It is more preferred that 80-99+% of available surface sites on the abrasive be occupied by the stabilizer, where the activator is added after the stabilizer.

The surface coverage of the surface modified abrasive can be characterized using zeta potential measurement. For example, the amount of surface coverage of boric acid on the silica surface can be measured using a Colloidal Dynamics instrument, manufactured by Colloidal Dynamics Corporation, 11-Knight Street, Building E8, Warwick, R.I., 02886. The Colloidal Dynamics instrument measures the zeta potential (surface charge) of the surface modified silica particles. During the preparation of boric acid modified silica, boric acid is added to the deionized silica particles, which changes the zeta potential of the silica particle surface. After reaching the full surface coverage, there is no change in the zeta potential of the surface modified silica. From this titration curve of zeta potential as a function of grams of boric acid to a given amount of deionized silica, it is possible to measure the percent surface coverage of boric acid on the silica surface. After completing the reaction with boric acid, the surface coverage achieved by reacting the boron-modified sol with the selected transition metal salts (activators), and completion of the reaction can also be determined from the zeta potential.

The amount of stabilizer is typically between 0.1% to 5% of the weight of the stabilizer-coated particles. The amount of activator is typically between 0.01% to 3% by weight of the weight of the activator(and optionally stabilizer)-coated particles. In one embodiment, the stabilizer covers more than 95%, preferably 98% or more of the surface of the activator-coated abrasive, and the total amount of activator in the slurry is between 0.2 ppm and 12 ppm, for example between about 3 ppm and 8 ppm. In some embodiments, more activator is added to the abrasive, and then some activator is removed by for example contacting the activator-coated abrasive with an acid that will remove a portion of the activator. The acid can then be separated from the abrasive, leaving on the abrasive only the more tenaciously bound activator. In preferred embodiments there is between 0 and 3, preferably between 0 and 1.5 ppm soluble activator. Advantageously the amount of activator-coated abrasive is between 0.2% to 2%, for example between 0.25% and 1%, where the slurry can further comprise between 0 and 2% activator-free abrasive.

The invention includes a method of polishing by using a slurry comprising a fluid portion comprising: water and a per-type oxidizer capable of forming free radicals such as hydroxyl radicals in the slurry; and particles comprising a transition metal coating thereon, such coating being exposed to the oxidizer that in turn reacts with the transition metal-coated particles to create free radicals in an amount useful for accelerating a chemical mechanical polishing process. The preferred the preferred transition metal is iron, the preferred abrasive is colloidal silica, and preferred oxidizers are hydrogen peroxide, peracetic acid, or periodic acid. Not all abrasive need contain transition metal. One embodiment uses transition metal coated-silica having a diameter of about 0.07 to about 0.09 microns, and uncoated silica of size about 0.06 to 0.08 microns in diameter. Advantageously, however, even abrasive without the absorbed transition metal ions should have stabilizer absorbed thereon. The polishing composition is useful at all commercially useful pH values, e.g., from about 1.5 to 9. The preferred pH is between about 2 and about 8, for example between 2.5 and 7, but is typically between 3 and 6.5.

It is surprising that iron can operate at high pH values, i.e., pH greater than 5, as conventional wisdom would suggest that the iron would form inactive (and highly detrimental) hydroxides. $Fe(OH)_3$ start to precipitate at pH 2.5-3, and substantially completely precipitate at pH 3.7-4 when the concentration of the iron ions $Fe^{3+}$ is 0.001M or about 60 ppm. When the slurry is prepared without for example a boric acid stabilizer, advantageously the pH of the silica in deionized water is adjusted to about 2 with nitric acid, boric acid, phosphoric acid, or the like in order to cover the surface with SiOH group before adding ferric ions into the slurry. Surprisingly the silica surface then adsorbs $Fe^{3+}$ cations very strongly even though at this pH the SiOH groups would not normally be ionized. The pH of the composition in use is advantageously between 3.5 and 6.5. Without being bound by theory, we believe that since $Fe^{3+}$ is very insoluble at this pH 3.5, the iron ions remain permanently capped on silica surface. Equally surprising, despite the pH being equal to or greater than 3.5 (which means we should have $Fe_xOH_y$ or $Fe_xO_y$) we still see Fenton's reagent activity).

Generally, the addition of between 20 and 2000 ppm, typically 50 ppm to 400 ppm by weight of an α,β-dihydroxy enolic compound such as ascorbic acid or derivative thereof, is beneficial to stabilize the slurry (providing a slurry shelf life of days to even a week or so). Exemplary α,β-dihydroxy enolic five member ring compounds include: 4-Dihydroxymethyl-2,3-dihydroxy-cyclopent-2-enone; 4-(1,2-Dihydroxyethyl)-2,3-dihydroxy-cyclopent-2-enone; 3,4-Dihydroxy-5-hydroxymethyl-5H-furan-2-one; 3,4-Dihydroxy-5-(1-hydroxy-propyl)-5H-furan-2-one; 3,4-Dihydroxy-5H-thiophen-2-one; 3,4-Dihydroxy-5H-furan-2-one; 2,3-Dihydroxy-cyclopent-2-enone; and 3,4-Dihydroxy-1,5-dihydro-pyrrol-2-one. Exemplary six member ring dihydroxy enolic compounds include 2,3-dihydroxy-1,4-benzenedione; 2,3-Dihydroxy-1H-pyridin-4-one; 2,3-Dihydroxy-thiopyran-4-one; Tetrahydroxy 1,4-benzoquinone, and in its most simple form 2,3-Dihydroxy-cyclohexa-2,5-dienone or 2,3-Dihydroxy-cyclohex-2-enone. Exemplary seven member ring dihydroxy enolic compounds include 2,3-Dihydroxy-cyclohepta-2,6-dienone and 5,6-Dihydroxy-1,7-dihydro-azepin-4-one. The most preferred α,β-dihydroxy enolic compounds are ascorbic acid and the similar erythorbic acid, or derivatives and/or mixtures thereof. Representative derivatives of ascorbic acid include, but are not limited to, ascorbic palmitate; dipalmitate L-ascorbate; or ammonium L-ascorbate-2-sulfate. Advantageously, if ascorbic acid derivatives are used, the molarity of the ascorbic acid derivatives should be about the same as the molarity of the above-described ascorbic acid ina slurry. Alternatively, or additionally, the composition can comprise between 20 and 1000 ppm of stable alkynes, for example alkyne diols (Surfynol 104E) that complex with iron and/or copper ions. In certain embodiments of the invention, the polishing composition can also include an alkyne compound having at least one hydroxyl substituent, as disclosed in pending U.S. patent application Ser. No. 10/315,398, filed Dec. 9, 2002. Alternatively, or additionally, the composition may comprise between 20 and 1000 parts of citric, lactic, glycolic, and/or salicylic acid per part of dissolved iron and/or copper.

This is considered the basic slurry, and the other embodiments can be considered to be variants of this slurry.

2. Slurry CMP Method—Essentially Pure Slurry: The invention includes a method of polishing by using a slurry consisting essentially of a fluid portion comprising: water; a per-type oxidizer capable of forming free radicals such as hydroxyl radicals in the slurry, and optionally one or more pH-adjusting additives in an amount less than 0.3%; and particles comprising a transition metal coating thereon, such coating being exposed to the oxidizer that in turn reacts with the transition metal-coated particles to create free radicals in an amount useful for accelerating a chemical mechanical polishing process. The preferred transition metal is iron, the preferred abrasive is colloidal silica, and preferred oxidizers are hydrogen peroxide or periodic acid. The composition may optionally comprise abrasive that is free of a transition metal coating thereon. This embodiment recognizes the value of not having any (alternatively less than 1000 ppm) of organic material containing 3 or more carbon atoms, including organic corrosion inhibitors, chelators, and organic acids. If organic compounds are present, they are preferably in an amount less than 1000 ppm, and more preferably they are selected from ascorbic acid, alkyne diols, citric acid, lactic acid, glycolic acid, and/or salicylic acid, or combinations thereof. In addition to quenching free radicals, too much chelators can adversely effect some oxide structure. This embodiment recognizes the value of not having any dissolved transition metals (alternatively less than 10 ppm, more preferably less than 3 ppm, for example about 2 ppm or less, prior to polishing), such as dissolved ferric ions and the like.

Generally, we have found that the fewer additives added, the better the system performance. But a small amount of chelators, preferably citric, lactic, glycolic, and/or salicylic acid, can be necessary under certain conditions. For example, at pH 5 the solubility of the various tungsten by-products are poor and in the absence of chelators there can be a poor finish on the wafer due to re-precipitation. W removal rate can progressively get higher as the pH increases, up to ~5500+ angstroms/minute in the presence of sufficient chelators. Complexing agents are not needed to control the decomposition rate of the hydrogen peroxide in the storage tanks and distribution lines for periods of time in the range of hours to days. A small amount of certain stabilizers can extend tank life to a week or more.

3. Slurry CMP Method With Low Oxidizer Concentrations: As discussed above, we have beneficially found that the slurries and fluids of the present invention can achieve commercially acceptable substrate removal rates with very low oxidizer concentrations. This low-oxidizer-concentration embodiments reduce the absolute amounts of undesired hydrogen gas that can be produced, reduce chemical cost, reduce problems of exposure of workers and equipment to high concentrations of these somewhat hazardous compounds, facilitate neutralization of the oxidizer prior to disposal or even allow disposal without neutralization. By commercial rates it is meant over 1000, for example over 2000, angstroms per minute for components such as tungsten, aluminum, copper, tantalum, iron, nickel, and the like, and over 300, for example over 600, angstroms per minute for noble metals. If iron is the transition metal forming the coating on the abrasive, then as little as 1 ppm iron (based on the weight of the polishing slurry) coated on silica can provide a 100% increase in polishing rates. More typically, between 2 and 4 ppm iron activator is present at normal concentrations (about 2% to about 5%) of hydrogen peroxide. Polishing rates are for wafers polished under normal parameters. The invention includes a method of polishing by using a slurry comprising a fluid portion comprising: water; a per-type oxidizer capable of forming free radicals such as hydroxyl radicals in the slurry; and particles comprising a transition metal coating thereon, such coating being exposed to the oxidizer that in turn reacts with the transition metal-coated particles to create free radicals in an amount useful for accelerating a chemical mechanical polishing process. The preferred the preferred transition metal is iron, the preferred abrasive is colloidal silica, and preferred oxidizer is hydrogen peroxide or periodic acid or mixture thereof. Slurries of this embodiment contain from about 0.2% to about 3%, for example from 0.5% to 2%, e.g., about 0.5% to about 1.5%, by weight of hydrogen peroxide, peracetic acid, periodic acid, a persulfate compound, a periodate compound, or a combination thereof, compared to the weight of the fluid. At such low concentrations of oxidizer, it is preferable to have between about 4 and 20 ppm of iron coated on silica abrasive.

4. Solution and Activator-Coated-Abrasive Pad CMP Method: The invention includes a method of polishing by using a slurry comprising a fluid portion comprising: water; a per-type oxidizer capable of forming free radicals such as hydroxyl radicals in the slurry; and a polishing pad or roll having particles comprising a transition metal ionic coating thereon, such coating being exposed to the oxidizer that in turn reacts with the transition metal-coated particles to create free radicals in an amount useful for accelerating a chemical mechanical polishing process. Advantageously the particles, coated to or embedded on or in the pad, comprise silica. The polishing pads may have an abrasive character, such that the abrasion is primarily by action of the pad rather than by the coated particles. In such an embodiment, the coated particles may be very small, e.g., between 5 and 100 nanometers in diameter, or have a hardness such that the particles are not abrasive, or both.

5. Slurry and Abrasive Pad CMP Method: The invention includes a method of polishing by using abrasive pads, where the pad is used with a slurry comprising particles having transition metal ions thereon, and at least one oxidizer that reacts with the transition metal-coated particles to create free radicals in an amount useful for accelerating a chemical mechanical polishing process. Advantageously the particles comprise silica. In such an embodiment, the coated particles may be very small, e.g., between 5 and 40 nanometers in diameter, or in low concentration, e.g., 0.05% to 0.5% by weight of the slurry, or have a hardness such that the particles are not abrasive, or any combination thereof.

6. Slurry CMP Method With Stable Slurry: The invention includes a method of polishing by using polishing slurries comprising transition metal-coated particles in a slurry with at least one oxidizer that reacts with the transition metal-coated particles to create free radicals in an amount useful for accelerating a chemical mechanical polishing process, wherein the slurry can be on average premixed at least 12 hours, or at least 24 hours, for example at least 96 hours, prior to use. This is advantageous because it allows the operator to make larger batches, thereby reducing mixing time. A problem in the art has been that slurries deteriorate by losing oxidizer and often having resultant pH shifts over time, so the operator can not readily depend on a constant slurry activity. The very pure embodiments and the low transition metal embodiments, and particularly the combination thereof, are preferred embodiments for stability. The slurry of this invention loses less than 2% (preferably less than 1%) of the oxidizer initially present per hour, or has a pH change of less than 0.04 pH units (preferably less than 0.01 pH units) per hour, or both. The more preferred slurry of this invention loses considerably less than 0.5% of the oxidizer initially present per hour, and has a pH change of less than 0.02 pH units per hour. Such a slurry can advantageously have between 20 and 500 ppm, for example between 50 ppm and 200 ppm, of a free radical quencher therein. The preferred free radical quencher is ascorbic acid, though some or all of the ascorbic acid can be replaced by equimolar amounts of lactic acid or other chelators.

7. Slurry CMP Method With Very Small Amounts of Coated Particles: The invention includes a method of polishing by using polishing slurries comprising very low levels of transition metal-coated particles in a slurry with at least one oxidizer that reacts with the transition metal-coated particles to create free radicals in an amount useful for accelerating a chemical mechanical polishing process. The preferred transition metal is iron, the preferred transition-metal-coated-particle comprises silica. Generally, there is between 1% and 6% by weight of silica having transition metal (e.g., iron ions or salts) on the surface thereof. In this embodiment, the total amount of transition-metal-coated-particle abrasive is between 0.01% and 1%, preferably 0.1% to 0.6%, for example about 0.2% to 0.5%, based on the weight of the slurry. We have previously stated that typically transition metal coated particles typically have between 0.01% to 3% of iron thereon by weight of the particles. The slurry may or may not contain additional abrasives. The slurries of this embodiment preferably have small particles, between about 0.005 and 0.1 microns, typically 0.04 to 0.07 microns, in diameter. The total amount of abrasive can be very small. In a preferred embodiment, the amount of abrasive is between about 0.2% and 2%, for example between about 0.4% and about 1%, and in one preferred embodiment the amount of abrasive is between about 0.5% and about 0.8% by weight of the slurry, where the abrasive comprises ftumed silica, colloidal silica, or a mixture thereof with a particle size of between about 0.01 and about 0.2 microns.

8. Slurry CMP Method With Very Small Silica Abrasive:

The invention includes a method of polishing by using polishing slurries comprising very low levels of transition metal-coated silica particles in a slurry with at least one oxidizer that reacts with the transition metal-coated particles to create free radicals in an amount useful for accelerating a chemical mechanical polishing process, wherein slurries of this embodiment have very small particles, between about 0.003 and 0.07 microns in diameter, preferably between about 0.007 and 0.03 microns in diameter. The preferred transition metal is iron, the preferred particle comprises silica. In one embodiment, the transition metal ion coated silica has an average diameter of about 0.03 to about 0.05 microns in diameter. Another embodiment uses silica with an uses coated-silica having a diameter of about 0.005 to about 0.025 microns in diameter, where at least a portion of the particles are in the form of loosely bound aggregates, chains of individual particles, or combinations thereof.

9. Slurry CMP Method With Sub-Monolayer Amounts of Bound Transition Metal:

The invention includes a method of polishing by using polishing slurries comprising transition metal-coated particles in a slurry with at least one oxidizer that reacts with the transition metal-coated particles to create free radicals in an amount useful for accelerating a chemical mechanical polishing process, where the transition metal(s) present are present on the particles in an amount less than is needed to form a monolayer the surface of the coated particles. In a preferred embodiment the transition metal(s) present are present on the particles in an amount needed to form a monolayer on between 10% and 90%, i.e., about 25% to about 75%, of the surface of the coated particles. In another embodiment the transition metal(s) present are present on the particles in an amount needed to form a monolayer on between 0.1 and 9%, i.e., about 1 and about 5%, of the surface of the coated particles. In each of these embodiments, the surface is the outer surface of the particles, which can be obtained by absorption techniques using material that will not penetrate pores in the particles, or by observation by for example a microscope, an electron microscope, or other means of a statistically significant number of particles to determine an average outer surface area. The amount of transition metal present depends on the particle size of the coated particles. For example, slurry having 1% by weight of substantially spherical silica particles having a monolayer iron coating on 25% of the outer surface would have about 10 ppm of bound iron if particles are 0.14 microns in diameter, about 17 ppm of bound iron if particles are 0.08 microns in diameter, and about 50 ppm of bound iron if particles are 0.025 microns in diameter.

10. Slurry CMP Method With Very Small Amounts of Particle-Bound Transition-Metal:

Relatively large amounts of transition metals can be found even with sub-monolayer coatings of transition metals. However, it has been shown that extremely low levels of bound transition metal, especially iron and especially in combination with hydrogen peroxide, are beneficial. The invention includes a method of polishing by using polishing slurries comprising very low levels of transition metal, where the transition metal is coated to particles, in a slurry with at least one oxidizer that reacts with the transition metal-coated particles to create free radicals in an amount useful for accelerating a chemical mechanical polishing process, wherein the total amount of transition metal associated with the surface of particles is less than about 40 ppm by weight of the slurry, preferably less than about 25 ppm by weight of the slurry. The preferred transition metal is iron, the preferred transition-metal-coated-particle comprises silica. The total amount of transition metal (preferably iron) of the current invention coated on abrasive particles is between 0.5 ppm and about 40 ppm, for example between about 1 ppm and about 25 ppm, for example between 1 ppm and 9 ppm. Very surprisingly, a composition having as little as 0.1% of iron (by weight of silica) coated on the silica, where the silica is present on an amount of 0.3% by weight in the slyurry, will provide a slurry with only 3 ppm of activator iron, but when used in a slurry with the oxidizer capable of producing free radicals will provide well over a 20% increase in polishing rate than if the silica is uncoated and iron free (even if there is 3 ppm iron in solution in the slurry. In preferred embodiments of the invention, the slurry may contain about 3 ppm activator absorbed onto an abrasive, or alternatively the slurry may contain about 4 ppm activator absorbed onto an abrasive, or alternatively the slurry may contain about 5 ppm activator absorbed onto an abrasive, or alternatively about 10 ppm activator absorbed onto an abrasive. Again, we use "absorbed on", "coated on", and "associated with" interchangably, and each term encompasses embodiments where the activator is for example bound to a stabilizer, which is in turn bound to a abrasive particle. In fact, we have surprisingly found that, at total activator levels between about 3 ppm and about 10 ppm, that iron added to stabilized silica provided greater substrate removal rates than did a similar amount of iron coated on un-stabilized silica. The reason is unclear. Similar amounts can be useful for copper coated on an abrasive, though silver, titanium, and/or tungsten may require somewhat higher concentrations. If mixed with equal amounts of say copper ions coated on silica, then the amount of iron can be further reduced, by about a third, from the above low levels. Unlike dissolved metal co-oxidizer formulations, where very small amounts of transition metal have little effect, applicants have found that very small levels of these particular transition metals, when coated to abrasive particles, greatly increase polishing rates. Very low embodiments, having for example 0.5 ppm to 9 ppm, have a large effect on the rate of substrate removal but contribute very little dissolved metal to the fluid portion of the slurry. The slurry may or may not contain additional, i.e., non-coated, abrasives, but preferred embodiments contain non-coated abrasives as well as coated abrasives, and the transition metal-coated abrasive have between 10% and 75% of the outer surface covered by a monolayer of the transition metal(s). The slurries of this embodiment advantageously have abrasive particles of average size between about 0.005 and 0.2 microns in diameter. Generally, the slurries of this embodiment also have very low amounts of abrasive, i.e., less than about 3%, for example between about 0.5 and 2% by weight of the slurry.

11. Slurry CMP Method To Reduce Hydrogen Production:

One problem facing operators using certain slurries, for example hydrogen peroxide and iron, is hydrogen generation. Hydrogen is extremely explosive and is lighter than air, allowing hydrogen to accumulate in areas where one would ordinarily not expect gas to accumulate. Preferred polishing methods to minimize hydrogen production are to use two component formulations, the first containing a non-metal-containing oxidizer or oxidizers of the current invention, and the second containing the coated particles, admixing them at point of use. After point of use, the coated particles are advantageously immediately, i.e., within a few tens of minutes, separated from the liquid portion of the slurry. The invention includes a method of polishing by using a slurry comprising: a first portion comprising water, a per-type oxidizer capable of forming free radicals such as hydroxyl radicals in the slurry, and optionally one or more pH-adjusting additives; and a second portion comprising water and particles comprising a transition metal coating thereon, such coating being exposed to the oxidizer that in turn reacts with the transition metal-coated particles to create free radicals in an amount useful for accelerating a chemical mechanical polishing process, and optionally one or more pH-adjusting additives, wherein the first and second components are mixed within an hour of being used, preferably within a minute of being used, and is typically mixed a few seconds prior to time of use, use being the time when the slurry contacts the substrate in a manner such that chemical mechanical polishing occurs.

In one embodiment, the particles are substantially separated from the fluid portion of the slurry within a few tens of minutes of time of use. In some embodiments, fluids have less than 5 ppm, for example less than 2 ppm, of dissolved transition metals (other than those polished from the substrate, and other than tin, which can be a stabilizer) in any fluid portion of the slurry. In some embodiments, the oxidizer is one or more of persulfates, periodic acid, peracetic acid, and the like. In some embodiments, compositions have 2% or less by weight of oxidizer (which may include or be exclusively hydrogen peroxide), thereby limiting the absolute amount of hydrogen generation possible from a slurry. This limited oxidizer slurry is an important embodiment, limiting hydrogen gas generation, as well as minimizing purchasing costs and disposal costs, and with the method of the current invention commercially acceptable substrate removal rates can be maintained. In some embodiments, a chelator can be added at point of use or even after point of use, in very small amounts such as less that 0.1% by weight, to de-activate dissolved metals. In some embodiments, a component that is readily oxidized is added to the fluid or to the slurry after polishing to consume excess oxidizer, where the added compound is environmentally benign.

12. Slurry CMP Method With Silicates and/or Aluminates Without Abrasive.: The invention includes a method of polishing by using polishing slurries comprising transition metal-containing silicates or aluminates, which may be at least partially formed into discrete particulates. The material may be in the form of a suspended sol-gel, where in a slurry with at least one oxidizer, the activator metal-containing sol-gel reacts with the oxidizer to create free radicals in an amount useful for accelerating a chemical mechanical polishing process. The preferred transition metal is iron, and the preferred sol-gel comprises silicon.

13. Slurry CMP Method With Shaped Abrasive Material: The invention includes a method of polishing by using polishing slurries comprising transition metal-coated particles in a slurry with at least one oxidizer that reacts with the transition metal-coated particles to create free radicals in an amount useful for accelerating a chemical mechanical polishing process, wherein slurries of this embodiment comprise cocoon-shaped silica particles are colloidal silica with a minor axis of 10 to 200 nm and ratio of major/minor axis of 1.4 to about 2.2 as described in U.S. Pat. No. 6,544,307. The preferred transition metal is iron, the preferred particle comprises silica. The coated particles of this embodiment can be substantially spherical (i.e., ratio of major to minor axis is less than 1.2, preferably less than 1.1), or the coated particles can be the cocoon-shaped particles, or both substantially spherical and cocoon-shaped particles can have one or more transition metals of this invention associated with the outer surface thereof.

14. Slurry CMP Method With Aggregated or Chain-like Abrasive Material: The invention includes a method of polishing by using polishing slurries comprising transition metal-coated particles in a slurry with at least one oxidizer that reacts with the transition metal-coated particles to create free radicals in an amount useful for accelerating a chemical mechanical polishing process, wherein slurries of this embodiment have particles that are loosely or tightly aggregated into groups, or are loosely or tightly connected in chain-like structures. The individual particles are very small, for example between about 0.003 and 0.05 microns in diameter. In one embodiment the particles form aggregates of a plurality, i.e., more than about 10, individual particles in a roughly spherical shape. In another embodiment the particles form chain-like structures, which can be simply paired particles, but preferably the chains comprise three or more particles, i.e., more than 4 particles in length and one particle in width. The preferred transition metal is iron, the preferred particle comprises silica. The structure can comprise individual particles having transition metal associated on the surface thereof and particles that do not have transition metal associated on the surface thereof.

15. Slurry CMP Method With A BiModal Distribution Of Abrasive Sizes: The invention includes a method of polishing by using polishing slurries comprising transition metal-coated particles in a slurry with at least one oxidizer that reacts with the transition metal-coated particles to create free radicals in an amount useful for accelerating a chemical mechanical polishing process, wherein slurries of this embodiment have particles with sizes resulting in at least a bimodal distribution of particle size distribution, that is, wherein the sizes and distribution of particles present in the slurry are sufficient to give a bimodal (or trimodal) distribution of particle sizes where a modal distribution comprises at least 1%, for example at least 10%, by count of the total particles. The diameter ratio of the smaller to the larger particles is between about 1:10 and about 10:1. For example, one preferred embodiment uses coated-silica having a diameter of about 0.08 microns, and uncoated silica of size about 0.07 microns in diameter, where the particle size is tightly controlled so that about 90% (by count) of the particles fall within 5% of the stated size (i.e., 90% by number of the coated silica has a diameter between 76 and 84 microns, and 90% by number of the un-coated silica has a diameter between 66 and 74 microns). In another embodiment, the coated particles have a diameter of about 0.06 to 0.09 microns in diameter, and the uncoated abrasive has a diameter of about 0.10 to 0.28, for example between about 0.11 to 0.16, microns in diameter. Of course, the particles that are transition metal (of this invention) coated can be the larger or the smaller of the particles, or both. The particles may be of one type, i.e., silica, or the slurry used for the CMP method may comprise a plurality of types of abrasives, for example comprising at least two of a colloidal silica, a fumed silica, ceria, alpha-alumina, a spinel, gamma alumina, a beta alumina, titania, germania, and/or silicon, aluminum, cerium, titanium, germanium carbide and/or nitrides, or a mixture thereof.

16. Slurry CMP Method With A Plurality Of Types Of Abrasive Material: The invention includes a method of polishing by using polishing slurries comprising transition metal-coated (ion or salt) particles in a slurry with at least one oxidizer that reacts with the transition metal-coated particles to create free radicals in an amount useful for accelerating a chemical mechanical polishing process, wherein slurries of this embodiment have a plurality of types of abrasive material. This does not mean simply that some material is coated and some material is not coated—those embodiments are discussed elsewhere. This does not mean simply a bi-modal distribution of abrasive—those embodiments are discussed elsewhere. Here, there are a plurality of types of abrasives in the slurry used for the CMP method, for example comprising at least two of a colloidal silica, a fumed silica, ceria, alpha-alumina, a spinel, gamma alumina, a beta alumina, titania, germania, and/or silicon, aluminum, cerium, titanium, germanium carbide and/or nitrides, or a mixture thereof. In one preferred embodiment, the slurry comprises fumed silica and colloidal silica, where the colloidal silica is coated with transition metal, and the fumed silica optionally has no transition metal coated thereon. In another embodiment, colloidal silica that is coated with transition metal is admixed in a slurry with ceria. The silica is not the only particle that can be coated with the transition metal(s) of this invention. In another embodiment, the slurry comprises alumina, for example alpha-alumina, having transition metal coated thereon, and a beta or gamma alumina, or ceria, or silica (or mixture thereof). In another embodiment, the slurry comprises a spinel, e.g., an iron spinel, having transition metal coated thereon, and a different abrasive. The different types of abrasives typically, but need not, have different sizes, giving a bimodal (or trimodal) distribution of particle sizes in the slurry.

17. Slurry CMP Method With An Alumina Abrasive Material: The invention includes a method of polishing by using polishing slurries comprising transition metal-ion-coated particles in a slurry with at least one oxidizer that reacts with the transition metal-coated particles to create free radicals in an amount useful for accelerating a chemical mechanical polishing process, wherein slurries of this embodiment comprise transition metal coated alumina abrasive material. In one embodiment, the slurry comprises alumina, for example alpha-alumina, having the transition metal(s) of this invention coated thereon. Alumina was surprisingly found to hold transition metals, i.e., iron, tightly. Alumina is useful for different substrates, and for different pHs, as is known in the art. The coated alumina of this invention react with hydrogen peroxide, persulfates, periodic acid, peracetic acid, or the like to produce from the oxidizer free radicals, i.e., hydroxyl free radicals, which accelerate the substrate removal rate.

18. Slurry CMP Method With A Transition Metal Coated Spinel Abrasive Material: The invention includes a method of polishing by using polishing slurries comprising transition metal-coated particles in a slurry with at least one oxidizer that reacts with the transition metal-coated particles to create free radicals in an amount useful for accelerating a chemical mechanical polishing process, wherein slurries of this embodiment have transition metal coated spinel abrasive material. In one embodiment, the slurry comprises an iron spinel material, having the transition metal(s) of this invention coated thereon. In another embodiment, the slurry comprises an magnesium spinel material, having the transition metal(s) of this invention coated thereon. In another embodiment, the slurry comprises an zinc spinel material, having the transition metal(s) of this invention coated thereon. Of course, in another embodiment, the slurry comprises an spinel material comprising at least two of iron, zinc, and magnesium, the spinel material having the transition metal(s) of this invention coated thereon.

19. Slurry CMP Method With An Iron Spinel Abrasive Material: The invention includes a method of polishing by using polishing slurries comprising iron spinel abrasive particles in a slurry with at least one oxidizer that reacts with the iron spinel particles to create free radicals in an amount useful for accelerating a chemical mechanical polishing process. The iron spinel may be treated to increase formation of free radicals to a commercially acceptable amount. Advantageously, the slurry comprises at least one additional abrasive material. The embodiments of this invention beneficially also comprise transition-metal coated abrasive material.

20. Slurry CMP Method With An Iron Oxide And/Or Copper Oxide Abrasive Material: The invention includes a method of polishing by using polishing slurries comprising abrasive particles of iron oxide, copper oxide, or both in a slurry with at least one oxidizer that reacts with the iron oxide and/or copper oxide to create free radicals in an amount useful for accelerating a chemical mechanical polishing process. Highly advantageously the iron oxide and/or copper oxide abrasives are substantially completely surface-modified with a stabilizer, such as a stabilizer comprising B, Al, W, or P, most preferably boric acid-stabilizer. The Fe/Cu oxide may be treated, e.g., by adding absorbed iron ions and/or absorbed copper ions to the surface of the oxide, to increase formation of free radicals to a commercially acceptable or desirable amount. Advantageously, the slurry comprises at least one additional abrasive material. Advantageously, the pH of the slurries of this embodiment are kept at levels between about 3 and about 6, for example between about 4 and about 5. The embodiments of this invention beneficially also comprise transition-metal coated abrasive material. Advantageously the size of the iron oxide particles is small, for example between 20 nm and 80 nm in diameter. Advantageously, the slurry comprises a silica or alumina abrasive of size 50 nm to about 200 nm in (average) diameter.

21. Slurry CMP Method With A Titanium Dioxide Abrasive Material: The invention includes a method of polishing by using polishing slurries comprising or consisting essentially of an oxidizer capable of generating free radicals and titanium dioxide abrasive particles having one or more transition metal ions coated thereon in an amount sufficient to cover between 1% and 100% of the available surface area. Advantageously the titanium dioxide comprises a stabilizer, for example a boric acid stabilizer, on the surface thereof. Beneficially, the titanium dioxide is coated with a transition metal that reacts oxidizer to create free radicals in an amount useful for accelerating a chemical mechanical polishing process. Even a $TiO_2/Ti_2O_3$ abrasive such as is known in the art can be improved with surface modification by stabilizers described herein. In other embodiments, another abrasive type is also present in the slurry, and this other abrasive is coated with a transition metal that reacts oxidizer to create free radicals in an amount useful for accelerating a chemical mechanical polishing process.

22. Slurry CMP Method With Silver-Coated Abrasive Material: The invention includes a method of polishing by using polishing slurries comprising transition metal-coated particles in a slurry with at least one oxidizer that reacts with the transition metal-coated particles to create free radicals in an amount useful for accelerating a chemical mechanical polishing process, wherein the transition metal comprises silver. In preferred embodiments, the oxidizer is a persulfate or peracetic acid, more preferably a persulfate. Silver is more expensive than either copper or iron, and has a more limited effective window, and is expected to have a lower long-term affinity to the surface of the abrasive (as the metal may form atoms of $Ag^0$ on the surface of the abrasives during the reaction with persulfates to form free radicals.

23. Slurry CMP Method With Copper-Coated Abrasive Material: The invention includes a method of polishing by using polishing slurries comprising transition metal-coated particles in a slurry with at least one oxidizer that reacts with the transition metal-coated particles to create free radicals in an amount useful for accelerating a chemical mechanical polishing process, wherein the transition metal comprises copper ions absorbed onto the surface of an abrasive. In preferred embodiments, the abrasive is silica or alumina, and the oxidizer is a peroxide or periodic acid.

24. Slurry CMP Method With Cerium-Coated Abrasive Material: The invention includes a method of polishing by using polishing slurries comprising cerium ion-coated particles in a slurry with at least one oxidizer that reacts with activator-coated particles to create free radicals in an amount useful for accelerating a chemical mechanical polishing process. Cerium ions are not efficient at increasing the production of free radicals, so in more preferred embodiments the particles further comprise absorbed iron ions, absorbed copper ions, or both. The preferred abrasive material comprises silica and/or alumina. The cerium ions are absorbed onto the surface of the abrasive, and are advantageously salts, and not oxides.

25. Slurry CMP Method With Titanium-Coated Abrasive Material: The invention includes a method of polishing by using polishing slurries comprising transition metal-coated particles in a slurry with at least one oxidizer that reacts with the transition metal-coated particles to create free radicals in an amount useful for accelerating a chemical mechanical polishing process, wherein the transition metal comprises titanium. Importantly, the metal is an ion absorbed onto the silica or alumina surface, and is not an oxide. The preferred abrasive material comprises silica and/or alumina.

26. Slurry CMP Method With Plurality Of Transition Metal Ion-Coated Abrasive Material: The invention includes a method of polishing by using polishing slurries comprising transition metal-coated particles in a slurry with at least one oxidizer that reacts with the transition metal-coated particles to create free radicals in an amount useful for accelerating a chemical mechanical polishing process, wherein the transition metal comprises at least two of iron, copper, cerium, titanium, and silver. An individual particle may have a plurality of transition metals coated thereon, or there may be a plurality of particles with some particles having a first metal coated thereon and other particles having a second metal coated thereon, or any combination of these. The preferred abrasive material comprises silica and/or alumina. The preferred transition metal ion combinations are iron and cerium or iron and copper for all oxidizers, and iron and silver if the slurry comprises a persulfate.

27. Slurry CMP Method With Zero-Valent Transition-Metal-Coated Abrasive Material: The invention includes a method of polishing by using polishing slurries comprising transition metal-coated particles in a slurry with at least one oxidizer that reacts with the transition metal-coated particles to create free radicals in an amount useful for accelerating a chemical mechanical polishing process, wherein one or more of the transition metal(s) coating the particle is present (at least partially, and/or at least initially) in the zero valent state, e.g., the abrasive may be formed from iron or copper metal sputtered onto an abrasive.

28. Slurry CMP Method With Sulfate-Stabilized Slurry: We have found that sulfate ions can have a stabilizing influence on for example a coated silica slurry by retarding settling. Without being bound by theory, we believe the sulfate forms a stable double-layer about the bound iron or other transition metal. Sulfate can be present for example in an amount between about 30 and about 500 ppm sulfate, preferably between about 50 and 300 ppm sulfate, for example between about 100 and about 200 ppm sulfate. A sulfate level of 170 ppm can extend the time before particle settling becomes significant from about 2 days to about 5 days. The slurry can contain between about 0.05% and 5% by weight of transition metal coated particles, e.g., silica having iron ions or salt absorbed thereon.

29. CMP Method With Dissolved Transition-Metal Promoter: The invention includes a method of polishing by using polishing slurries comprising a transition metal coated to particles, in a slurry with at least one oxidizer that reacts with the transition metal-coated particles to create free radicals in an amount useful for accelerating a chemical mechanical polishing process, and between about 2 and 50 ppm of dissolved transition metal ions, for example dissolved iron. If promoters, e.g., dissolved iron salts, copper salts, and/or cerium salts, are present in the slurry, then advantageously the composition comprises between 2 and 20 parts by weight of a five- or six-member-enolic ring-structure alpha, beta-dihydroxy compound such as ascorbic acid, erythorbic acid, or a similar number of moles of derivatives and/or mixtures thereof, per part by weight of dissolved promoter metal. Alternatively, or additionally, the composition can comprise at least a molar equivalent of one or more stable alkynes, for example alkyne diols (Surfynol 104E) that complex with dissolved promoter metal. Finally, the composition may comprise between 2 and 20 parts of lactic acid, citric acid, glycolic acid, and/or salicylic acid per part of dissolved promoter metal. We believe ascorbic acid stabilizes a slurry and helps prevent metal ion contamination of the slurry. We believe the stable alkynes strongly bind to the dissolved iron or copper, and may even increase the effectiveness of the dissolved metals on promoting an increase in the polishing rate. We believe lactic acid, citric acid, glycolic acid, and/or salicylic acid (lactic acid being particularly preferred) are good chelators. Of course, these same three components would also be very useful on prior art ferric nitrate/hydrogen peroxide compositions that do not have transition metal coated abrasives therein. The preferred absorbed transition metal is iron, the preferred transition-metal-coated-particle comprises silica. The total amount of transition-metal on coated-particle abrasive is between 0.1 ppm and about 40 ppm, for example between about 0.5 ppm and about 25 ppm. The slurry may or may not contain additional abrasives. The slurries of this embodiment have small particles, between about 0.02 and 0.2 microns in diameter, preferably between 0.04 and 0.08 microns in diameter.

The preferred fluid composition for a periodic acid/soluble ferric nitrate solution, especially for use in polishing tungsten, has 1.5% to 2.4%, for example 1.8% to 2.2% of periodic acid; the pH is 1.5 to 4, for example 2.8 to 3.5, if modest loss of the dielectric TEOS is acceptable, though a pH of about 4 to about 8, preferably about 5.5 to about 7, is preferred if greater selectivity between the tungsten and the dielectric is desired. In the absence of transition metal ion coated abrasive, the ferric nitrate concentration should be between 0.01 and 0.05 weight percent. With transition metal ion coated abrasive, the ferric nitrate concentration can be between 0.001% and 0.01% (if less than 0.001% ferric nitrate the soluble ferric ions contribute too little activity). The preferred abrasive would be between about 2 to 4 weight percent of either alumina or a mixture of fumed and colloidal silica with between 30% and 70% of the silica being colloidal. Even with ascorbic acid, lactic acid, and/or stable alkynes to combine with the soluble ferric ions, this composition will result in greater contamination than using coated silica abrasive alone.

33. A CMP system, either a slurry comprising a liquid phase and suspended abrasive particles, or a combination of a liquid phase and abrasive particles bound to a polishing pad, wherein the abrasive particles are previously surface-modified with one or more inorganic stabilizers selected from borate, tungstate, aluminate, stannate, or titanate, most preferably borate, in an amount greater than 70%, for example between 80% and 99%, alternatively between about 90% to about 98%, of the available surface area of the abrasive particle, the abrasive particles further comprising one or more activator metals added to the stabilizer-modified surface of the abrasive, wherein the combination of stabilizers and activators are advantageously sufficient to cover at least 90% of the available surface area, for example between about 98% and about 120% of the amount sufficient to cover the surface area of the abrasive particles. If the abrasive particles are suspended in a CMP slurry, then advantageously the total amount of activator is advantageously between about 1 ppm and about 100 ppm, preferably between about 2 ppm and about 20 ppm, for example between about 3 ppm and about 10 ppm, based on the weight of the slurry. Advantageously, if the abrasive particles are suspended in a CMP slurry, then the amount of activator-coated abrasive is between about 0.1% to about 10%, for example between about 0.2% to about 4%, and in some embodiments between about 0.3% to about 2%, based on the weight of the slurry. The liquid phase of the CMP slurry comprises the oxidizer that reacts with the activator to form oxygen-containing free radicals, and further advantageously may comprise between 1 ppm and about 1000 ppm, for example between about 50 ppm and 400 ppm, of a chelator, wherein the preferred chelators include lactic acid and the like, dihydroxy enolic compounds and the like, or mixtures thereof. Advantageously the pH of the liquid phase is between 3 and 7. In the presence of dihydroxy enolic compounds, advantageously the pH is between about 6 and about 6.5.

Various combinations of the above embodiments are also part of this invention, as the embodiments were simplified to show the particular advantages of only one or a few aspects of that embodiment. The key to this invention is providing transition metal coating onto particles, where the transition metal coating reacts with a oxidizer in a Fenton-type reaction to provide a super-oxidizer, i.e., a hydroxyl radical, where the hydroxyl radical (or progeny of the hydroxyl radical) thereafter reacts with the substrate, resulting in increased substrate removal rates.

DESCRIPTION OF EMBODIMENTS OF THE INVENTION

The invention involves CMP slurry systems that incorporate a transition metal, preferably iron, associated with a particle and contacting a fluid, wherein the fluid when contacting the transition metal produces free radicals. In a preferred embodiment the transition metal associated with a particle does not require any form of energy exterior to the slurry, such as actininc energy, to be effective. Preferably, the effectiveness of the transition metal associated with a particle is not appreciably affected, i.e., less than about a 20% increase in rate, due to any form of energy exterior to the slurry, such as actininc energy and heating above normal temperatures of for example ambient to 45 C. The transition metal is preferably not in the form of an oxide, but rater as absorbed oxidized ion.

Substrates

The invention is a CMP slurry and a method of chemically-mechanically polishing a substrate. The key requirements of chemically-mechanically polishing a substrate are 1) to obtain a commercially acceptable removal rate of components of the substrate where removal is desired (and different removal rates of other components of the substrate); 2) to obtain a commercially acceptable finish, i.e., smoothness and non-uniformity; and 3) to not damage or otherwise contaminate the substrate such that the substrate is unfit for its desired purpose or is only made fit after extensive additional processing.

The substrate can be a metal, a crystal, a semiconductor, an insulator, a ceramic, a thin film transistor-liquid crystal display, a glass substrate, a fused silicon substrate, thin films, memory storage devices including memory disks, optical instruments including lens, nanotechnology machines, finely machined components including microscopic components, close tolerance machine parts, or a read/write head, for example. The present invention is particularly suitable for polishing very high density semiconductor substrate and memory devices. The composition or slurry of this invention may be used to polish at least one feature or layer on a substrate such as a semiconductor substrate or any other substrate associated with integrated circuits. The present invention is particularly suitable for polishing all structures found on integrated circuit chips, including for example shallow trench isolation structures, LAN structures, silicon on insulator, deep gate structures, and the like.

The composition and associated methods of this invention are effective for CMP of a wide variety of substrates, including substrates having dielectric portions that comprise materials having low dielectric constants (low-k materials, such as materials having a dielectric constant less than 3.3). The polishing slurries herein are particularly suitable for use with tungsten in silica, PETEOS, or low-k substrates. Suitable low-k films in substrates include, but are not limited to, organic polymers, carbon-doped oxides, fluorinated silicon glass (FSG), inorganic porous oxide-like materials, and hybrid organic inorganic materials. Representative low-k materials and deposition methods include: MesoElk® available from Air Products and Chemicals, a spin-on hybrid organic-inorganic material; Black Diamond™ available from Applied Materials, a chemical vapor deposition (CVD) Carbon-doped oxide; SiLK™, Porous SiLK™ available from Dow Chemical, a spin-on organic polymer; NANOGLASS® E available from Honeywell Electronic Materials, a spin-on oxide-like inorganic; and CORAL® available from Novellus Systems, a Plasma enhanced chemical vapor deposition (PECVD) deposited carbon-doped oxide.

Similarly, the composition and associated methods of this invention are effective for CMP of substrates comprised of various metals, including, but not limited to, tungsten and copper. The composition and associated methods of this invention are particularly useful and preferred for tungsten CMP and afford very high selectivities for removal of tungsten in relation to dielectric. In certain embodiments, the selectivity for removal of tungsten relative to removal of the dielectric from the substrate is at least 5:1, more preferably at least 10:1, and even more preferably at least 15:1.

The substrate can comprise, consist essentially of, or consist of any suitable metal. The metals for which the invention is useful, in the semiconductor industry, include but are not limited to those containing at least one of tungsten, titanium, aluminum, copper, and tantalum. The very strong hydroxyl and superoxide radicals formed during the CMP processes of this invention are strong enough to promote polishing of most noble metals, including silver, gold, platinum, iridium, ruthenium, germanium, rhodium, palladium, and osmium. The metal can be pure, be an alloy, or be a compound. By way of example, the composition of the present invention may be used in the CMP of a substrate having one or more layers of aluminum, copper, copper-aluminum alloy, tantalum, titanium, tungsten, or tantalum-, titanium-, or tungsten-containing alloys, such as tantalum nitride, titanium nitride, titanium tungsten, or other combinations thereof.

The substrate can comprise, consist essentially of, or consist of any suitable metal oxide. Typical insulative structures include dielectrics such as silica, alumina, organic silicas, polysilicon, gallium arsenide, and others known in the art. The substrate can include, alumino-borosilicate, TEOS, borosilicate glass, phosphosilicate glass (PSG), borophosphosilicate glass (BPSG), SOS (silicon on sapphire), silicon-germanium alloys, and silicon-germanium-carbon alloys. The compositions described herein are suitable for use on substrates having strained silicon, polysilicon, single-crystal silicon, poly-crystalline silicon, amorphous silicon, silicon-on-insulator, and the like.

Slurry

A principal embodiment of the invention is a composition for chemical-mechanical polishing a semiconductor or memory device substrate, comprising: a fluid comprising at least one per-type oxidizer that produces free radicals, preferably an Oxygen/Hydroxyl Free Radical, when contacted with at least one activator, wherein the activator is one or more transition metals that promote production of the free radicals, and wherein the activator is attached to a particle (a "coated particle" or "transition metal coated particle"), preferably an abrasive particle, such coating being exposed to the oxidizer that in turn reacts with the transition metal-coated particles to create oxygen/hydroxyl free radicals in an amount useful for accelerating a chemical mechanical polishing process, and wherein the composition when used in a chemical mechanical polishing process will remove desired metal but will not create defects or nonuniformity such that the substrate can not undergo further fabrication to become a finished operable semiconductor or memory device.

The invention eliminates the need for adding soluble metal catalysts to catalyze oxidation by hydrogen peroxide (but does not necessarily exclude the use of soluble metal catalysts in certain embodiments). The invention improves the CMP process as well as minimizes contamination, as there is no need to add soluble salt catalysts in the CMP formulation. Other advantages provided by at least some embodiments of the invention include: (a) relatively low CMP slurry costs; (b) no staining or yellowing of the polishing pad; (c) low metal ions (or other counter-ions of metal salt catalysts) as impurities in the CMP slurry; (d) employing commonly available hydrogen peroxide or other popular oxidizers; and (e) low static etch rate of metal substrates.

The first embodiment described in the summary of the invention is a general depiction of a preferred slurry that is useful in carrying out one or more embodiments of the invention. In less preferred variants of the invention, the particles have little or no stabilizer absorbed thereon. Each subsequent method, material, and amount described herein are applicable to each of the other embodiments to the extent the other embodiments do not exclude that particular method, material, and/or amount.

The invention includes a method of polishing by using a composition comprising movably contacting a substrate to be polished with the fluid-that-produces-the-free-radicals and with the coated particles, preferably by having these components be urged against the substrate by a polishing pad that is movably contacting the substrate, wherein the fluid and coated particles are disposed between the substrate and the polishing pad.

The term "Oxygen/Hydroxyl Free Radical" means a free radical that contains only oxygen and optionally hydrogen, and include the hydroxyl radical, Atomic oxygen (singlet) radical, superoxide radical, and the like. The useful free radicals of this invention have an electrochemical potential of between about 1.6 V and 3 V, and preferred free radicals have a potential greater than about 2.4 V. As used herein, the term "free radical" is used interchangably with "Oxygen/Hydroxyl Free Radical." There are a plurality of radicals formed of organic constituents, which may or may not contain oxygen. These radicals formed of organic constituents do not have sufficient electrochemical potential to oxidize the substrates of interest. As used herein, the term "free radical" and interchangably "Oxygen/Hydroxyl Free Radical" specifically does not encompass free radicals containing organic components.

The oxygen/hydroxyl free radical is advantageously formed by action of the transition metal coated onto a particle and the oxidizer. The oxygen/hydroxyl free radical must be of sufficient electrochemical potential to oxidize the substrate. The oxygen/hydroxyl free radical must be formed in an amount sufficient to substantially increase substrate removal rate, for example by at least 10%, preferably at least 30%, and typically at least 50%, compared to the same polishing system but without the transition metal coated to the particle (but having an equivalent amount of abrasives).

Transition Metal Activator

In every embodiment there is a selected transition metal activator associated with a particle. As used herein, the phrase "transition metal" only encompasses those metals which when attached to or absorbed on a solid particle react with per-type oxidizers to form oxygen/hydroxyl free radicals. The transition metal must be one of the select few metals that will initiate a Fenton-type free radical generation-type reaction with the selected fluid, especially at 25° to 45° C. Note that the Fenton's reaction is not a catalytic process where an oxidizer is made to react faster with a substrate. Rather, the Fentons reaction generates a different oxidizer, preferably a oxygen/hydroxyl free radical, that has a greater oxidation potential than the oxidizers in solution. Without being bound by theory or process, we believed that the generated free radicals may react with the slurry as follows (where free radicals are underlined):

$$Fe^{+2}+H_2O_2 \rightarrow Fe^{+3}+OH^-+\underline{^oOH}$$

$$\underline{^oOH}+Fe^{+2} \rightarrow OH^-+Fe^{+3}$$

$$\underline{^oOH}+H_2O_2 \rightarrow H_2O+\underline{^oOOH}$$

$$\underline{^oOOH}+H_2O_2 \rightarrow O_2+H_2O+\underline{^oOH}$$

Note that a hydroxyl radical can be quenched by ferrous ions, which is yet another reason to minimize the concentration soluble iron salts. A few reactions of Fenton's reagents coated on abrasives with periodic acid are as follows:

$$H_4IO_6^-+Fe^{+3} \rightarrow H_3IO_5^-+\underline{^oOH}+Fe^{+2}$$

$$H_3IO_5^-+Fe^{+2} \rightarrow IO_3^-+H_2O+\underline{^oOH}+Fe^{+3}$$

Advantageously, hydroxyl radicals can be obtained both by the conversion of $Fe^{+2}$ to $Fe^{+3}$ and by the conversion of $Fe^{+3}$ to $Fe^{+2}$.

The transition metal (unless otherwise stated, the term "transition metal" is limited to activators) is generally an ion, and are beneficially multivalent ions. Unless otherwise specified, the transition metal is present in an oxidized state, for example ferric or ferrous iron. Unless otherwise specified, the oxidized transition metal is not present as an oxide. Oxides have less activity than absorbed activators and often require actinic energy to be effective. Rather, the metal is present absorbed onto the particle as a salt, likely with counterions such as sulfate near the surface.

We have found that transition metal activator(s) of this invention that are associated with solids, for example an abrasive, a particle, or a pad, can initiate the creation of free radicals without the undesirable side effects such transition metals may have if they are in solution in the fluid contacting the substrate. In particular, we have surprisingly found that transition metal activator(s) of this invention associated with the surface of a solid are effective at promoting the formation of free radicals, but these transition metal-containing activators are not "in solution" and therefore do not contaminate the substrate as much as does soluble metal ion oxidizers. Further, we have surprisingly found that the transition metal(s) of this invention so associated with the surface of the solid do not cause significant degradation of the hydrogen peroxide or of the oxide when admixed for a period of at least several hours, often a day or more, which is a typical storage time in semiconductor fabrication plants. A transition metal activator that is "associated with", "absorbed" on, or "coated" on (these phrases are used interchangably here) an abrasive means the metal is not in solution in the slurry. Unless otherwise stated, a transition metal associated with a surface is a metal ion, wherein the metal is selected from the metals presented herein, wherein the metal is in the form of an ion, and not in the form of an oxide, nitride, or carbide, or a metal. Metallic (zero-valent) coatings of these metals can be used in limited circumstances, though they are of limited utility and effectiveness, and are often not specific enough for the desired Fentons reaction promotion. The only metal oxide we found to be effective was iron oxide—though we believe copper oxide may also have some limited activity.

One method of expressing the concentration is that a preferred transition metal-coated particle has between 2 and 100% of the outer surface, i.e., that surface accessible to for example mercury at 5 psi absolute pressure, covered with a monolayer or bilayer of the transition metal(s). It is recognized that many abrasives and particles have substantial porosity, and substantial accompanying surface area. However, surface area deep within a pore is of limited utility if free radicals generated therein do not migrate out within a time span similar to the expected life of the free radical-propagation chain. The most important surface area is the outer surface area, that is, that surface readily visible to a microscope or an SEM. The invention includes a method of polishing by using polishing slurries comprising transition metal-coated particles in a slurry with at least one oxidizer that reacts with the transition metal-coated particles to create free radicals in an amount useful for accelerating a chemical mechanical polishing process, where the transition metal(s) present are present on the particles in an amount less than is needed to form a monolayer the surface of the coated particles. In a preferred embodiment the transition metal(s) present are present on the particles in an amount needed to form a monolayer on between 10% and 90%, i.e., about 25% to about 75%, of the surface of the coated particles. In another embodiment the transition metal(s) present are present on the particles in an amount needed to form a monolayer on between 0.1 and 9%, i.e., about 1 and about 5%, of the surface of the coated particles. For example, slurry having 1% by weight of substantially spherical silica particles having a monolayer iron coating on 50% of the outer surface would have about 20 ppm of bound iron if particles are 0.14 microns in diameter, about 35 ppm of bound iron if particles are 0.08 microns in diameter, and about 100 ppm of bound iron if particles are 0.025 microns in diameter.

Metal ions in solution, which we call "promoters" to distinguish them from transition metals coated on an abrasive, will cause degradation of a slurry, and will absorb onto and contaminate a substrate. One added benefit of having activator on a surface of an abrasive is if chemical reactions occur to cause the activator to be reduced to a metallic state, the activator will still not move from the surface of the abrasive, and therefore will not plate out on the substrate. Additionally, activator associated with an abrasive has a much lower tendency to spontaneously decompose certain oxidants, for example hydrogen peroxide, even at higher pH values where hydrogen decomposition by metal ions in solution is known. While not being bound by theory, generally, an activator associated with an abrasive is believed to only incidentally contact the substrate.

Fenton's has a very limited number of metal activators. Generally, ions of Cu, Fe, Mn, Ti, W and V are both physically useful and not environmentally prohibitive. Silver is a useful activator for many systems, and can be coated onto for example silica, ceria, alumina, and other known abrasives. Silver is less preferred, because silver is believed to be less tenacious to a surface—as silver changes oxidation states, it may under some conditions become un-associated from the solid material. Additionally, the cost of silver is prohibitive unless recovery/recycle systems are in place. Finally, silver ions can complicate disposal of used slurry. Selected other metals promote the generation of free radicals from the oxidizer capable of forming the free radicals, but generally because they are inefficient and also have one or more of high cost, toxicity, and/or stringent environmental disposal regulations, that the use of these other ions is not commercially advantageous.

The preferred transition metal species is iron. The iron can be associated with the abrasive in the form of a salt, for example a ferric salt, a ferrous salt, or both. Iron associated with an abrasive is particularly useful and is the most preferred activator. Iron associated with silica is the preferred system. The silica, with its numerous OH groups, can multiply bind with the iron, holding the iron firmly associated with the silica by a number of covalent and/or ionic type bonds. Yet, the plurality of bonds of iron onto the silica, be it absorbed, adsorbed, or coated, allows easy transformation between oxidation states without the iron having a tendency to dis-associate from the silica surface. Surprisingly, iron associated with silica can be used at high pH values, for example from pH 5 to pH 7 and in some cases up to pH 8. It is known that soluble iron at these pH values forms undesirable precipitates which contaminate substrate and which catalyze degradation of hydrogen peroxide into oxygen and water, resulting in unsafe explosive accumulations of gases. An additional advantage of iron is that it is environmentally benign and does not pose significant disposal problems. Absorbed iron ions associated with alumina, ceria, and/or spinel are also useful abrasive/activators. Still further provided is a composition comprising an abrasive having a surface on which at least one stabilizer and iron ions are bonded, wherein the abrasive is a member selected from the group consisting of alumina, titania, zirconia, germania, silica, ceria and mixtures thereof, the at least one stabilizer comprises at least one member selected from the group consisting of B, W and Al.

Iron ions associated with a surface of a metal oxide abrasive, e.g., alumina, ceria, titania, or most preferably silica, are useful embodiments. Many advantages of this system are discussed in co-owned pending applications. A more preferred embodiment uses a surface-modified abrasive modified with at least one stabilizer and at least one activator metal differing from the at least one stabilizer. Generally, inorganic stabilizers are preferred over organic (carbon-containing) stabilizers. Iron associated with stabilized silica, e.g., silica treated with a boron-containing stabilizer which is absorbed or attached onto the surface of the silica, is very useful. For silica, iron ions absorbed onto a borate-stabilized silica is the preferred system.

In preferred embodiments the quantity of activator iron, that is associated with the surface of the abrasive, is about 1 to about 200 ppm. These embodiments presume the transition metal is primarily the most effective iron species. Higher concentrations, for example two to ten times higher, may be needed for copper and/or silver. Even with the efficient iron species, larger ppm numbers can be used, for example up to 2000 ppm, but the higher concentrations result in deterioration of a slurry comprising certain oxidizers if stored over time, and also greater levels of contamination of the substrate by activator ions. Any value below 500 ppm is preferred, though below 200 ppm is more preferred, and below 100 ppm is most preferred. This ppm value is parts by weight of the slurry, wherein the transition metal concentration is the value obtained if the solids containing the transition metal are separated out, leached of all surface-coated metal by for example immersing the particles in excess heated aqueous ascorbic acid for a time necessary to remove substantially all the bound transition metal from the particle, and then analyzing the metals content of the acid. Therefore, a low level of surface-bound iron is preferred, providing the iron is present in an amount necessary to create the desired amount of hydroxyl free radicals. Surprisingly, however, even very low levels, for example between about 0.3 ppm and about 8 ppm, alternately between about 0.5 ppm and about 4 ppm, of particle-bound iron based on the weight of the slurry, provides measurable and economically significant increased metal removal rate that is believed due to the formation of free radicals. The total amount of transition metal of the current invention coated on abrasive particles is between 0.1 ppm and about 40 ppm, for example between about 0.5 ppm and about 25 ppm, for example between 1 ppm and 15 ppm. The amounts of iron in this embodiment can alternately range from about 0.5 pp to 50 ppm, preferably from about 1 ppm to about 30 ppm, for example between about 2 ppm and about 10 ppm, or alternately from about 10 ppm to about 25 ppm. Similar amounts can be useful for copper coated on an abrasive, though silver may require somewhat higher concentrations.

Copper is a useful Fenton's agent, and therefore copper ions associated with solids makes an excellent activator. As copper can shift from a cuprous and cupric oxidation states. The copper can be associated with the abrasive in the form of a salt, for example a cupric salt, a cuprous salt, or both. In alternate embodiments of the invention, at least a portion of the copper can be a copper oxide.

Absorbed titanium ions may also be useful in promoting the generation of free radicals from the oxidizer. Absorbed tungsten ions may also be useful in promoting the generation of free radicals from the oxidizer.

Absorbed cerium ions also may be useful. Cerium may promote the generation of hydroxyl radicals from hydrogen peroxide, but if so it is not believed to be efficient. $CeO_2$ does not sufficiently promote a Fenton's reaction. Cerium is nevertheless a preferred ion, especially in an absorbed state which will prevent the cerium from forming cerium oxide. Cerium salts, be they absorbed, adsorbed, or coated onto a solid, are useful. Like iron, these ions can be strongly held by the active sites on the abrasive and/or particle, and once absorbed, adsorbed or coated, do not tend to become unassociated with the particle. Absorbed titanium ions may promote the Fenton-like reaction to create free radicals, though titanium oxides are not included herein as an effective activator. If absorbed cerium and/or titanium ions are used, they are beneficially included with a preferred activator metal such as iron activator to achieve the desired substrate removal rates.

The invention includes a method of polishing by using a slurry comprising a fluid portion comprising: water; a per-type oxidizer capable of forming free radicals such as hydroxyl radicals in the slurry; and particles comprising an activator metal, e.g., iron, coated thereon, such activator being exposed to the oxidizer that in turn reacts with the activator-coated particles to create free radicals in an amount useful for accelerating a chemical mechanical polishing process. Simply admixing commercially available abrasive with soluble activator metal ions will not result in activator-coated abrasive. One method of forcing the activator ions to absorb on the abrasive particle is using an ion exchange method. An activated ion exchange material, preferably an acid-state ion exchange material, is added to a slurry of the abrasive. Advantageously the abrasive is in deionized water, but with sufficient ions (often potassium ions) to provide a stable slurry. The pH of the water is maintained such that the activator salt would be soluble therein, and a soluble salt of the activator ion. While an acetate salt is preferred, any soluble salt including a nitrate salt can be added. Advantageously the composition is heated, for example to >40° C., and the slurry is agitated to increase the kinetics of activator absorption on the surface of the particle. The preferred the preferred transition metal is iron, the preferred abrasive is colloidal silica, and preferred oxidizer is hydrogen peroxide or periodic acid or mixture thereof. A coated silica abrasive, for example, can be colloidal silica, fumed silica, silica fumed, a silica admixed with one or more adjuvants into a multicomponent particle such that the level of silica in the particle surface, excluding absorbed iron and other metals, is at least 20 percent, preferably at least 50%, or mixtures thereof. We have found, however, that colloidal silica is superior at absorbing the iron onto its surface and holding the iron onto the surface during CMP processes.

An alternate method by which the activator metal can be coated onto the particle is by growing the particle, i.e. by precipitation, in the presence of the activator metal ions. A preferred method of manufacturing colloidal silica particles having the transition metal, e.g., iron, attached thereon is to grow silica particles in the presence of iron ions. This method can include dissolving silica, and then reprecipitating the silica. An advantage is the transition metal can be incorporated deeper into the silica structure, that is, for example, areas of the particle exposed to the iron by dissolution under conditions where iron can absorb onto the particle. Only the transition metal on the outer surface is useful—transition metal coating must contact the oxidizer to be effective.

Stabilizer Surface-Modified Abrasive

The preferred basic slurry comprises stabilized abrasive. As used herein, the term "stabilizer" means an agent effective to help maintain the abrasive as a sol in an aqueous medium. Suitable stabilizers include metals and borderline metals, such as, e.g., boron, aluminum, tungsten, and/or titanium, with boron being most preferred. Phosphorus is another useful stabilizer. Various carbon-containing silanes and silanols can be used as a stabilizer. Various organic chelating compounds can be used both as a stabilizer and as a binding site for activator ions, if bound to the surface of an abrasive particle. For example, polyvinylpyridine polymers are useful for stabilizing the abrasives from coagulating and also for immobilizing iron and copper as PVPY complexes on silica surface, and the "coated" activator atoms had excellent activity.

Generally, inorganic stabilizers are preferred over organic (carbon-containing) stabilizers. One aspect of the invention is a composition comprising an abrasive having a surface on which at least one inorganic stabilizer and at least one activator are bonded, wherein the abrasive is advantageously a member selected from the group consisting of alumina, titania, zirconia, germania, silica, ceria and mixtures thereof, the at least one stabilizer comprises at least one member selected from the group consisting of P, B, W, Al or mixture thereof, and the at least one activator comprises at least one member selected from the group consisting of Cu, Fe, Mn, Ti, W, V, and mixture thereof, provided that the at least one stabilizer and the at least one catalyst are not simultaneously W. A plurality of activator metals, preferably metal ions, can be absorbed or coated on an abrasive, or a plurality of abrasives in a slurry can have different activator metals absorbed thereon, or a plurality of abrasives can have different amounts of activator absorbed thereon. Similarly, a plurality of stabilizers can be absorbed or coated on an abrasive, or a plurality of abrasives in a slurry can have different stabilizers absorbed thereon, or a plurality of abrasives can have different amounts of stabilizer absorbed thereon.

Advantageously all the abrasive in a slurry, or alternatively all the exposed abrasive on a polishing pad, or both, comprise stabilizer. Some embodiments of the invention comprise some stabilized abrasive and some abrasive that comprises less stabilizer, or even no stabilizer. The surface coverage of the surface modified abrasive can be characterized using zeta potential measurement. It is possible to deduce a point of 100% surface area coverage of an abrasive particle by a stabilizer, by suspending the abrasive in a concentrated solution of excess stabilizer under conditions where stabilizer is absorbed onto the particle, and monitoring the zeta potential. Once the zeta potential is stable and unchanging, the abrasive particles are assumed to have 100% surface area coverage. For example, the amount of surface coverage of boric acid on the silica surface can be measured using a Colloidal Dynamics instrument, manufactured by Colloidal Dynamics Corporation, 11-Knight Street, Building E8, Warwick, R.I., 02886. The Colloidal Dynamics instrument measures the zeta potential (surface charge) of the surface modified silica particles. During the preparation of boric acid modified silica, boric acid is added to the deionized silica particles, which changes the zeta potential of the silica particle surface. After reaching the full surface coverage, there is no change in the zeta potential of the surface modified silica. From this titration curve of zeta potential as a function of grams of boric acid to a given amount of silica, it is possible to measure the percent surface coverage of boric acid on the silica surface. After completing the reaction with boric acid, the surface coverage achieved by reacting the boron-modified sol with the second metal salt can also be determined from the zeta potential.

Even with 100% surface coverage, it appears possible to add activator ions onto the surface of the particle, especially in the low concentrations (less than 100 ppm total activator absorbed on 0.3% to 4% activator-coated abrasive in a slurry) which are preferred variants of the invention. Advantageously the abrasive particles have sufficient stabilizer thereon to provide at least 1% surface coverage, for example at least 10% surface coverage, more preferably at least 40% surface, and for best stability of the slurry at least 80% surface coverage. In an alternate embodiment, it is preferred that at least 10%, more preferably 40% to 99%, even more preferably 80% to more than 99% of available surface sites on the abrasive be occupied by the stabilizer and the catalyst. The percentage of surface sites covered on an abrasive in a composition of this invention can range up to 100%.

While most of the useful absorbed or bound stabilizer and activator are on the exterior surface of an abrasive particle, it can be useful to have more of the interior surface area, present as a result of porosity in the abrasive grain, to be coated with stabilizer. It may be technically and commercially useful to use an abrasive, such as an alumina abrasive, of sufficient porosity such that the total of the activator and the non-aluminum-containing stabilizer equal more than one percent by weight of the weight of alumina. The molar ratio of activator to stabilizer can vary depending upon the substrate, the nature and quantity of any oxidizing agent being used, and the desired substrate removal rate. For example, the molar ratio of activator to stabilizer can range from 1:1 to 1:1000, more typically from 1:1 to 1:100, for example from 1:10 to 1:100.

Colloidal abrasive particles that are smaller and which consequently have less surface area generally require higher relative amounts of stabilizer than do larger particles. As a non-limiting illustrative example for boric acid surface-modified colloidal silica, without any activator ions attached or absorbed thereon, the various sizes of colloidal particles required the approximate levels of boric acid modification as shown in Table 1 in order to achieve good stability towards gel formation in acidic media, such as metal CMP polishing compositions.

TABLE 1

| Particle Diameter (Nanometers, nm) | Boric Acid (moles of boric acid)/(moles of silica) | % Surface Modification* |
| --- | --- | --- |
| 12 | 0.08 | 92 |
| 23 | 0.06 | 95 |
| 50 | 0.043 | 98 |
| 100 | 0.02 | 99 |

*Based on 100% surface modification with excess stabilizer.

Exemplary methods of obtaining stabilizer-modified abrasive are now described. Boron surface-modified colloidal silica having an average particle diameter of 50 to 60 nanometers, as measured by Capillary Hydro-Dynamic Flow using a Matec Applied Sciences model number CHDF 2000 instrument (a preferred method of measuring particle size is the average particle size is >20 nanometers), was prepared using the following procedure. An acid-state ion exchange resin is activated by for example being washed with 20% sulfuric acid solution and rinsed with deionized water. The acid-state resin is then added to an aqueous slurry of silica, for example alkali-stabilized silica, until the pH had dropped to pH <3, for example a pH of ~2. The slurry is then advantageously allowed to react (preferably with agitation), and then the resin is (and optionally the liquid) are advantageously removed. The silica is then contacted with aqueous boric acid, e.g., 0.2% to saturated, but preferable 1% to 5%, for a sufficient amount of time and preferably with agitation to obtain the desired level of surface modification. The modification process can be shortened to five hours or less (often 10 minutes or less) by heating the slurry to a temperature greater than 40° C., for example between 55° C. to 60° C. If there is excess boric acid in the water, it may be advantageous to remove the boric-acid-containing water and rinse the silica with deionized water. The product is boron-surface-modified colloidal silica.

Potassium aluminate surface-modified colloidal silica having an average particle diameter of 50 to 60 nanometers was prepared using the following procedure. As described above, an activated acid-state ion exchange resin is prepared, and added to silica, for example potassium-stabilized silica until the pH had dropped to pH of 2.5. The acid-state resin is then added to an aqueous slurry of silica, for example alkali-stabilized silica, until the pH had dropped to pH <3. The slurry is then advantageously allowed to react (preferably with agitation), and then the resin is (and optionally the liquid) are advantageously removed. The silica is then contacted with aqueous potassium aluminate, e.g., 0.2% to saturated, but preferable 1% to 3%. To promote absorption, potassium hydroxide (at a concentration of ~1%) can be then added, and the slurry allowed to react (preferably with agitation) for a sufficient amount of time to obtain the desired level of surface modification. The modification process can be shortened to five hours or less (often 10 minutes or less) by heating the slurry to a temperature greater than 40° C., for example between 55° C. to 60° C. If there is excess boric acid in the water, it may be advantageous to remove the boric-acid-containing water and rinse the silica with deionized water. The product is aluminum-surface-modified colloidal silica.

The activator can be added to the abrasive particle before, during, or after modifying the abrasive with stabilizer. This is not to say that the end result will be equal. Recent data has shown that, at least at activator levels in the slurry below about 10 ppm, that iron added to stabilized silica is significantly more effective than iron added to unstabilized silica, so that to obtain equal polishing rates between about 20% and about 50% or more iron is needed in slurries where the iron was coated onto un-stabilized silica. We are uncertain whether there is synergy between the activator iron and the stabilized silica, or whether iron bound to a boron stabilizer is more active than and/or more exposed than iron bound to silica. To add activator to stabilizer-modified abrasive, it is only necessary to contact the surface-modified abrasive with an aqueous solution of the activator for a period of time, and advantageously at elevated temperature (e.g., greater than 40° C.). To add activator at the same time the stabilizer is being added, the following process can be followed. As described above, an activated acid-state ion exchange resin in water is prepared (pH <3), admixed with silica, and soluble activator-metal salts are added to the composition in a concentration between for example 0.01% to 0.5%. If the desire is to place the activator on the abrasive first, this composition can be allowed to react for a sufficient amount of time to add the activator ions to the abrasive. An aqueous solution of sodium tungstate is added under agitation and the pH was adjusted to pH 5. The mixture is allowed to react (preferably with agitation), and the result is tungsten-surface-modified acitvator-coated abrasive.

There are significant advantages to using stabilized abrasives as the carrier for the activator metal. First, as will be described in the examples, the activator metal is relatively easy to absorb onto stabilized metal oxide, particularly iron onto boric acid-stabilized silica. Importantly, iron or other metal ions attached to stabilized (e.g., boric acid) modified silica are much more tightly bonded compared to metal ions adsorbed to silica. We have surprisingly found that use of stabilizer-coated abrasive, relative to activator absorbed directly onto abrasive without stabilizers, results in less activator ions in solution in the liquid phase. Additionally, especially at low activator concentrations of below 20 ppm total absorbed activator in a slurry, at much greater efficiency in increasing the rate of free radical formation and of substrate removal. Each of these properties offers unique advantages.

It is easy to get activator ions to absorb onto stabilizer-coated abrasive, especially stabilizer-coated silica. Generally, merely adding a soluble salt of the activator to the deionized slurry of surface-modified abrasive, e.g., silica, advantageously at 40° C. or greater, will result in activator ions being absorbed onto the surface-modified abrasive.

Iron or other metal ions attached to stabilized boron-surface-modified silica are much more tightly bonded compared to metal ions adsorbed to silica. We have surprisingly found that use of stabilizer-coated abrasive, relative to activator absorbed directly onto abrasive without stabilizers, results in less activator ions in solution in the liquid phase. Without being bound to theory, we believe the greater affinity of activator to stabilizer-modified abrasive is because the boric acid ligand is a stronger base than the silicon-oxygen ligand (the greater electronegativity difference between boron oxygen vs silicon-oxygen bond), and/or because the Si—O—Si—O— bond length is greater than —O—B—O—B—O— as boron atom has much smaller radius than silicon, so iron is ionically much tightly attached on the boron-oxygen surface as they are in closer proximity. An abrasive that is less amenable to retaining activator ions attached thereto can be made more useful by having the surface thereof be modified by a stabilizer, particularly a boric acid stabilizer. Generally, therefore, all other things being equal, polishing with a stabilizer-surface-modified activator-coated abrasive, and most particularly a boron-surface-modified iron-coated silica, will typically result in fewer activator ions contaminating the surface of the substrate being polished than would polishing with activator-coated abrasive.

CHELATORS AND DYHYDROXY ENOLIC COMPOUNDS Chelators include EDTA, DPTA, multivalent organic acids including citric acid, polyhydroxyaromatics including catechols. Generally, the presence of organic compounds in a slurry comprising the activator and the oxidizer that reacts with activator to produce the free radicals is not discouraged. While systems with soluble iron need organic chelators to stabilize the slurry to give modest shelf life, no such stabilizers are needed in the coated particles/oxidizer slurries of the current invention. Any organic can quench a free radical, though ascorbic acid, thiamine, and other "antioxidants" as they are known in diet parlance, as well as alcohols, glycols, amino-alcohols, alkanolamines, and the like are very effective free radical quenchers to be avoided. Preferably the slurries have less than 0.5% of all of these.

Though chelators are free radical quenchers, we have found that they are necessary under certain conditions. In certain embodiments, some organics, particularly chelators, are useful, but even so the quantity is preferably less than 0.4%, most preferably less than about 0.2% by weight. For example, at pH 5 the solubility of the various tungsten by-products are poor and at high removal rates there is usually a poor finish on the wafer due to re-precipitation. Therefore, polishing at pH 3.5 to 8 generally involves the use of chelators, preferably a dyhydroxy enolic acid and/or one or more of citric, lactic, glycolic, and salicylic acids. More preferred additives include ascorbic acid and/or lactic acid. The use of a dihydroxy enolic compound such as ascorbic acid is highly preferred in slurries of the present invention because it is more effective at keeping the dielectric clean of activator ions. The W removal rate can progressively get higher as the pH increases, up to ~5500+ angstroms per minute with a clean surface in the presence of sufficient chelators. Complexing agents are not needed to control the decomposition rate of the hydrogen peroxide in the storage tanks and distribution lines, as it is when soluble iron is present in a slurry, for pot life of hours extending to for example 12 hours.

The greater affinity of activator to the modified abrasive (as opposed to the affinity of iron on silica) is especially important when a dihydroxy enolic compound, e.g., ascorbic acid, is present in the slurry for extended periods of time. It is well known that hydrogen peroxide is not very stable in the presence of many metal ions without the use of stabilizers. Useful stabilizers include phosphoric acid, organic acids (e.g., acetic, citric, tartaric, orthophthalic, and ethylenediaminetetracetic acid), tin oxides, phosphonate compounds and other ligands that bind to the metal and reduce its reactivity toward hydrogen peroxide decomposition. These additives can be used alone or in combination and significantly decrease the rate at which hydrogen peroxide decomposes, and may also effect metal polishing rates. While hydrogen peroxide decomposition is surprisingly low when contacted by activator-coated abrasive, to obtain a pot life of about a week or more an additive that stabilizes the oxidizer is useful. For example, ascorbic acid is advantageously present in a slurry at concentrations between about 20 ppm and 1000 ppm, more typically between about 100 ppm to 400 ppm. Its possible to use greater amounts, but in slurries of the present invention having less than 100 ppm total activator absorbed onto abrasive, the additional ascorbic acid will have little effect. However, both the abrasive particle and the dielectric material on the substrate are typically silica in one form or another, and we have found that even small quantities of ascorbic acid can strip absorbed activator (iron) ions off silica. While iron-ascorbic acid complexes in solution do increase the polishing rate of a slurry containing a per-type oxidizer, and while complexes of iron ions with ascorbic acid (and/or with other enolic compounds substituted on both sides with hydroxy groups, which we for simplicity call alpha, beta dihhydroxy enolic compounds, of which ascorbic acid is the most common example) may be better than soluble ferric nitrate alone at increasing substrate removal rates, nevertheless more (usually more than twice as much) soluble iron is needed to provide the same level of substrate removal as is provided by a certain amount of activator absorbed onto an abrasive, e.g., silica. Fortunately, ascorbic acid is much less potent in stripping absorbed activator ions from boric acid-stabilized silica.

When using ascorbic acid with non-stabilizer-modified activator-coated abrasive, the ascorbic acid is advantageously added within 30 minutes or so of use, more preferable within a few minutes of use, e.g, point of use mixing, so the ascorbic acid does not strip activator from the abrasive. Point-of-use mixing can also advantageously be done with stabilizer-surface-modified activator-coated abrasive, but it is less important, as ascorbic acid only strips a fraction of iron bound to stabilized silica.

As an aside, dihydroxy enolic compounds, and especially ascorbic acid, are also very useful in preventing/removing metal contamination resulting from conventional polishing slurries, for example, for removing iron from the substrate resulting from use of a conventional peroxide-ferric nitrate slurry, and removing cerium from the substrate resulting from use of a conventional ceria slurry or slurries having soluble cerium ions. Patents that describe CMP slurries having a small amount of soluble rare earth salts, especially cerium salts, which function as soluble metal oxidizers or polishing accelerators for polishing dielectric material include: U.S. Pat. Nos. 6,797,624, 6,399,492, 6,752,844, and 5,759,917. Ascorbic acid, erythorbic acid, or derivatives and/or mixtures thereof is advantageously present in such prior art slurries at concentrations between about 20 ppm and 4000 ppm, more typically between about 100 ppm to 1000 ppm. Ascorbic acid and/or erythorbic acid can also be used in a post-CMP rinse.

Abrasive

The abrasive is typically a metal oxide abrasive preferably selected from the group consisting of spinel, alumina, titania, zirconia, germania, silica, ceria and mixtures thereof. Preferred abrasives include, but are not limited to, alumina, spinel, colloidal silica, colloidal ceria, and colloidal titania, with colloidal silica being most preferred. The metal oxide abrasive may be produced by any technique known to those skilled in the art. Due to stringent purity requirements in the integrated circuit industry, the preferred metal oxide should be of a high purity. High purity means that the total impurity content, from sources such as raw material impurities and trace processing contaminants but not including the activator content and the stabilizer content, is typically less than 0.1% and preferably is less than 0.01% (i.e., 100 ppm).

The spinel or metal oxide abrasive consist of discrete, individual particles, aggregates of particles, or both, having diameters from 5 nanometers to 5 microns, preferably 10 nanometers to 500 nanometers, more preferably from 20 nanometers to 200 nanometers. The percentage values used herein to describe the nature of the abrasive particles in terms of particle size are weight percentages, unless otherwise noted. The particle size of the abrasive particles refers to the particle diameter. A spherical or approximately spherical particle is preferred in this invention. In some embodiments, and expecially with particles smaller than about 50 nanometers in diameter, cocoon- or peanut-shaped particles can be useful. In preferred embodiments, the metal oxide abrasive consists of metal oxide aggregates and particles having a size distribution less than about 1.0 micron, a mean diameter less than about 0.4 micron and a force sufficient to repel and overcome the van der Waals forces between abrasive aggregates and particles themselves. Such metal oxide abrasive has been found to be effective in minimizing or avoiding scratching, pit marks, divots and other surface imperfections during polishing. The particle size distribution in the present invention may alternatively be determined utilizing known techniques such as transmission electron microscopy (TEM). The mean particle diameter refers to the average equivalent spherical diameter when using TEM image analysis, i.e., based on the cross sectional area of the particles. By force is meant that either the surface potential or the hydration force of the metal oxide particles must be sufficient to repel and overcome the van der Waals attractive forces between the particles.

Any particles can be useful for having the transition metals of this invention coated thereon, provided they can hold the transition metal activator to the surface thereof while allowing the transition metal activator to be effective in promoting a Fenton-type reaction, i.e., a reaction forming an oxygen and/or hydroxl free radical from oxidizer. The effectiveness of the absorbed or bound activator ion is not expected to be the same when the activator is on one abrasive as when it is attached to a different abrasive. There is believed to be an interaction between the abrasive and the activator ion, or between the stabilizer and the activator ion, or both, that influences the effectiveness of the ion in increasing the production of free radicals from the oxidizer capable of producing free radicals. Generally, the transition metal activator(s) of this invention are coated on at least a part of the outer surface of one or more abrasives. Examples of suitable abrasive particles, any of which may be at least partially coated with a transition metal activator of the current invention, include, but are not limited to, metal oxides including particles comprising: alumina, silica, ceria ($CeO_2$), $Ce_2O_3$, both $CeO_2$ and $Ce_2O_3$, titania ($TiO_2$), $Ti_2O_3$, both ($TiO_2$) and $Ti_2O_3$, zirconia, manganese dioxide, yttrium oxide ($Y_2O_3$), $Fe_2O_3$, FeO, tin oxide, germania, copper oxide, nickel oxide, manganese oxide, and tungsten oxide, as well as spinels comprising one or more of Al, Mg, Zn, and Fe, and compounds other than oxides, for example metal (of the metals listed in the preceding oxides) nitrides such as zirconium nitride; metal (of the metals listed in the preceding oxides) carbides, e.g., silicon carbide, titanium carbide, or tungsten carbide; metal (of the metals listed in the preceding oxides) silicides; or ceramics such as metal (of the metals listed in the preceding oxides) titanate, tantalate, zirconate, metal-germanium oxide, niobate, boride, or combinations thereof; boron carbide; as well as polymeric particles having a chelating capacity, polymer/metal oxide composite particles, or even suspended agglomerations of silicates or aluminate, or mixtures of any of the above, some or all of which may optionally be coated with activator ions and/or be modified by stabilizers. The plurality of particles having a surface and having at least one activator associated with the surface can also comprise a substantially spherical ceramic particle having an average particle size from about 0.001 to about 1 micron and having a particle size distribution such that: at least about 95% by weight of the ceramic particles have a particle size within about 30% of the weight average particle size, wherein the ceramic particle comprises at least one metallic oxide selected from the group consisting of zinc oxide, bismuth oxide, cerium oxide, germanium oxide, silica, aluminum oxide; and a metallic sulfide, a metallic titanate, a metallic tantalate, a metallic zirconate, a metallic silicate, a metallic germanium oxide, a metallic niobate, a metallic borides, a metallic nitride, a metallic carbide, a metallic telluride, a metallic arsenide, a metallic silicide, metallic selenide, and mixtures or combinations thereof.

In selecting abrasive particles for particular CMP slurries, the particle size, distribution of particle size, crystalline phase, and uniformity of crystalline phase are all properties that affect the chemical mechanical polishing process. While the list seems endless, those of skill in the art are aware that: only certain abrasives are useful in selected pH ranges; only certain abrasives are very useful for obtaining the desired selectivity of one component over another, when both components are typically found on a surface; certain abrasives are too hard or soft for polishing particular substrates; certain abrasives result in greater levels of ion contamination or defectivity; and there is a substantial difference in cost of abrasives. The choice of abrasive can depend on the particular nature of the substrate being polished using prior art information, wherein the inclusion of coated particles will generally accelerate the substrate removal rates. Preferred abrasive particles include alumina (alpha-, beta-, and/or gamma-alumina), silica (colloidal or fused), ceria, and spinels. The more preferred abrasives for tungsten are colloidal silica and alpha alumina, followed by fused silica and gamma alumina.

The physical properties of the abrasive particles and particularly the crystalline form will also affect the surface charge or Zeta potential of the polished surface. The Zeta potential can have a great effect in the stability as well as on the polishing performance of the slurry. In addition, an undesirable Zeta potential can affect the residual particle surface charge of the polished surface prior to post-CMP cleaning. The Zeta potential is an electrostatic potential measurement of the interaction of the electrostatic double layer ions (anions and cations) that exist around each particle in a solution. The Zeta potential can be positive, zero or negative and for the slurries of the invention is preferably greater than or equal to +10 mV or less than or equal to −10 mV. Another concern is that the Zeta potential between the slurry and metal particles and the wafer will be such that the particles will be attracted and adhere to the wafer surface thereby possibly requiring additional post-CMP cleaning steps to be performed to remove the adhering particles. If the Zeta potential of the slurry composition does not have a desired value, the slurry composition can be susceptible to settling of the slurry particles, which can be detrimental to the performance of the slurry during the CMP polishing process.

Various combinations of abrasive particles can be used if desired. In addition, in a slurry, some abrasive can have a transition metal activator of this invention coated thereon, and other abrasive can be free of coated transition metal activator. These coated and uncoated abrasives can be the same or different composition, be the same or different type, or both.

When abrasive size is mentioned, the size is the average particle diameter, which can be measured by for example microscopic examination, or by other techniques generally used in the industry. The surface area of the abrasives can vary widely, for example between 1 and 2000 square meters per gram, as measured by BET. When size ranges are specified, for example, from 10 to 80 nanometers, this means that the average particle size falls within those extremes, but preferably the individual particles have a size distribution such that substantially all particles, i.e., at least 95% by count (for a single mode composition) have sizes within 30%, preferably within 10%, of the average particle diameter. For the example of a slurry with a particle size of between 10 to 80 nanometers, a preferred composition may have an average particle size of 20 nanometers where at least 95% of particles have sizes between 14 and 26 nanometers, more preferably between 18 and 22 nanometers.

In preferred preparations, the activator-coated particles have an average particle size of less than 120 nm, for example having an average particle size of about 50 to 80 nm. In some embodiments of the invention, the particles are substantially monodispersed. One preferred composition has abrasive particles which are monodispersed and are of an average size which lies between 30 and 100 nanometers, where the material is single-mode or bimodal or trimodal. It is known to use cocoon-shaped abrasive, which is generally defined in the industry as a particle where the length component is a factor of two or three times the width component. While it is possible to form cocoon-shaped particles of a single matrix, it is preferred to form the cocoon-shaped particles from 2 to 3 loosely bound smaller particles. One composition has abrasive particles that are cocoon-shaped where 2 to 3 individual particles forming the cocoon are of an average size of between about 10 and 40 nanometers.

The abrasive particles may form aggregates, which are particles loosely or strongly held together in clumps, where the number of particles in an aggregate depends largely on the chemistry of the composition and on the particle size. Aggregates typically have substantially the same dimensions, plus or minus 70%, measured in each direction, and have a plurality of particles interconnected such that a plurality of particles contact at least three other particles. Such aggregates can be desirable because they have high polishing rates as found with bigger particles but also have some resiliency, which reduces gouging. A useful aggregate for very fine features are abrasives in aggregate form with a particle size of 7 to 15 nanometers with an aggregate size of 0.02 to 0.05 microns.

In some circumstances superior results are obtained with chains formed of very small abrasive particles. As used herein, a chain is a structure with a length-to-width ratio of at least 4, preferably at least 6, and in some embodiments at least 10. The chain is not a single long crystal, but is a mass of small individual, preferably substantially spherical silica particles bound end to end. Such chains are believed to have an effective size that is much larger than the average particle, but is much more resilient than either an aggregate or a cocoon-shaped structure.

Of course, it is realized that formulations may and usually do contain a plurality of structures, be they monodispersed particles, cocoon shaped particles, cocoon-shaped particles formed of bound substantially spherical particles, chains, and aggregates. As used herein, when a structure is specified, at least 50% of the weight of abrasive should have that structure at least before polishing. When two or more structures are specified, at least 70% of the particles by weight should fall into the categories mentions, at least before polishing.

The amount of particles can range across the ranges normally used for solid abrasives or other solid particles in a CMP slurry, for example from about 0.01% to 20%, for example between about 0.1% to 4%, by weight based on the weight of the slurry. In one important embodiment the amount of abrasive is kept very low. Without being bound by theory, it is believed that the enhanced chemical activity of the fluid surrounding the particles results in less need for abrasive. At low abrasive concentrations, the current invention still gives high substrate removal rates with good NU %. Again without being bound by theory, the high amount of solids in prior art formulations is believed to contribute to poorer wafer uniformity as there are particle to particle interactions, as well as solid migration due to centrifugal forces forming undesirable accumulations. Such problems can be minimized by use of slurries having less than 1% by weight abrasive.

The preferred concentration of coated particles is very dependent on particle size, but is for sizes between about 0.005 and 0.4 microns is between about 0.05% to about 12% by weight, more preferably between about 0.1% and 7%, for example between about 1% and about 2.5% by weight.

Silica: The plurality of particles having a surface and having at least one transition metal activator of this invention associated with the surface in the principal embodiments can comprise a silica, optionally wherein the particles have a BET surface area between about 5 and 1500 $m^2/g$, preferably with an average particle size less than about 1 micron, and a particle size distribution such that at least about 95% by weight of the silica particles have a particle size within about 30% of the weight average particle size, and additionally or alternatively, wherein the particles have an average particle size from about 0.005 to about 0.6 microns. By silica particle it is meant that a substantial portion of the particle, for example at least 50% by weight, preferably at least 95% by weight of the particle is silica. Suitable abrasive particles are commercially available and can be prepared by known methods, for example, by wet chemical methods such as condensation-polymerization or colloidal precipitation.

Advantageously the silica has a stabilizer, e.g., an inorganic oxide coating of a stabilizer, of which boric acid is preferred. Advantageously at least 90%, for example at least 95%, of the available surface area of the particles comprise stabilizer. Other stabilizers include aluminate, tungstate, and the like. One un-tested yet potentially useful stabilizer may be a stannate.

The preferred silica for high removal rates is fumed silica. Fumed silica is produced by a thermal (high temperature process) and the material is known to have a "sharper edge" and a corresponding increase in polishing rate as compared to colloidal silica. For normal CMP, however, colloidal silica is preferred. Colloidal silica polishes at a lower rate than does fumed silica, but there are less defects and less abrasive-related contamination when using colloidal silica as opposed to fumed silica. Colloidal silica is preferred for transition metal activator coating. Very small or even undefined particles colloidal-type particles, for example a silica sol-gel, can also be used.

For colloidal silica, the preferred range of concentration in the slurry is less than 4% by weight, preferably less than 3% by weight, for example between about 0.05% and 2%, of which between about one twentieth to about all of the colloidal silica has transition metal activator attached thereto. Iron-coated colloidal silica works best at 3% and lower concentrations, as at higher levels the ILD (interlevel dielctric) oxide film is removed to quickly.

Advantageously, in one embodiment, there is between about 0.3% and about 1% by weight of total abrasive, where the amount of abrasive having transition metal activator associated therewith, especially iron on colloidal silica, is between about 0.1% and about 0.4%, where both percentages are based on the weight of the particles compared to the weight of the slurry. This slurry is especially superior for preventing the oxide film erosion outside the metal structures. In one preferred silica:iron/hydrogen peroxide system, there is only 0.6% total solids, all silica of size between about 0.05 and 0.1 microns in diameter, of which 0.16% is Fe coated and 0.44% is regular (uncoated) $SiO_2$. While colloidal silica is shown to be able to incorporate iron through its matrix, and to be able to retain absorbed iron more tenaciously than does fumed silica, we have found that fumed silica, which is more abrasive in character than colloidal silica, is beneficially included because of its increased abrasive character relative to colloidal silica. In one preferred embodiment, blends of fumed and colloidal silica are used. Advantageously, the fumed silica has little or no activator coated thereon. Additionally, it is known that fuimed silica, with its greater porosity, has a lower settling rate in a slurry than does colloidal silica. The fumed silica can be any of the high-surface-area silica particles used in the industry, for example having a surface area (BET) of between about 3 and about 1000 $m^2/g$. Very high porosity gives a more friable particle, and very low surface area gives a slurry which settles faster. A surface area of between about 20 and about 200 $m^2/g$ gives good toughness and acceptable settling properties.

As an aside, we have surprisingly found that the use of fumed plus colloidal silica also gave far larger removal rates (with soluble ferric ions and a per-type oxidizer material present) than either colloidal silica or fumed silica as the only particles. Advantageously, the particles associated with the transition metal activator are colloidal silica-based, and these can be admixed with fumed silica that has a lower quantity of a transition metal activator thereon, or no transition metal activator thereon. However, the fumed silica can contain transition metal activator, particularly iron, coated thereon.

Particle size of the silica will in most embodiments range from 3 microns to 3 nanometers. As is known in the art, fine control of particle size is needed to minimize defects. The silica abrasives for very fine features are by necessity also very fine. We have found that particles below 0.15 microns, preferably below 0.1 microns, are particularly useful. On the other extreme, unless the zeta potential of the stabilized coated silica is controlled, particles having a diameter of less than about 10-20 nanometers will show an unfavorable tendency to stick to the substrate. The particle size of the colloidal silica is beneficially between about 50 nanometer and about 200 nanometers, for example between about 60 nanometers and about 120 nanometers (alternately about 0.05 to 0.2 microns). In one preferred embodiment, the particle size of the colloidal silica is between about 70 nanometers and about 100 nanometers, alternately between 0.07 and 0.1 microns.

In some embodiments of the invention, the particles are substantially monodispersed. One preferred composition has 0.5 to 3% silica where the particles are monodispersed and are of an average size which lies between 30 and 100 nanometers, where the material is single-mode or bimodal or trimodal. It is known to use cocoon-shaped silica, which is generally defined in the industry as clumps of between 2 and 3 individual particles, such that there is a length component that is a factor of two or three times a width component. While it is possible to form cocoon-shaped particles of a single matrix, it is preferred to form the cocoon-shaped particles from 2 to 3 loosely bound smaller particles. The particles may form aggregates, which are silica particles loosely or strongly held together in clumps, where the number of particles in an aggregate depends largely on the chemistry of the composition and on the particle size. For silica particles of average size of 15 nanometers, an aggregate may contain ten or more individual particles such that the aggregate size is about 40 microns. Aggregates typically have substantially the same dimensions, plus or minus 70%, measured in each direction, and have a plurality of particles interconnected such that a plurality of particles contact at least three other particles. Such aggregates can be desirable because they have high polishing rates as found with bigger particles but also have some resiliency, which reduces gouging. Particularly preferred for very fine features is silica in aggregate form with a particle size of 15 nanometers (0.015 microns) with an aggregate size of 0.04 microns, or silica with a particle size of 7 nanometers (0.007 microns) with an aggregate size of 0.02 microns. In some circumstances acceptable results are obtained with chains formed of very small silica particles. The chain is not a single long crystal, but is a mass of small individual, preferably substantially spherical silica particles bound end to end. An exemplary chain is formed of 3 to 10 particles each having an average diameter of between 3 and 20 nanometers. Such chains are believed to have an effective size that is much larger than the average particle, but is much more resilient than either an aggregate or a cocoon-shaped structure Smaller particles result in lower substrate removal rate. For this reason, in many embodiments larger particles are preferred. In another embodiment, the particle size of the colloidal silica is beneficially between about 50 nanometer and about 200 nanometers, for example between about 60 nanometers and about 120 nanometers (alternately about 0.05 to 0.2 microns). In one preferred embodiment, the particle size of the colloidal silica is between about 70 nanometers and about 100 nanometers, alternately between 0.07 and 0.1 microns. In another embodiment, the particle size of the silica is beneficially between about 50 nanometer and about 250 nanometers, for example between about 60 nanometers and about 200 nanometers (alternately about 0.05 to about 0.3 microns). In one preferred embodiment, the particle size of the silica is between about 70 nanometers and about 150 nanometers.

In another embodiment, the transition metal activator-coated particles comprise silica sol/gel having silicate agglomerations or particles particles in the range of about 10 to about 60 nanometers in diameter. The particle size of the sol/gel having the transition metal activator, i.e., iron, associated on the surface thereof is beneficially between about 40 nanometer and about 60 nanometers. The amount of the transition metal activator-containing silica sol-gel can range from 0.05% to 6%, for example between 0.1% to 1%, of the slurry by weight. This material is typically, but need not be, mixed with an abrasive comprising particles greater than about 60 nanometers in diameter. The preferred concentration of abrasive is between about 0.1% to about 6% by weight, more preferably between about 0.3% and 3%, for example between about 0.5% and about 1% by weight, and the abrasive advantageously has an average particle diameter of between about 70 and about 250 nanometers. Alternatively, the pad can comprise abrasives.

Even more surprisingly, we have found that even at very low quantities of abrasive, only a small fraction of the abrasive need have transition metal activator associated therewith. While all of the abrasive can have transition metal activator associated therewith, we have found excellent results are obtained with only a small amount of the abrasive having the transition metal activator associated therewith admixed in a slurry with lower-cost normal abrasive. The amount of abrasive that is coated with the transition metal activator can range from about 0.01% to about 5% by weight of the slurry is sufficient, based on the weight of the transition metal activator-containing particles to the weight of the slurry. In one preferred embodiment, the amount of abrasive (or other particle) that is coated with the transition metal activator can range from about 0.001% to about 2%, more preferably from about 0.01% to about 0.9%, for example from about 0.05% to about 0.3%, based on the weight of the transition metal activator-containing particles to the weight of the slurry. The total amount of abrasive is advantageously less than 1% by weight of the slurry. The prior art formulations recommend higher amounts of abrasive. For example, EP 0844290 to Grumbine in sec. 0044 discloses a slurry with a fumed silica concentration of 3 to 45% with 10-20% being best. We have surprisingly found that lower abrasive content provides superior results. In particular, we have found that less than 5% abrasive, preferably less than 3% abrasive, for example between about 0.05% and about 2.8% by weight of abrasive, provides superior results. In a preferred embodiment, the amount of abrasive is between about 0.2% and 2%, for example between about 0.4% and about 1%, and in one preferred embodiment the amount of abrasive is between about 0.5% and about 0.8% by weight. These are much lower concentrations than are typically used in the industry, and represent an important breakthrough in the art. The lower amount of abrasive allows reduced cost as well as the ability to more closely engineer the abrasive to find the particular and narrow properties, including particle size, sharpness, and amount of transition metal activator attached thereto.

Alternative Iron-Coated Silica Manufacture—In one embodiment, fresh non-aged silica is advantageously utilized to form the activator metal-containing particle. This involves building the particle from a very small size and inserting the metal onto the outer surface, advantageously by binding the activator metal, i.e., the iron, with at least one and preferably with a plurality of Si—O— groups. First, finely divided silica particles are precipitated, or alternately provided, beneficially in finely divided particles, to an aqueous solution at an alkaline pH, for example pH 9-10. Generally, very finely divided silica may cause water to approach that high pH value. Colloidal silica is a preferred particle to use with the activator metal, particularly the more highly polymerized species or particles larger than about 50 Å. However, smaller particles are beneficial at higher pH, and we have found down to 1-20 Å particles useful starting agents with pH >9 silica abrasives. Then, the pH is adjusted to a very acidic value, for example between about 1 and 3 about 3, i.e., about 2. The low pH is believed to dissolve silicates, creating an abundance of particles with a diameter that is believed to be around 10 to 20 angstroms. At this point iron can be added, generally to form a solution having between 0.01% and 0.5% by weight, for example 0.05% to about 2% by weight. Monomeric silica does not react with most metal ions in water at low pH where $Si(OH)_4$ can exist. However, iron (and incidentally uranium)

are the only metal ions that form basic ions at the pH of 2, where monomeric $Si(OH)_4$ is most stable. The other known reaction of monomer with a metal cation is the case of ferric iron, reported by Weber and Stumm and further examined by Porter and Weber in regard to the effect of the degree of polymerization of silica. They polymerized the silica at a concentration of 2280 ppm at pH 0-10 for various lengths of time, under conditions that are known to give very small spherical particles. With increasing polymerization of silica with formation of adjacent SiOH groups that can combine with iron. At pH 2, the number of SiOH groups combined per iron ion increases from one on the monomer to two or three as the particles become larger. It is important that the pH of the solution containing the iron and the silica is below about 3.5. At or somewhat below pH 3.5 a soluble complex between $Si(OH)_4$ and $Fe^{3+}$ exists. The interaction of $Si(OH)_4$ with ferric iron is evidenced by the fact that concentrations of $10^{-4}$-$10^{-3}$ M $SiO_2$ in water catalyze the oxidation of $Fe^{2+}$ to $Fe^{3+}$. At pH 6-8, a ratio of 3 $Si(OH)_4$ to 1 $Fe^{3+}$ prevents precipitation of $Fe(OH)_3$. However, in the case of $Al^{3+}$, a fivefold excess of $Si(OH)_4$ is required to prevent precipitation.

It is necessary to consider the polymerization of silica in solution below pH 7 separately from that above pH 7 for the following reasons. First, it is only at low pH that the polymerization is sufficiently slow to allow the early incorporation stages to be followed. Changes that occur in hours at pH 2 are completed in minutes or seconds at pH 8-9. Second, the polymer units or particles formed at low pH bear no charge and unless the silica concentration is very low, aggregation begins to occur soon after polymeric particles are formed, not only because of the lack of charge on the particles, but also because the particles are extremely small and cease to grow after they reach a diameter of 2-3 nm. Since the rate of aggregation depends mainly on the number of particles per unit volume and less on their size, aggregation occurs even at very low silica concentrations. The formation of "oligmers" generally means low molecular weight. polysilicic acids which might include for example 3-8 groups. This polymerization behavior appears to be explained by the following: 1). The monomer, $Si(OH)_4$, has a pKa of ~9.9; 2. The dimer pKa is reported higher but is likely lower than 9.9; and 3. Higher polymerized species have a much lower pKa approaching 6.7 and hence are more highly ionized than the dimer or monomer. This implies that the greater the number of siloxane linkages and the fewer OH groups on a silicon atom, the stronger the acidity (the pKa goes lower). Polymerization involves intermediate ionization to $\equiv SiO^-$ or to $\equiv Si^+$ below or above pH 2, respectively, but to simplify discussion only $\equiv SiO^-$ is used as the example. Only recently was it shown by Harder and Flehmig that even at 20° C., quartz crystals were nucleated in a suspension of $Fe(OH)_3$ or $Al(OH)_3$ in only 14 days. The solutions were very dilute: 2 ppm $Fe^{3+}$ or $Al^{3+}$ and 0.4-5 ppm $SiO_2$. In some manner, amorphous hydroxides of $Fe^{3+}$ (or Al, Mn, and Mg) can absorb and hold up to 9 moles of $SiO_2$ per mole of hydroxide. Therefore, for this invention, the first step is to shift the pH of a standard colloidal $SiO_2$ from pH 10-11 down to a pH of between about 1 and 4, preferably to a pH of about 2, and then subsequently or concurrently contacting the particle with the iron salt in a manner such that the iron salt becomes associated with the metal, and then finally adjust back to pH 3-4. Silica, especially colloidal silica, has a number of interactions with iron species. The end result is iron that is incorporated not only on the silica but within the silica matrix. This has certain advantages, as the particles can be recycled and re-used more often than for example silica having iron absorbed thereon.

Other mechanisms can be used to bind or associate a transitional metal to a particle. For example, lower amines are adsorbed as the substituted ammonium ions. Silica gel bearing these adsorbed ions has useful adsorbent properties, especially for weakly acidic substances. Also, the ammonia- or amine-bearing gels have selective affinity for certain metal ions, which are strongly adsorbed. Selective adsorption controlled in this way has been demonstrated by Neimark et al. We have surprisingly found excellent results with our slurries that are ammonium-stabilized commercial colloidal silica products that are neutralized with nitric acid to pH ~2 and then adjusted with NH4OH or TMAH chemistries to rise the pH to ~3. Potassium-stabilized colloidal silica does not give similar results. Kolthoff and Stenger found that when the ion $Cu(NH3)_4^{2+}$ was adsorbed on the silica surface, the $NH_3$:Cu ratio was less than 4:1.

Another method of making transition metal-coated silica is as follows. A master batch of $SiO_2$ is made by pumping sodium silicate into a reactor at a certain temperature to form small silica particles (20-40 nm). Then add more silicate at a rate to maintain a certain particle size (i.e., about 70-80 nm) while using ion exchange resin to neutralize and remove much of the sodium in the mixture. As the particles are growing, or alternately after the particles have reached the desired size, add a transition metal that is a salt of iron, copper, silver, or the less-preferred metals, or combinations thereof. Advantageously the salts are such that the anion can be readily removed, for example a sulfate. In a preferred embodiment iron sulfate with HOAc is added. The slurry is again exposed to ion exchange resin to remove a portion of the anion, i.e., the sulfate, to allow the iron to adsorb onto the silica. Once this operation is complete, the material can be stabilized by adding salts. Non-metallic salts, for example a buffer of sulfuric acid and ammonium sulfate or tetramethyl ammonium sulfate, are preferred.

Alumina: The invention includes a method of polishing by using polishing slurries comprising transition metal activator-coated particles in a slurry with at least one oxidizer that reacts with the transition metal activator-coated particles to create free radicals in an amount useful for accelerating a chemical mechanical polishing process, wherein slurries of this embodiment have transition metal activator coated alumina abrasive material. In one embodiment, the slurry comprises alumina, preferably alpha-alumina, having the transition metal activator(s) of this invention coated thereon. Alumina was surprisingly found to hold transition metal activators, i.e., iron, tightly. Alumina is useful for different substrates, and for different pHs, as is known in the art. The coated alumina of this invention produces free radicals, i.e., hydroxyl free radicals, which accelerate the substrate removal rate. The plurality of particles having a surface and having at least one transition metal activator associated with the surface thereof can comprise a alumina, optionally wherein the particles have a BET surface area between about 5 and 1000 m²/g and the weight average particle size is less than about 0.4 microns, and additionally or alternatively, wherein the particles have an average particle size from about 0.001 to about 0.2 microns. By way of example, the alumina may be an alpha-alumina, a gamma-alumina, colloidal alumina, fused alumina, ceramic alumina, or other aluminas known in the art, or a combination thereof. The alumina particles can comprise alpha alumina, preferably wherein the particles have a BET surface area between about 5 and 1000 m²/g and the average particle size is less than about 0.8 microns, say between about 0.03 and about 0.4 microns.

Advantageously the alumina has a stabilizer, e.g., an inorganic oxide coating of a stabilizer, of which boric acid is preferred. Advantageously at least 90%, for example at least 95%, of the available surface area of the particles comprise stabilizer. Other stabilizers include tungstate, and the like. One un-tested yet potentially useful stabilizer may be a stannate. Advantageously, in some embodiments, the stabilizer and the activator combine to equal at least 1% of the weight of the alumina, for example between about 1% and 3% by weight of the alumina, more preferably between about 1.1% and 2% by weight. Clearly, such a level of coating will provide polishing and slurry stability characteristics considerably different than for example pure alumina, though the underlying morphology and hardness of the alumina can be useful in polishing certain substrates.

Spinels: The invention includes a method of polishing by using polishing slurries comprising transition metal activator-coated particles in a slurry with at least one oxidizer that reacts with the transition metal activator-coated particles to create free radicals in an amount useful for accelerating a chemical mechanical polishing process, wherein slurries of this embodiment have transition metal activator coated spinel abrasive material. In one embodiment, the slurry comprises an iron spinel material, having the transition metal activator(s) of this invention coated thereon. In another embodiment, the slurry comprises an magnesium spinel material, having the transition metal activator(s) of this invention coated thereon. In another embodiment, the slurry comprises an zinc spinel material, having the transition metal activator(s) of this invention coated thereon. Of course, in another embodiment, the slurry comprises an spinel material comprising at least two of iron, zinc, and magnesium, the spinel material having the transition metal activator(s) of this invention coated thereon. The particles having a transition metal activator(s) of this invention coated thereon may comprise or consist essentially of spinel particles having the formula $AO.xZ_2O_3$ wherein A is at least one divalent cation, Z is at least one trivalent cation, and x is between 0.01 to 100. In one embodiment a slurry composition of the present invention is preferably substantially free of particles having a Mohs hardness of greater than 8.5, e.g., alpha phase alumina particles, when used in the final chemical mechanical polishing steps and thus provides a scratch-free surface. In the spinel particles, it is also preferred that x is between 1 and 12.5. Preferably, the A cations in the slurry compositions of the invention are selected from the group consisting of Mg, Fe, Zn, Mn, Ni, Ca and combinations thereof. The Z cations are preferably selected from the group consisting of Al, Fe, Cr, Ti, and mixtures thereof, wherein the A cations and the Z cations are not both entirely iron. The spinel particles can also include a small amount of at least one cation selected from the group consisting of Zr, Si, Ga, Cu, Co, V, B, Li, rare earth cations, and mixtures thereof. In one embodiment of the invention, A is Mg, Z is Al, and the formula of the spinel particles is $MgO.xAl_2O_3$. In another embodiment of the invention, A is Zn and Z is Al such that the formula of the spinel particles is $ZnO.xAl_2O_3$. In another embodiment of the invention, A is Fe and Z is Al such that the formula of the spinel particles is $FeO.xAl_2O_3$. Also preferred are spinel particles include those having essentially a maghemite (gamma-$Fe_2O_3$) or chromite structure. The spinel particles are preferably present in an amount between about 0.05 and about 10 percent by weight. The slurry compositions can also include between 0.1 and 10 percent by weight of other abrasive particles.

In accordance with the invention, the spinel particles of the invention are prepared to have certain desirable properties. In particular, the mean crystallite diameter of the spinel particles is preferably between 5 and 500 nm, more preferably between 5 and 100 nm. The mean crystallite diameter can be measured, e.g., using x-ray diffraction. The spinel particles preferably have a specific surface area of between 50 $m^2/g$ and 150 $m^2/g$. The preferred spinel particles of the invention also have a crystallite phase distribution including greater than about 95%, preferably greater than about 98% and more preferably greater than about 99% gamma-like spinel phase as measured using x-ray diffraction. This gamma-like phase has a spinel structure with a high level of cationic vacancies. It has been discovered that this gamma-like phase is particularly useful at polishing surfaces without scratching. The spinel particles of the invention typically have desirable Zeta potentials thus limiting the chance that the slurry particles will settle out of the slurry or that the slurry particles or metal ions will adhere to the wafer surface.

The invention includes a method of polishing by using polishing slurries comprising iron oxide abrasive particles in a slurry with at least one oxidizer that reacts with the iron oxide particles to create free radicals in an amount useful for accelerating a chemical mechanical polishing process. We have found that certain forms of iron oxide, in crystalline form, exhibit some increase in substrate removal rate suggesting increased oxidizer activity. Iron oxides such as FeO and $Fe_2O_3$ can be useful. The iron oxide may be treated to increase formation of free radicals to a commercially acceptable amount. Advantageously, the slurry comprises at least one additional abrasive material. Advantageously, the pH of the slurries of this embodiment are kept at levels between about 3 and about 7, for example between about 4 and about 5. Advantageously the particles are substantially surface-modified with stabilizer, that is, greater than 80% of available surface area covered by a stabilizer, for example from boric acid or an aluminate.

PER-TYPE OXIDIZER Capable of Forming Oxygen/Hydroxyl Free Radicals:

It is important to note that the bound activator metal does not directly take part in the oxidation process. In preferred embodiments, the iron levels are so low that it (the iron) is not the direct reagent in the polishing process. The core of the invention is the promotion of a Fenton-type reaction in which a per-type oxidizer is induced to react with the activator to produce free radicals in a sufficient amount and in sufficient proximity to the substrate to be polished so that the generated free radicals produce a substantially increased (e.g., at least greater than 10%, preferably greater than 20%, and typically greater than 50%) substrate removal rate. The preferred concentration of oxidizer is between about 0.2% and 10% by weight, preferably between about 1% and about 7% by weight, for example between about 2% and about 4% by weight. The preferred oxidizer is hydrogen peroxide or periodic acid. The per-type oxidizer that is induced to react with the activator to produce free radicals oxidizing agent is per-type oxidizer, which is generally defined as a compound containing an element in its highest state of oxidation; or a compound containing at least one peroxy group (—O—O—).

Suitable per-compounds containing at least one peroxy group include peroxides. As used herein, the term "peroxides" encompasses hydrogen peroxide and reaction products and complexes of hydrogen peroxide and other compounds, including specifically peroxyformic acid, peracetic acid, percarbonic acid, perboric acid, propaneperoxoic acid, butaneperoxoic acid, hydroperoxy-acetaldehyde, urea-hydrogen peroxide, and the like. Any mention of an acid also includes any salts thereof. Generally, the presence of organics, acids, and other anions is discouraged. The preferred peroxide is hydrogen peroxide. The preferred concentration is between about 0.2% and 10% by weight, preferably between about 1% and about 7% by weight, for example between about 2% and about 4%, by weight of the fluid component of the slurry. While lesser amounts are operative, the amount should not be so little that the concentration of hydrogen peroxide decreases by a significant percentage as the slurry travels over the substrate, as this will result in undesirable variable spacial substrate removal rates. In some embodiments, the hydrogen peroxide and the activator metal coated particles are mixed at or just prior to point of use, but the slurries are so stable this is not required.

Another preferred oxidizer that produces free radicals is periodic acid and/or any periodiate salt. This is particularly effective with iron-coated abrasives. The preferred concentration of periodic acid is between about 0.2% and 10% by weight, for example between about 0.5% and about 7% by weight, for example between about 2% and about 4%, by weight of the fluid component of the slurry.

Persulfate oxidizers can be the free-radical forming agent. As used herein, the term "persulfates" encompasses monopersulfates, di-persulfates, and acids and salts and adducts thereof. Included for example is peroxydisulfates, peroxymonosulfuric acid and/or peroxymonosulfates, Caro's acid, including for example a salt such as potassium peroxymonosulfate, but preferably a non-metallic salt such as ammonium peroxymonosulfate. Iron and copper are useful with persulfates. Silver is active at forming oxygen/hydroxyl free radicals only from persulfates. Thermal decomposition of persulfates can also form highly reactive sulfate free radicals. At temperatures above 40 C, persulfate begins decomposing to $SO_4^-$, which has an electrochemical potential of about 2.6 volts. In some embodiments, slurries containing persulfate are heated to about 40° C. at or just prior to point of use.

Peroxydiphosphates are useful in this invention, and preferred ranges are 0.5 to 10%, for example 2 to 6% by weight of the slurry.

We have beneficially found that the slurries and fluids of the present invention can achieve commercially acceptable substrate removal rates with very low oxidizer concentrations. This low-oxidizer-concentration embodiments reduce the absolute amounts of undesired hydrogen gas that can be produced, reduce chemical cost, reduce problems of exposure of workers and equipment to high concentrations of these somewhat hazardous compounds, facilitate neutralization of the oxidizer prior to disposal or even allow disposal without neutralization. By commercial rates it is meant over 1000, for example over 2000, angstroms per minute for components such as tungsten, and over 300, for example over 600, angstroms per minute for noble metals. Slurries of this embodiment contain from about 0.1% to about 3%, for example from 0.2% to 2%, i.e., about 0.5% to 1.5%, by weight of hydrogen peroxide or periodic acid, compared to the weight of the fluid.

Additives

One preferred mechanism of manufacturing the iron-coated silica useful in this invention is to place silica particles in a solution, adding iron sulfate, and then quantitatively removing sulfate with for example ion exchange resins. Iron sulfate is added to a silica-containing slurry in an amount sufficient to add the desired amount of iron to the silica, and the sulfate level of the slurry is then beneficially brought to below detectable limits, that is, less than 10 ppm sulfates. This has the effect of causing the iron, or other metal which promotes a Fenton-type reaction, to become bound to the surface of the silica. Advantageously, after the iron is bound to the silica, sulfate ions can be re-introduced to the slurry. We have found that sulfate ions can have a stabilizing influence on the silica slurry by retarding settling. Without being bound by theory, we believe the sulfate forms a stable double-layer about the bound iron. This can also reduce the activity of the iron. Sulfate can be present for example in an amount between about 30 and about 500 ppm sulfate, preferably between about 50 and 300 ppm sulfate, for example between about 100 and about 200 ppm sulfate. A sulfate level of 170 ppm can extend the time before particle settling becomes significant from about 2 days to about 5 days.

Method of CMP

The present invention also includes a method of chemical mechanical polishing a substrate using the slurry compositions described above. The slurry composition is applied to a surface of a substrate and the surface of the substrate is polished using the slurry to a desired end-point or planarization to provide the desired surface. In a typical chemical mechanical polishing process, the substrate is placed in direct contact with a rotating polishing pad. A carrier applies pressure against the backside of the substrate. During the polishing process, the pad and table are rotated while a downward force is maintained against the substrate back. An abrasive and chemically reactive solution, commonly referred to as a "slurry" is deposited onto the pad during polishing. Polishing without an abrasive is also possible using selected compositions of this invention. The slurry initiates the polishing process by chemically reacting with the film being polished. The polishing process is facilitated by the rotational movement of the pad relative to the substrate as slurry is provided to the wafer/pad interface. Polishing is continued in this manner until the desired film on the insulator is removed. In its basic components, a method for polishing a substrate including at least one metal layer comprising the steps of:

(a) admixing the CMP fluid of this invention, the fluid containing a compound that produces free radicals at least when contacted by an activator;

(b) contacting the fluid with an activator to form free radicals in the fluid;

(c) contacting the free radical-containing fluid to the substrate; and (d) mechanically abrading the substrate contacting the free radical-containing fluid to the substrate, thereby removing at least a portion of the metal layer from the substrate, wherein the substrate (typically comprising a metal such as tungsten) removal rate is at least 10% greater than the polishing rate of a similar composition but without the activator.

A method of measuring activator is as follows: Provide a slurry comprising an abrasive; separate and rinse the abrasive from the fluid carrier and oxidizer (if present), digest1 part by weight of the abrasive in each of 2 parts, 4 parts, and 8 parts of a solution of deionized water having 2% ascorbic acid at an elevated temperature of between about 40° C. to about 60° C. for a period of 24 hours, with stirring, withdrawing a portion of the digesting liquid, and analyzing the same for activator metals using known techniques, for example ICP. The size and variable composition of the slurry make separation of the particles from the liquid a case by case issue. Typically, particles can be separated from liquids by ultracentrigugation.

One problem facing operators is that certain slurries is hydrogen generation. Hydrogen is extremely explosive and is lighter than air, allowing hydrogen to accumulate in areas where one would ordinarily not expect gas to accumulate. One of the worst hydrogen generating compositions are those that contain hydrogen peroxide and a transition metal dissolved therein, such as iron, copper, or the like, which can generate tens of cc of hydrogen per minute per liter of slurry. Polishing methods using prior art slurries to minimize hydrogen production use two component formulations, admixing them at point of use. Though the slurries of the present invention typically produce orders of magnitude less hydrogen than would a typical iron nitrate hydrogen peroxide slurry, nevertheless precautions can be taken. The invention includes a method of polishing by using a slurry comprising: a first portion comprising water, a per-type oxidizer capable of forming free radicals such as hydroxyl radicals in the slurry, and optionally one or more pH-adjusting additives; and a second portion comprising water and particles comprising a transition metal coating thereon, and optionally one or more pH-adjusting additives, wherein the first and second components are mixed within an hour of being used, preferably within a minute of being used, and is typically mixed a few seconds prior to time of use, use being the time when the slurry contacts the substrate in a manner such that chemical mechanical polishing occurs. In a preferred embodiment, the particles are substantially separated from the fluid portion of the slurry within a few tens of minutes of time of use, for example, within a minute after time of use. In some embodiments, operators do not use oxidizers prone to generating excess hydrogen, particularly hydrogen peroxide, but rather use persulfates, or periodic acid.

Any or all of the following improvements can be incorporated into the above method. In some embodiments, fluids or slurries have less than 5 ppm, for example less than 2 ppm, of dissolved transition metals (other than those polished from the substrate, and other than tin, which can be a stabilizer) in any fluid portion of the slurry. In some embodiments, compositions have 2% or less by weight of oxidizer (which may include or be exclusively hydrogen peroxide), thereby limiting the absolute amount of hydrogen generation possible from a slurry. This limited oxidizer slurry is an important embodiment, limiting hydrogen gas generation, as well as minimizing purchasing costs and disposal costs, and with the method of the current invention commercially acceptable substrate removal rates can be maintained. In some embodiments, a chelator can be added at point of use. The pH of the slurry is advantageously between 2 and 7, say between about 2.6 and about 4.5, preferably between about 3 and about 3.5. The pH can be adjusted as needed, preferably with mineral acids such as sulfuric acid or nitric acid, and with bases such as ammonium hydroxide, mono-, di-, tri-, or tetra-alkyl ammonium compound, or a mixture thereof. The preferred base is tetramethyl ammonium hydroxide (TMAH). Other additives, including chelators, stabilizers, promoters, other oxidizers, other abrasives, corrosion inhibitors, and the like can be included, though generally such additives are not needed. Advantageously, the slurry has less than about 50 ppm of soluble metal ions. Advantageously, the slurry comprises less than about 10 ppm of a soluble form of the transition metal or metals associated with the particle. Excluding for example soluble tin, which may be used as a stabilizer, in preferred embodiments the slurry has less than 20 ppm total soluble metal, for example less than 5 ppm soluble metal.

In one embodiment of this invention particles having associated activator are recovered from used CMP slurries, for example by a simple expedient of separating particles having activator from the slurry by for example filtration, centrifugation, or the like, after polishing and are re-used. The activator is not used up in the process. If activator coated particles have different zeta potentials in the slurry than non-activator coated abrasive, separation may be done by partially destabilizing the slurry and recovering the particles having activator associated thereon. Various additives such as salts can be added to destabilize the slurry to enhance separation, but such recovered material should subsequently be washed, for example with a dilute mineral acid or ascorbic acid, prior to reuse. Such a system would have an additional amount of activator-coated particles added thereto to replace that lost to for example grinding. A small fraction of the recycled activator-coated particles may be disposed of to keep the amount of activator-coated particles in the CMP slurry constant.

In some embodiments the temperature can be changed during a CMP process, following a profile to give increased free radicals in the initial polishing and less free radicals in the later stage of polishing. Similarly, the amount of formation of free radicals can be changed by altering the pH of the solution. Other combinations will be devised by one of ordinary skill in the art with the benefit of this disclosure.

As mentioned above, the abrasive material of the composition is at least partially coated with the activator. As used herein, "coating" and its various linguistic or grammatical forms or counterparts generally refer to forming a physical connection between the abrasive and the activator, such as by forming at least a partial layer of activator material on at least a portion of the abrasive, absorbing or adsorbing the activator material on at least a portion of the abrasive, forming adhesion between the activator material and at least a portion of the abrasive, and the like, by any suitable means or method. By way of example, a method of producing a silica sol coated with iron acetate is provided in U.S. Pat. No. 4,478,742 of Payne, the entire contents of which are incorporated herein by this reference. Similarly, U.S. Pat. Nos. 3,007,878, 3,139,406 and 3,252,917, which describe ways of putting metals on a core of silica, are incorporated herein by this reference. The activator may coat from about 0.001% to about 100%, for example about 5 to about 100 percent of the surface of the abrasive particle, such as from about 5 to about 80 percent of the particle surface, or preferably, from about 25 to about 50 percent of the particle surface.

In one embodiment, activator is put on to substantially all the outer surface or all the connected surface, and then activator is removed by for example washing in heated acids, oxidizers, and/or chelators to obtain a desired coating, for example between about 1% and about 25% of surface area coated. The remaining activator will be very tenaciously bound to the surface, reducing activator loss due to leaching to the solution.

The CMP composition or slurry of the present invention may be prepared using conventional techniques. Typically, the water, additives, and abrasive components are combined, activator-coated abrasive is then added, oxidizer is then added, and the pH is adjusted. Alternatively, according to one aspect of the present invention, the activator-coated abrasive may be added to an existing CMP composition, such as a commercially available CMP composition that contains an oxidizing agent. For example, the activator-coated abrasive may be added as a slurry to a previously formulated peroxide composition to provide a CMP composition of this invention. In some CMP processes, particularly some of the advanced polishing processes, the composition is prepared by adjusting the amount of each composition component in real time, just prior to a re-mixing of the composition at the point of use. For most CMP processes, the prepared composition is re-mixed at the point of use, whereupon it is poured onto the polishing pad. Typically, the composition is poured onto the pad as it is moved or rotated. As the CMP process proceeds, additional slurry may be added or excess slurry may be removed, as desired or necessary.

The compositions of the present invention are all of the "coated activator" variety, comprising a activator-coated abrasive rather than solely a free, soluble promoter such as iron nitrate. As demonstrated above, this relatively stable, activator-coated abrasive is an extremely effective component of the composition of this invention.

The composition of the present invention is advantageously used in conventional CMP processes, and more particularly, in CMP processes that call for reduced carrier pressures. Generally, carrier pressures of from about 0.5 to about 2 psi are considered low carrier pressures, although this pressure range depends on the particular CMP process under consideration. Low carrier pressures are often desirable because they reduce the risk of wafer damage, such as scratching, delaminating, or destroying of material layers, particularly metal layers, on the wafer surface. When the composition of the present invention is used in a low-carrier-pressure process, desirable material removal rates are obtainable even though the carrier pressure is low. Appropriate use of the composition in CMP processes may reduce the risk of wafer damage and improve wafer yield and performance.

Additionally, the composition of the present invention may be advantageously used in the CMP of wafers layered with relatively fragile films, such as porous films, that have low dielectric constants. At the pressures used in typical CMP processes, these films are particularly vulnerable to delamination, crushing, or other damage. In advanced CMP processes used for these wafers, carrier pressures of about 2 psi are desirable and carrier and platen speeds are about the same as, or often greater than, those used in typical CMP processes. For a wafer layered with a porous material of relatively low dielectric constant, such as from about 1.5 or about 1.7 to about 2.3, and of about 0.1 micron in thickness, a removal rate of greater than about 5000 A/mm is desirable. As demonstrated herein, these removable rates are obtainable when the composition of the present invention is used in CMP, even when the carrier pressure is relatively low. The compositions of the present invention are believed suitable for use in CMP processes having even lower carrier pressures, such as the low carrier pressures described above.

As demonstrated herein, the composition of the present invention may be used in CMP processes to obtain desirable material removal rates and within-wafer nonuniformity values. Merely by way of example, the composition may be used in the CMP of a substrate surface having a feature, layer or film thereon, such as a film of aluminum, copper, titanium, tungsten, an alloy thereof, or any combination thereof. Further by way of example, the composition may be used in the CMP of such a substrate surface, where the film has an adjacent or an underlying feature, layer or film, such as a film of tantalum, tantalum nitride, titanium, titanium nitride, titanium tungsten, tungsten, and any combination thereof.

Accordingly, the present invention includes a method of polishing a substrate surface having at least one feature thereon that comprises a metal, such as metal or metal alloy feature. The substrate undergoing polishing may be any suitable substrate, such as any of the substrates described herein. According to the method of the invention, a composition of the invention is provided and the feature on the substrate surface is polished. The polishing is chemical mechanical polishing, such as that associated with any conventional or known CMP process, any suitable later-developed CMP process, or any CMP process described herein. The polishing process parameters may be any suitable parameters, such as any of the parameters described herein. For example, the carrier pressure applied to the substrate surface, or the feature thereon, may be from about 1 to about 6 psi.

Generally, the polishing of the substrate surface continues until the targeted feature or layer is substantially coplanar with surrounding material, such as an oxide material, on the substrate. For example, the polishing of a metal-featured substrate may continue until any metal excess is sufficiently removed to provide a substantially uniform profile across the substrate surface. By way of example, suitable surface uniformity (typically measured using known wafer profiling techniques) is reflected by within-wafer nonuniformity (WIWNU) values of less than about 12%, and preferably, from about 4% to about 6%, the lower values typically reflecting better process control. Appropriate WIWNU values may vary depending on the characteristics of the CMP process and the substrates undergoing polishing.

The inventive method may be used to remove targeted material, such as metal or metal alloy, from the substrate surface at a rate of from about 100 to about 10,000 or to about 15,000 A/mm. The present method may be used to provide a polished substrate surface of good uniformity, such as a substrate surface having from about zero to about 40 percent, preferably, from about zero to about 12 percent, or more preferably, from about zero to about 10 percent, within-wafer nonuniformity. Further, the present method may be used to provide a polished substrate surface wherein any microscratch on the surface that is associated with the polishing is less than about 20 A. The present invention further encompasses a substrate produced by the inventive method, including any of the substrates described herein, and any of the substrates having any of the qualities, such as desirable uniformity values and surface characteristics, described herein.

Generally, the CMP slurry compositions (or liquid oxidizer/activator coated abrasive combinations) described herein are useful with little or no modification in all CMP methods and with all CMP equipment. Unlike certain systems, there is no need to provide actinic energy to the slurry disposed between a polishing pad and a substrate being polished.

Additionally, magnetism and electric field potentials, as described for example in U.S. Pat. No. 6,030,425 may be useful, but are not preferred as they unduly complicate the CMP equipment. Similarly, the use of methods disclosed in U.S. Pat. No 6,692,362 titled Methods of Producing Hydroxyl Radicals For Chemical Reactions, including exposure of the slurry and/or substrate to ultrasound/electrochemical energies to increase the rate of formation of hydroxyl radicals can be useful to further increase polishing rates. The use of an electric current and a membrane comprising an ion exchange material, to quickly remove ions in the polishing slurry formed by oxidizing the substrate, such as is described in U.S. Pat. No. 6,722,950, may be useful. Various aspects and features of the present invention have been explained or described in relation to beliefs or theories, although it will be understood that the invention is not bound to any particular belief or theory. Further, although the various aspects and features of the present invention have been described with respect to preferred embodiments and specific examples herein, it will be understood that the invention is entitled to protection within the full scope of the appended claims.

EXAMPLES

The following examples are meant to illustrate, but in no way limit, the claimed invention. One of ordinary skill in the art will see numerous obvious variations, which are intended to be encompassed by the claims. Throughout this application, unless otherwise specified, % is weight percent, temperature is in Degree Centigrade, all slurries are water-based and have the named components and the balance of the slurry is water. When expressed as "ppm", the concentration is parts per million by weight based on the total weight of the polishing slurry. Unless otherwise specified, all tests are performed on blanket wafers having one type of surface (typically CVD deposited tungsten, titanium nitride, copper, or PETEOS)

prepared for polishing experiments. PETEOS means Plasma enhanced deposition of tetraethoxy silane. Other abbreviations include "A" or more formally "Å" for angstrom(s); CMP for chemical mechanical planarization, or chemical mechanical polishing; min for minute(s); ml for milliliter(s); mV for millivolt(s), psi for pounds per square inch; and rpm for revolutions per minute.

Comparative Example 1

The effect of soluble ferric nitrate on a slurry comprising periodic acid ("PIA"), silica abrasive, and ammonia was monitored over time as determined as follows. A prior art slurry having 2% PIA, 3% Silica; 0.15% Ammonia; and an amount varying from 0 to about 0.5% $Fe(NO_3)_3$ were prepared and adjusted to pH 3. The ferric nitrate concentrations were 0.00, 0.01, 0.05, 0.10, and 0.50 weight %. Tungsten polishing rates were determined with a Strasbugh 6EC Polisher putting 6 psi down force pressure/0 psi back pressure at 90 rpm table speed and 90 rpm carrier speed, and the slurry flow was 175 ml over 60 sec polishing time, with 4 cycles of the conditioning the IC1000 K groove/Suba IV pad. There are two components to polishing. The first is rate of substrate removal rate, "RR", which unless otherwise specified is in Angstroms per minute. The second is wafer non-uniformity, "NU %", and the substrate may be also identified, for example WNU % is the Tungsten wafer non-uniformity, TiNU % is titanium wafer nonuniformity, and so on. If NU % is large then preferential areas of CMP action and erosion have occurred, which lowers the process efficiency and the wafer quality. The data is shown in Table 2.

TABLE 2

Comparative Examples With Soluble Ferric Nitrate and Periodic Acid

| % Soluble $Fe(NO_3)_3$ | Tungsten RR | Tungsten NU % | TEOS RR |
|---|---|---|---|
| 0 | 2947 | 5.0 | 908 |
| 0.01 | 3135 | 4.7 | 909 |
| 0.05 | 3637 | 6.1 | 890 |
| 0.10 | 3627 | 6.6 | 869 |
| 0.50 | 3686 | 5.9 | 855 |

The removal rate of W increases by about 20% with 0.05% of dissolved ferric nitrate in periodic acid, over the removal rate of W in a slurry that is free of ferric nitrate. The increase was accompanied by a small but significant increase in WNU %. Higher quantities of dissolved ferric nitrate show little benefit. The TEOS removal is not sensitive to the ferric nitrate level.

The effect of pH on the soluble iron/periodic acid system at a ferric nitrate concentration of 0.01% was determined as follows. A slurry was prepared by admixing 595 g deionized water, 200 g of 10 wt % periodic acid solution in water, 200 g of 30 wt % colloidal silica, a trace, for example 5 g of 30 wt % ammonia was added to the above slurry to adjust pH from 1.8 to 3 and to 7, and 0.22 g of 45% ferric nitrate solution was added, resulting in a slurry having 2% PIA, 3% Silica; and 0.01% $Fe(NO_3)_3$. Polishing rates were determined with a Strasbugh 6EC Polisher putting 6 psi down force pressure/0 psi back pressure at 90 rpm table speed and 90 rpm carrier speed, and the slurry flow was 175 ml over the 60 sec polishing time, with 4 cycles of the conditioning the IC1000 K groove/Suba IV pad. The results are shown in Table 3.

TABLE 3

Comparative Examples With 0.01% Soluble $Fe(NO_3)_3$ and Periodic Acid

| Slurry pH | Tungsten RR | Tungsten NU(%) | TEOS RR |
|---|---|---|---|
| 1.8 | 3435 | 3.3 | 879 |
| 3.0 | 3494 | 4.1 | 893 |
| 7.0 | 3418 | 4.4 | 547 |

The pH had no significant effect on the tungsten polishing rate. Ferric hydroxide ($Fe(OH)_3$) starts to precipitate at pH 2.7 and substantially completely precipitates at pH 4 when $[Fe^{3+}]$ =0.01M (0.06% Fe). At pH 7 the Fe species should be in the form of iron hydroxides which were expected to be inactive. Without being bound by theory, it is believed that iron exists for at least some time as some other species (not simply $Fe^{+3}$) in the slurries, and the most likely form is a pseudo-stable ferric nitrate complex in or with water. Using the same slurry and polishing system, the effect of the periodic acid concentration was determined on these comparative example slurries, as shown in Table 4.

TABLE 4

Comparative Examples With 0.01% Soluble Ferric Nitrate and Periodic Acid

| Slurry PIA,(wt %) | Tungsten RR | Tungsten NU(%) | TEOS RR |
|---|---|---|---|
| 0.0 | 584 | 8.8 | |
| 0.5 | 2226 | 8.8 | 886 |
| 1.0 | 3192 | 4.3 | 886 |
| 1.5 | 3433 | 3.8 | 905 |
| 2.0 | 3627 | 3.8 | 869 |

In the presence of constant iron activator concentration, the tungsten removal rate increases with increasing concentration of PIA, though the TEOS removal is not sensitive to the PIA concentration. The amount of increase in tungsten removal rates is greatest at low concentrations of PIA, and at concentrations outside the range of 0.5% to 2% PIA futher increases in the PIA concentration have dubious value. Interestingly, the W—NU % decreases sharply from 8.8% at 0.5% PIA to 4.3% at 1% PIA to 3.8% at 1.5 PIA. Apparently having an excess of oxidizer, e.g., at least 1% of PIA, is necessary to achieve low NU %.

Finally, the effect of various abrasives were determined on these Comparative Examples, using the same 2% PIA, 0.01% ferric nitrate, 3% abrasives slurries, again using the same polishing parameters as discussed above. The data is in Table 5. The data from the fumed & colloidal silica could be skewed because there were a number of large silica particles in the slurry.

TABLE 5

| Abrasive | Tungsten RR | Tungsten NU(%) | TEOS RR |
|---|---|---|---|
| Colloidal Silica | 3946 | 5.4 | 465 |
| Alumina | 3862 | 3.2 | 301 |
| Fumed Silica | 3797 | 11 | — |
| Fumed and Colloidal Silica | 4843 | 5.6 | 528 |

Clearly, the combination of fumed silica and colloidal silica gave the greatest removal rates. Unless used with colloidal silica, however, fumed silica is less preferred.

The best system for a periodic acid/soluble ferric nitrate slurry, especially for tungsten, has 1.5 to 2.4, for example 1.8 to 2.2, weight percent periodic acid; a pH of 1.5 to 4, for example 2.8 to 3.5, if modest loss of the dielectric TEOS is not a problem, though a pH of about 4 to about 8, preferably about 6 to about 7, is preferred if greater selectivity between the tungsten and the dielectric is desired; a ferric nitrate concentration of between 0.01 and 0.05 weight percent; and between about 2 to 4 weight percent of either alumina or silica, with alumina or a mixture of fumed and colloidal silica with between 30% and 70% of the silica being colloidal being preferred. These formulations, i.e., dissolved ferric ions and hydrogen peroxide, are unstable, and ferric ions contaminate substrates.

Comparative Example 2 and Example 2B

A series of tests were performed to determine whether iron-coated silica performed better than a comparative example where ferric nitrate was added to a pad. We performed additional comparative experiments with iron nitrate solutions or iron nitrate impregnated into a polishing pad and using a periodic acid-containing slurry, and these experiments clearly showed a lower tungsten polishing rate suggesting that free iron ions were not very effective for W polishing. With iron, the best substrate removal rate using soluble ions was about 60% of the absorbed iron (Fenton's process) using periodic acid. Simply adding iron salts to a silica does not cause the iron to become associated with the silica. The presence or addition of silica to the a soluble iron salt/oxidizer system, the tungsten removal rates do not show appreciable increases. Further, the free iron catalyzes rapid decomposition of oxidizers, in particular hydrogen peroxide, such that commercial formulations of iron and oxidizer include chelator to prevent rapid decomposition of the hydrogen peroxide.

For all tests, the polishing system was a Speedfam IPEC 472 Polisher with a Rodel IC1000 k gooved/IV polishing pad, with 6 psi downforce, 0 psi backpressure, 110 rpm table speed and 70 rpm carrier speed, and finally with 150 ml slurry flow to polish a Sematech W blanket wafer. The slurry gross compositions were identical, each having 2% PIA and 3% silica. Comparative Example 2A (comparative) contained no ferric species, on a clean pad. In Example 2B the silica was coated with about 25% of outer surface area having a monolayer of absorbed iron (about 0.02% by weight of iron based on the weight of the slurry). In Comparative Example 2C the polishing pad soaked in 10% of ferric nitrate for 2 hours prior to use, as described in U.S. Pat. No. 6,383,065 B1 (ferric nitrate solution entered pad). In Comparative Example 2D, using the same pad as in 2C, with the pad then soaked in 10% of ferric nitrate for 24 hours, and then dried, and then conditioned, prior to use. The results are shown in Table 6, where polishing conditions were the same.

TABLE 6

|  | Tungsten RR | NU % |
| --- | --- | --- |
| Example 2A (comparative) | 2290 | 16.3 |
| Example 2B | 3430 | 7.9 |
| Example 2C (comparative) | 2270 | 15.3 |
| Example 2D (comparative) | 2070 | 15.3 |

The example of the current invention (example 2B) showed significantly greater removal rates and much better uniformity than any of the three comparative examples. The iron-coated-on-silica slurry activates the Fenton's reaction to give tungsten removal rate 3426 A and NU % of only 7.9%. Applying a fresh 10% ferric nitrate solution on the pad that was already "conditioned" with the very active iron-coated-on-silica slurry, and then polishing using the PIA/uncoated silica slurry, only provided a tungsten polishing rate of 2270 A with a high NU %. Apparently, at least for a system using periodic acid as the oxidizer, soluble ferric nitrate on a pad has little effect in terms of substrate removal rate, and soluble ferric ions need to be on the substrate to have any effect. These experiments show that the embodiments of U.S. Pat. No. 6,383,065 B1 were inoperable in PIA silica system.

Comparative Example 3

A known organic free radical initiator, Vazor® 44 WSP available from DuPont which is believed to be a hexanitrile compound, was added to give a concentration of 1% Vazor in an aqueous slurry containing 2% PIA and 0.16% iron-coated silica and 0.44% uncoated silica. Surprisingly, the addition of the organic free radical initiator significantly decreased the removal rate of tungsten, by as much as 75%, compared to the removal rate of tungsten using the same slurry but without the organic free radical initiator.

Example 4

We have surprisingly found that, unlike very low concentrations of soluble iron salts which are not effective or are very inefficient at concentrations below 20 ppm, very low concentrations of iron-coated silica are effective to substantially increase the removal rate of substrates. Two iron-coated silica slurries were prepared. The silica was colloidal silica with a size range of about 80 nm untreated, 100 nm iron-coated, and all particles fell within the preferred range of 50 to 150 nm in diameter. A trace amount of sulfuric acid was added to each slurry to adjust the pH. The polishing conditions were similar to example 1.

The first slurry used to polish tungsten/TEOS wafers contained 0.16% iron-coated silica, 0.44% uncoated silica, and 3% hydrogen peroxide. The 0.16% iron-coated silica had approximately 11 ppm of surface-bound iron compared to the weight of the slurry. The second slurry used to polish tungsten/TEOS wafers contained 1% iron-coated silica and 3% hydrogen peroxide. The 1% of iron-coated silica has about 66 ppm of surface-bound iron compared to the weight of the slurry.

In this specification, when the activator is expressed in parts per million, unless otherwise stated, this is the weight of the activator metal compared to the total weight of the polishing slurry. On the other hand, when the amount of activator-coated abrasive is specified, unless otherwise stated, this is the combined weight of the coated abrasive (which includes the weight of activator), and the value is generally expressed as percent by weight of the slurry.

Polishing rates on tungsten wafers were in the range of 3500 angstroms per minute to the first slurry and 5000 angstroms per minute for the second slurry. Oxide polished at about 300 angstroms per minute with the first slurry and 500 angstroms per minute with the second slurry. TEOS polished at a rate of 50 angstroms per minute with the first slurry and 400 angstroms per minute with the second slurry. The % NU was excellent and within commercially acceptable values. Additional tests were performed with slurries containing 0.32% and 0.64% by weight of iron coated silica (which corresponds to 21 to 43 ppm of surface-bound iron at point of use). Substrate removal values fell as predicted between those of the 0.16% and 1% iron coated silica experiments.

Example 5

The performance of the iron-coated silica is reproducible and is not overly wearing on equipment or disposables. A slurry having 2% PIA, 0.6% acetic acid, 0.95% TMAH, and 3% iron-coated silica (pH=3.5) was prepared. A number of wafers were tested, sequentially, using a Speedfam IPEC472 Polisher, with 6 psi down force pressure, 0 psi back pressure, 110 rpm table speed, 100 rpm carrier speed, and an 150 ml slurry flow over a 60 sec polishing time, with in-situ conditioning of a IC1000 K groove/Suba IV pad. Tungsten removal rate were about 4900 angstroms per minute with less than a 6% variation in the tungsten rate over a 26 wafer test, and the nonuniformity (NU %) was acceptable and showed only slight changes over the 26 wafer test.

Additionally, again unlike soluble iron salts which reach a maximum efficiency at 0.1% to 0.2% by weight, we have found that the iron-coated silica, using "typical" concentrations of oxidizer and abrasive, can increase rates to well beyond what is readily controllable. At concentrations of above 6%-10% hydrogen peroxide and 4%-6% iron-coated silica, tungsten removal rates ~10000 angstroms per minute or greater were measured.

Example 6

This example describes the preparation of boron surface-modified colloidal silica starting with colloidal silica particles having an average particle diameter of 40 to 55 nanometers. The procedure to prepare activator-coated silica advantageously starts with the preparation of de-ionized silica, followed by addition of surface-modifying stabilizer and/or activator salts, where some modifications of conditions may be necessary to make the activators and inorganic stabilizers adhere to the surface of the silica. Generally, when preparing the coated abrasives, additions of material are done slowly to avoid very high local concentrations of ingredients, as is taught by U.S. Pat. No. 3,922,393, the disclosure of which is incorporated herein by reference thereto. U.S. Pat. No. 3,922,393 describes a process of coating silica with alumina at high pH, while much of the coating of particles of the present invention is done at low pH which has the benefit of not requiring a large change in pH before adding activator salts to the slurry to prevent precipitation of activator salts as hydroxides.

Preparation of De-ionized Silica: Approximately 1 kg of AMBERLITE IR-120 ion exchange resin (available from Rohm and Haas Company, Philadelphia, Pa.) was washed with 1 liter of 20% aqueous sulfuric acid solution. The mixture was stirred and the resin was allowed to settle. The aqueous layer was decanted and washed with 10 liters of deionized water. The mixture was again allowed to settle and then the aqueous layer was decanted. This procedure was repeated until the decanted water was colorless. This procedure afforded an acidic form of resin. Then, 12 kg of SYTON® HT 50 (a potassium hydroxide-stabilized colloidal silica (available from DuPont Air Products NanoMaterials L.L.C., Carlsbad, Calif.) was placed in a five-gallon mix tank equipped with an agitator. 2.502 kg of deionized water were added to the tank and the solution was allowed to mix a few minutes. The pH of the solution was measured to be approximately 10.2. With continued pH monitoring, aliquots of the previously-prepared acid-state resin were added, while allowing the pH to stabilize in between additions, until the stable pH had dropped to pH 1.90-2.20. Once this pH limit had been reached and was stable in this range, no further resin additions were made and the mixture was stirred for 1-1.5 hours. At this time, it is preferred to add stabilizers, activators, or both, in any order, to the deionized silica.

Step 1: Adding Boron-Containing Stabilizer to Surface of Silica: The above-prepared mixture was passed through a 500-mesh screen to remove the resin and afforded deionized SYTON HT 50 at pH ~2. A solution of 268 g of boric acid powder (Fisher Scientific, 2000 Park Lane, Pittsburgh, Pa., 15275) in 5.55 kg of deionized water was prepared in a 10 gallon mixing tank equipped with an agitator and a heater by slowly adding the boric acid powder until all had been added to the water and then agitating the mixture for 15 hours and increasing the temperature of the mixture to 55-65° C. The deionized and wetted SYTON HT 50 (12 kg silica and 2.5 kg water at pH 2) was then added to the boric acid solution slowly over about 1.2 hours by adding it at approximately 200 ml/minute and maintaining the temperature greater than 52° C. while agitating the mixture. After this addition was completed, heating at 60° C. and agitation of the mixture were continued for 5.5 hours. While not done here, heating to higher temperatures such as from 60° C. to 100° C., for example from 85° C. to 100° C., may provide a composition exhibiting even greater stability. The resulting solution was subsequently filtered through a 1-micron filter to afford boron surface-modified colloidal silica.

This boron surface-modified colloidal silica was characterized for colloid stability over 15 days using a Colloidal Dynamics instrument (11-Knight Street, Building E8, Warwick, R.I., 02886), and was found to exhibit both constant pH (pH approximately 6.6) and zeta potential (zeta potential approximately −58 millivolts) over the 15-day test period. The percentage of surface sites of this surface-modified colloidal silica occupied by boron-containing compound(s) was approximately 98%.

Step 2: Reaction of Boron-modified Sol with Ferric Nitrate: An aliquot (~1000 grams) of wet boron-modified silica from Step 1 was transferred to a 4-liter beaker. Under agitation, 5.1 grams of ferric nitrate (1.2 grams iron) were added to the boron-modified silica. The mixture was heated between 45° to 50° C. for 2 hours and 50 minutes. Again, heating to higher temperatures may provide greater degree of absorption of iron onto the silica, or shorten the time required for absorption, or both. After heating the mixture, the dispersion was cooled. The zeta-potential changed from 58 millivolts to +10.2 millivolts, indicating addition of the iron to the surface of the particle. The pH of the slurry was measured as 2.09.

The ready addition of the iron to the surface of the particles was surprising. This provided a surface modified hybrid bimetallic (B/Fe) sol having about 1.2 grams (0.02 moles) of ferric ions, 22 grams (0.356 moles as $H_3BO_3$) of boric acid, and ~1000 grams (16.64 moles) of silica. Since we had determined that the first treatment with the boric acid stabilizer covered about 98% of the surface area, we would have expected less than 0.01 moles of ferric ions to be absorbable directly onto the remaining silica (assuming parity of size of the boric acid stabilizer and ferric ion activator). Since more than twice this much iron was readily absorbed onto the surface-modified silica, we concluded that at least a portion of the iron was bound to the boron-containing stabilizer as opposed to being bound directly on the silica. Significantly, the silica contained ~2.4% by weight of surface-modifying components, based on the weight of the modified silica.

Example 7

It is not necessary to add the boric acid stabilizer before adding the iron nitrate activator to de-ionized silica. Additionally, the amounts of iron and boric acid can be varied over a large range. In this procedure, deionized SYTON HT 50 at pH 2 (600 grams, supplied by DuPont Air Products NanoMaterials L.L.C.), prepared as described in Example 3, was transferred to a 4-liter beaker. Under agitation, 400 grams of deionized water were added, followed by the addition of a mixture of boric acid (12 grams) and ferric nitrate (10.1 grams). Recall that ~2.25 grams of boric acid will occupy substantially all of the surface sites on 100 grams of deionized SYTON HT 50, so the percentage of surface sites estimated to be covered by stabilizer was ~89%. After the addition of boric acid and ferric nitrate, an additional 278 grams of water were added. The mixture was heated between 45 and 50° C. for 2.5 hours. After heating, the mixture was cooled, the pH was 1.67, and the zeta potential was +16.4 millivolts. The 600 grams (10 moles) of silica had the surface thereof modified by 12 grams (0.2 moles) boric acid and 2.3 grams (0.04 moles) of the Fe ion. The molar ratio of iron to silica was 0.04:10 and the molar ratio of iron to boric acid was 0.04:0.2 or about 1:5.

Example 8

In this example, a slurry such as was described in Example 6 was prepared using boron-iron-modified silica using a molar ratio of iron to silica of 1:4 (0.25) and a molar ratio of iron to boric acid of 1:4.3 (0.23). The pH of the surface modified was 2.11, and the zeta potential was +25.2 millivolts. This example shows that the pH and zeta potential can be controlled by changing the concentration of ferric nitrate or boric acid.

Example 9

Other stabilizers are also useful. Deionized SYTON HT 50 was prepared in accordance with Example 1. 10.1 grams (~0.04 moles) of ferric nitrate were added to the deionized SYTON HT 50 (600 grams, pH=1.9 to 2.1). The mixture was heated for 1 hour at 50° C. In a separate beaker, 300 grams of deionized water were charged, and kept under agitation. To this water solution, sodium tungstate (10.9 grams, ~0.03 to 0.04) was added under agitation during a period of 10 minutes. This solution had a pH of 7.14. After completing the addition of sodium tungstate to the deionized water, 5 grams of 70% nitric acid were added to adjust the pH to 5.02. The mixture was stirred at room temperature for an additional 10 minutes. The tungstate solution was then added to the iron-modified silica particles, and stirred for an additional 2 hours. Note that there are about the same number of nmoles of tungstate as there are ferric ions on the silica, and that the ferric ions were added before adding the tungstate, both of which we believe may contribute to reduced activity of the composite. The pH was 6.13.

Example 10

Polishing Experiments

In Table 4, polishing compositions are tabulated. The polishing composition in comparative Example 10-A was prepared using boron-modified silica (no activator) and the preparation method of Example 6 (Step 1). The polishing composition in Example 10-B was prepared using bimetallic "boron-iron" modified silica and the preparation method of Example 6 (Steps 1 and 2). The polishing composition in Example 10-C was prepared using "iron-tungsten" modified silica and the preparation method of Example 7. The polishing composition in comparative Example 10-D was prepared using boron-modified silica, the preparation method of Example 1 (Step 1), and soluble iron catalyst. A portion of the soluble iron catalyst may have absorbed onto the boron stabilized silica. The polishing composition in Example 10-E was prepared using "boron-iron" modified silica of Example 8 and the preparation method of Example 6 (Step 2). The polishing compositions were used to polish CVD tungsten blanket wafers and PETEOS blanket wafers (PETEOS, plasma enhanced tetraethoxy silane, dielectric oxide layer) using a polishing tool. The blanket wafers were purchased from Silicon Valley Microelectronics, 1150 Campbell Ave CA 95126. The PETEOS wafers had a film thickness specification of 15,000 Å PETEOS. The CVD tungsten wafers had film stack thickness specifications of 8000 Å CVD tungsten/ 250 Å titanium/6300 Å thermal oxide. A SpeedFam IPEC, model 472 (manufactured by SpeedFam IPEC, 305 North 54th street, Chandler, Ariz. 85226), polishing machine was used with conditions set as follows: Down force=7 psi (pounds per square inch); Flow rate of polishing composition=170 ml/min (milliliters per minute); Back pressure=0.5 psi; Carrier speed=35 psi; Platen speed=40 revolutions per minute (RPM). The substrate was effectively planarized using the above polishing composition under the stated conditions. The polishing data is presented in Table 7.

TABLE 7

| TABLE asd | EX. 10-A (comparative) | EX. 10-B | EX. 10-C | EX. 10-D (comparative) | EX 10-E |
|---|---|---|---|---|---|
| Notes | Boron modified SYTON HT 50 (control) | SYTON HT 50 with modified $H_3BO_3$—Fe—, bimetallic surface | SYTON HT 50 with modified Fe-tungstate, bimetallic surface | Boron modified SYTON HT 50 with soluble ferric nitrate as soluble catalyst (35 ppm) | SYTON HT 50 with modified $H_3BO_3$—Fe—, bimetallic surface |
| pH | 2.8 | 2.8 | 2.8 | 2.8 | 2.8 |
| Silica | 180 gram | 180 grams | 180 grams | 180 grams | 180 grams |
| Activator (ppm) | — | 0.2 grams Fe | 0.7 grams Fe | — | 0.7 grams Fe |
| Stabilizer (ppm) | 4 grams $BO_3$ | 4 grams $BO_3^{-3}$ | 2.6 grams $WO_4^{-2}$ | 4 grams $BO_3$ | 3.5 gms $BO_3^{-3}$ |
| Water | 3249 grams | 3249 grams | 3249 grams | 3249 grams | 3249 grams |
| $H_2O_2$ (30%) | 400 grams | 400 grams | 400 grams | 400 grams | 400 grams |

TABLE 7-continued

| TABLE asd | EX. 10-A (comparative) | EX. 10-B | EX. 10-C | EX. 10-D (comparative) | EX 10-E |
|---|---|---|---|---|---|
| Tungsten removal rate | 427 Å/min | 3880 Å/min | 2655 Å/min | 2049 Å/min | 2751 Å/min |
| PETEOS removal rate | 85 Å/min | 217 Å/min | 87 Å/min | 83 Å/min | 91 Å/min |
| Selectivity (W-RR/ PETEOS-RR) | 5 | 18 | 31 | 25 | 30 |

Clearly the method of preparation of the activator iron-stabilizer modified silica had a resultant effect on the polishing rates. The highest tungsten removal rate was observed on the polishing system of Example 10-B (Example 6), wherein it is believed that most or all of the iron activator was bonded to a borate-based stabilizer which was in turn bonded to the silica surface. This is the case despite example 10-B having less activator than either 10-C or 10-E, suggesting that the use of stabilizer-addition to near saturation of the available surface sites before adding the activator, and/or the use of boron-based activator prior to adding activator, seems to provide a synergistic effect. While greater amounts of Fe activator were present in Examples 10-C and 10-E, a portion or most of the iron is believed to be bonded directly to the silica, and the stabilizer may in part be shielding the activator. Additionally, it appears that the high rates of Example 10-B are accompanied by a small decrease in the tungsten:PETEOS selectivity, from about 30 to just under 18.

It is not known whether, or to what extent, the soluble ferric nitrate added in Example 10-D subsequently was absorbed onto the boric acid-surface-modified silica.

Tungstate-stabilized iron-coated silica also appears to be less effective in promoting increased tungsten removal rate than does the boric acid-stabilized iron coated silica.

Example 11

A slurry was prepared containing 4% peroxide, 1.25% 130 nm silica, and 0.3% of 80 nm coated silica, and variable amounts of lactic acid. This slurry was used to polish tungsten using the following polishing parameters: down force 5 psi, back pressure 2.5 psi, Ring pressure 5.5 psi, Table rotation 110 RPM, Carrier rotation 105 RPM, 150 ml/min slurry flow, using Strasbaugh 6EC polisher, Rodel IC1000/SUBA IV pad, and Rodel DF200 Carrier film, pH adjusted to 3.4 with ammonium hydroxide. The polishing results of sequential tests using the same polishing pad are shown below.

| Lactic acid | Angstroms/min |
|---|---|
| 0 | 4060 |
| 0.1% | 4300 |
| 0.3% | 4380 |
| 0.5% | 3710 |

It can be seen that a small amount of lactic acid, tat is, from about 0.1% to about 0.3% by weight, can advantageously improve the tungsten removal rate. Too much lactic acid, however, and the tungsten removal rate drops. Therefore, it is beneficial to use a chelator in an amount between about 0.01% to about 1%, but better results are obtained if the chelator is present in an amount between about 0.05% and 0.5%, for example between about 0.1% and 0.3%. Under the conditions of the above-described test, using an 8 inch wafer, a slurry flow rate of 150 ml/minute, and a polishing rate of about 4300 angstroms per minute of tungsten, a lactic acid concentration of 0.1% by weight will provide about 0.8 to 0.9 moles lactic acid per mole of tungsten polished. For chelators that can chelate one metal atom or complex, it appears advantageous to have between 0.5 moles and 4 moles, for example from 0.8 moles to 3 mole, or alternatively from about 1 mole to about 2.7 moles, of chelator per mole of metal being removed from the substrate. While a small amount of chelator can be useful, after a certain point addition of more lactic acid results in decreasing tungsten removal rate, probably due to a combination of lactic acid forming a film over the tungsten, free radical quenching effects, or both.

Example 12

We have experimentally found that tungsten wafers polished with commercially available ferric nitrate/oxidizer/abrasive CMP formulations leave iron residues on the wafer at amounts between $100 \times 10^{+10}$ Atoms/cm$^2$ to $200 \times 10+^{10}$ Atoms/cm$^2$ even after post-CMP cleaning and rinsing. Certain preferred systems of the current invention, in which iron is bound to silica, leave iron residues on the wafer at less than about $10 \times 10^{+10}$ Atoms/cm$^2$ or less after post-CMP cleaning and rinsing. There is a strong desire to further minimize metallic contamination of the substrate by metal ions, including but not limited to the metal ion activators which become detached from the surface of a particle, metal ions polished from the substrate surface, as well as metal ion contamination from other sources.

The purpose of this Example was to show the efficiency for reducing Fe-contamination on wafer surface after Tungsten CMP of (i) CMP3600™ (CMP3600™ is a commercially available slurry from DuPont Air Products NanoMaterials L.L.C., Tempe, Ariz., developed at DuPont-EKC Technologies) versus (ii) formulations derived from the addition of organic additives to CMP3600™. The CMP3600™ is a "conventional" ferric ion-coated silica. The formulation modifications of CMP3600™ are the inclusion of organic additives to reduce the Fe contamination level on the wafer; after W CMP and standard post CMP cleaning with dilute ammonia solution. A previous screening effort had shown lactic acid and ascorbic acid are more efficient at reducing trace Fe contamination on the wafer surface post CMP than other chelators tested.

The aqueous slurry contained about 0.5% CMP3600™ and about 4% hydrogen peroxide. Polishing tests were performed using an Ebara EPO222D™ Polish Tool, a Rigaku TXRF Measurement Tools (at 3 pts: 0,0; 0,50 and −50,0), a KLA Tencor SP1 (10 mm E), 4 Dimension 4 point probe: 49 pt line and KLA Tencor F5x: 49 pt line. The following table 8 compares the results. Note that the values in the table below are measured prior to post-CMP cleaning and rinsing with a dilute ammonia solution.

TABLE 8

Iron Contamination After CMP With Iron Coated Silica followed by Rinsing, With No Post-CMP Cleaning]

| Additive | % Additive | Iron On Wafer After CMP ($\times 10^{+10}$ Atoms/cm$^2$) | W Removal Rate (Å/min) |
|---|---|---|---|
| None | 0 | 377 | 4010 |
| Lactic Acid | 0.14 | 62 | 4980 |
| Lactic Acid | 0.28 | 39 | 5370 |
| Lactic Acid | 0.42 | 30 | 5280 |
| Ascorbic Acid | 0.01 | 357 | 4580 |
| Ascorbic Acid | 0.04 | 94 | 4150 |

From the results given in the table above, it is obvious that the addition of lactic and ascorbic acids to CMP3600™ would result in the desired reduction in Fe contamination of the wafer surface after performing W CMP and standard post CMP cleaning with dilute ammonia solution.

Indeed, as shown in the previous example, addition of lactic acid (at least to amounts less than 0.5%) showed substantial increases in tungsten removal rate. The use of ascorbic acid gave similar results, though there was less of an increase in the tungsten removal rate and the rate of removal starts rapidly declining with the addition of increasing amounts of ascorbic acid. Ascorbic acid is, between the two, more effective both on a weight percent basis and on a molar basis. The addition of lactic acid, in amounts varying between 0.14% and 0.42%, significantly increased the tungsten removal rate. The decline in tungsten removal rate with the further addition of ascorbic acid is problematic, but the reduction in Fe contamination did not decrease the W removal rate to any rate below the control rate (with no organic acid added).

The use of lower concentrations of activator in the slurry, the presence of stabilizers on the abrasive, and the presence of a,b-dihydroxy enolic compounds such as ascorbic acid in the fluid, can greatly reduce this iron contamination. Additionally, conditioning the activator-coated abrasive, for example by storage in dilute (~200-2000 ppm) aqueous ascorbic acid for a time between an hour and days, followed by separation and removal of the aqueous composition, can provide a activator-coated abrasive that is less likely to leave activator metal atoms on the surface of the substrate. Additionally, exposing an aqueous slurry of activator-coated abrasive to an elevated temperature, say between about 70° C. and 120° C., more typically from 80° C. and 100° C., for a period of time can provide a activator-coated abrasive that is less likely to leave activator metal atoms on the surface of the substrate.

Example 13

We have found that a number of chelators, particularly lactic acid, citric acid, and the like, are useful for minimizing contamination from each of metal ion activators which become detached from the surface of a particle, metal ions polished from the substrate surface, as well as metal ion contamination from other sources. On the other hand, alpha-, beta-dihydroxy enolic compounds (enolic metal chelators with two hydroxyl attached to an olefinic double bond, the most commercially available of which include ascorbic acid, erythorbic acid, and derivatives and/or mixtures thereof. Useful derivatives of ascorbic acid and erythorbic acid are soluble (to the extent they are present in solution, which is typically below 5000 ppm) and do not hinder the action of the dihydroxy enolic functunality. Exemplary derivatives include ascorbic palmitate and erythorbic palmitate. These alpha-, beta-dihydroxy enolic compounds have been found not only to prevent deposition of metal ions on the surface of the substrate, but are also believed to actively and efficiently strip metal ions absorbed onto the surface of the substrate, which is typically silica or a low-k silicon-containing material. This leads to a problem in that most activators are metal ions absorbed on the abrasive, which is typically silica, and dihydroxy enolic compounds can under certain situations strip activator from the surface of an abrasive particle and solubilize same. We have found that such complexed activator is still useful in increasing substrate (e.g., tungsten) removal rates during CMP, possibly to a greater extent than does "simple" metal ion complexes such as provided by ferric nitrate, but the increase in substrate removal rate is less than if the activator were attached to the abrasive surface.

In the absence of alpha-, beta-dihydroxy enolic compounds, most activator is absorbed on the surface of an abrasive. A boron modified silica was prepared using a procedure as described previously in Example 6. The boron modified silica was treated to absorb or bond 7 ppm of ferric ion (based on the weight of the slurry) on the boron modified silica and the pH was adjusted to at pH=3.5. The "boron-ferric" ion modified silica dispersion was centrifuged to separate the abrasive particles. Using ICPMS, "NO" detectable iron (e.g., less than 0.1 ppm) was detected in the solution phase. This suggests immobilization of ferric ion on the boron coated silica at pH=3.5.

The ferric ion coated silica was mixed with 100 ppm of ascorbic acid at pH=3.5. The addition of ascorbic acid eventually stripped most of the 7 ppm ferric ion from the silica surface.

We found there was a strong effect of pH on the stripping efficiency of ascorbic acid in the slurry formulation. At pH=2.5, the water having 100 ppm ascorbic acid stripped all of 7 ppm ferric ion from the silica surface. At pH=3.5, the water having 100 ppm ascorbic acid stripped substantially all of 7 ppm ferric ion from the silica surface.

A boric acid surface-modified silica was surface modified with 7.6 ppm of iron, and the slurry was adjusted to pH 4.0 after addition of 200 ppm of ascorbic acid. Subsequent analysis showed 5.7 ppm Fe in solution, implying about 1.9 ppm of the iron remained absorbed on the surface of the abrasive and acts as an activator. At pH about 6 or above, the ascorbic acid strips only a minor amount of the iron activator from silica. At pH 6, a slurry having 100 ppm ascorbic acid stripped only 2.4 ppm ferric ion (about one third) of the original 7.6 ppm of iron from the silica surface of a slurry, leaving about 5 ppm (by weight of the slurry) of iron disposed on the surface of the abrasive. A boric acid modified silica was surface coated with 5.6 ppm of iron, and held at pH 6.5 in an aqueous slurry having 100 ppp ascorbic acid, and only 0.14 ppm iron was subsequently found in the aqueous phase. An independent test at an outside testing agency found only 0.15 ppm of the 5.6 ppm of iron originally present as activator disposed on the surface of abrasive to be solubilized by water at pH 6.5 having 100 ppp ascorbic acid.

We have found that that alkyne diols, such as found for example in Surfynol 104E (commercially available from Air Products) forms a complex with soluble iron, and the "Fe-alkyne complexe" increased tungsten removal rates in a slurry comprising hydrogen peroxide. We believe that the "Fe-alkyne complexes" may be more effective than soluble iron, for example as provided by dilute ferric nitrate, when present in a polishing slurry having a peroxide oxidizer, at increasing the substrate removal rates. That is, the effectiveness at increasing the tungsten removal rate during polishing may be between that of activator iron and that of soluble iron nitrate promoters. A boric acid-modified silica was surface coated with 7.6 ppm of iron, and held in an aqueous slurry comprising 100 ppm ascorbic acid and 200 ppm of Surfynol 104E at a pH of 6.5. Subsequent analysis showed that 1.5 ppm of the 7.6 ppm of iron was stripped from the boric acid-surface-modified silica and was solubilized by the ascorbic acid and/or Surfynol 104E.

Further, we found that the pH apparently had a effect on polishing rates. Using a slurry to polish a tungsten-coated wafer, under conditions similar to those described for Example 10, gave the results in Table 9.

TABLE 9

| Total Fe, ppm based on the wt of the slurry | pH | Tungsten Removal (angstroms/min) |
| --- | --- | --- |
| 4.6 | 3.5 | 2900 |
| 6.6 | 3.5 | 2700 |
| 6.6 | 6 | 3120 |
| 6.6 | 2.5 | 3550 |

We had earlier shown that low pH, e.g., pH between 2.5 and 3.5, was preferred in a system using iron-activator-coated silica and a per-type oxidizer, which we attributed to the higher solubility of the tungsten by-products polished from the surface of the substrate. We then found that high polishing rates could be achieved at more neutral pH, e.g., between 4 and 7, preferably between 4 and 6, in the presence of appropriate chelators. We now found that, due to the propensity of ascorbic acid (and presumably other di-hydroxy enol compounds) to strip iron activator from silica, we have found that a preferred pH range for polishing tungsten is about 6 to about 7, preferably from about 6 to about 6.5. Based on the above data, from the standpoint of tungsten removal rates pH=6 appears to perform better than pH=3.5. Interestingly 4.6 ppm seem to have about the same tungsten removal rates as 6.6 ppm ferric ion at pH=3.5.

Example 14

A slurry was prepared containing 4% hydrogen peroxide, 1.25% 130 nm uncoated silica, and variable (X) amounts of 80 nm coated silica. This slurry was used to polish tungsten using the following polishing parameters: down force 5 psi, back pressure 2.5 psi, Ring pressure 5.5 psi, Table rotation 110 RPM, Carrier rotation 105 RPM, 150 ml/min slurry flow, using Strasbaugh 6EC polisher, Rodel IC1000/SUBA IV pad, and Rodel DF200 Carrier film. Tungsten removal rates are shown below.

| Activator-coated Silica | Angstroms/min | Delta from 0% (A/min/0.1%) |
| --- | --- | --- |
| 0 | 980 | |
| 0.1 | 2910 | 1930 |
| 0.2 | 3740 | 1380 |
| 0.4 | 3800 | 705 |
| 0.8 | 7070 | 760 |

The coated silica was extremely effective at very low concentrations. We believe that even as little as 0.01% iron-coated silica would be economically significant in terms of increasing the polishing rate of tungsten. Further, while the greatest gains in substrate removal rate per unit quantity of activator-coated abrasive added to a polishing composition are observed at the lowest quantities of activator-coated abrasive, there is no apparent "leveling off" of the substrate removal rates with addition of grater amounts of activator-coated abrasive.

Another slurry was prepared containing 4% peroxide, 1.25% 130 nm silica, and variable amounts of 80 nm coated silica. This slurry was used to polish tungsten using the following polishing parameters: down force 5 psi, back pressure 2.5 psi, Ring pressure 5.5 psi, Table rotation 110 RPM, Carrier rotation 105 RPM, 150 ml/min slurry flow, using Strasbaugh 6EC polisher, Rodel IC1000/SUBA IV pad, and Rodel DF200 Carrier film. The polishing results of sequential tests using the same polishing pad are shown below.

| Activator-coated Silica | Angstroms/min |
| --- | --- |
| 0.3% | 4500 |
| 0.8% | 6550 |
| 0.6% | 5980 |
| 0.3% | 4060 |

Clearly, there is increasingly little benefit in adding greater quantities of iron coated silica, but there are down sides in having too much iron coated silica, particularly decreased shelf life and cost. The amount of activator-coated abrasive rarely should exceed 3%, and it should normally fall within a range between 0.1% and 1% by weight of the slurry.

Example 15 and Comparative Examples

The following series of tests were performed to show that iron coated onto a colloidal silica, in the presence of hydrogen peroxide, will have a higher tungsten removal rate than either free iron ($Fe^{+3}$) or iron oxide ($Fe_2O_3$) in the presence of colloidal silica and hydrogen peroxide. The following table 10 shows tungsten removal rates (in angstroms per minute) with wafers run at 5 psi downforce, 0 psi backpressure, 90 rpm carrier speed, 90 rpm table speed, and 175 ml/min slurry flow. The slurry for all the wafers run was 2.5% colloidal silica and 5% hydrogen peroxide. Samples 15A, 15C, 15D, and 15E are comparative examples as they has no iron-coated silica. The examples 15B, 15F, and 15G had only small amounts of iron coated silica, sufficient to give 0nly 3 to 4 ppm of iron to the slurry.

TABLE 10

| | Iron Coated onto Silica (as ppm Fe) | Iron Oxide (as ppm Fe) | Soluble $Fe(NO_3)_3$ (as ppm Fe) | Tungsten RR |
| --- | --- | --- | --- | --- |
| 15A(comp) | 0 | 0 | 0 | 570 |
| 15B | 3.3 | 0 | 0 | 2700 |
| 15C | 0 | 20 | 0 | 2390 |
| 15D(comp) | 0 | 0 | 20 | 3930 |
| 15E(comp) | 0 | 0 | 5 | 1460 |
| 15F | 3.3 | 20 | 0 | 3090 |
| 15G | 3.3 | 0 | 20 | 4320 |

Results show that as surface bound iron, 3.3 ppm gives a 2130 angstroms per minute increase over the removal rate of a system with no iron. In contrast, 5 ppm soluble iron gives a 900 angstroms per minute increase over the removal rate of a system with no iron, and 20 ppm soluble iron gives only a 3350 angstroms per minute increase in tungsten removal rate (about the amount expected from 6-7 ppm activator iron).

The Examples 15B, 15F, and 15G systems had very low amounts (~3 ppm) of activator iron. It was not surprising that addition of soluble ferric ions provided further increases in the tungsten removal rate. While addition of soluble iron improves removal rate, the effect tops out at a fairly low concentration of iron, the iron ions contaminate the substrate, and the iron ions degrade the oxidizer (giving short shelf life).

Surprisingly, 20 finely powdered iron oxide showed substantial activity, giving an increase in removal rate (~1800 angstroms per minute) that is within a factor of two of the increase seen with comparable amounts of soluble iron. The inclusion of iron oxide to a system, in amounts to provide between about 5 ppm iron and 500 ppm, for example between about 10 ppm and about 50 ppm as iron based on the weight of the slurry, are useful to promote the tungsten removal rate. Iron oxide combined with iron-coated silica gives a modest increase in rate over the iron-coated silica itself, though greater increases can be achieved by adding the extra iron as additional iron-coated particles, i.e., iron coated silica-containing particles. The addition of 3.3 ppm iron coated silica to the slurry of 6 C gave a 700 angstroms per minute increase in rate.

In the previous example, we observed that adding either soluble iron nitrate or iron oxide, in the range between about 5 ppm to about 20 ppm, to a slurry containing only 3 to 4 ppm iron coated on silica provided significant increases in the tungsten removal rate. At higher activator iron concentrations the effect of soluble iron becomes insignificant. The following data shows the effects of additional free iron on tungsten and TEOS removal rates when it was added to an iron coated silica slurry having 49 ppm activator iron coated on silica. The data in the table below were all performed at the same process parameters: 5 psi and 0 psi backpressure, at 90 rpm table and 90 rpm carrier rotation, with 175 ml/min slurry. All of the tests used 0.64% iron coated silica and 5% hydrogen peroxide and the pH about 2.5. The removal rate is in Table 11, again, in angstroms per minute.

TABLE 11

| | Fe-coated silica (as ppm Fe) | Soluble Fe (as ppm Fe) | Tungsten RR | TEOS RR |
|---|---|---|---|---|
| 15H | 49 | 2.4 | 2900 | 274 |
| 15I | 49 | 7.4 | 3000 | 283 |
| 15J | 49 | 12.4 | 3100 | 256 |

Sample 15H had no added iron nitrate or iron sulfate, so the 2.4 ppm of soluble iron was believed to be residual from the preparation of the iron-coated silica. Samples 15I and 15J had iron sulfate added after the slurry comprising the iron-coated silica was prepared. Results show that modest amounts of soluble iron (up to 15 ppm, probably up to 20 ppm) have little effect on the tungsten and TEOS removal rates.

Similar experiments were run where the iron was added as $Fe_2O_3$. It is anticipated that at the low pH, the iron oxides may partially or completely dissolve. The results in Table 12, again, show no significant increase in polishing rate.

TABLE 12

| | EXAMPLE 16 | | | |
|---|---|---|---|---|
| | Fe-coated silica (as ppm Fe) | $Fe_2O_3$ (as ppm Fe) | Tungsten RR | TEOS RR |
| 15K | 49 | 2.4 | 2880 | 274 |
| 15L | 49 | 7.4 | 2880 | 278 |
| 15M | 49 | 12.4 | 2820 | 264 |

A conventional iron-activator ion was placed on silica. The abrasive used was Mirasol 3070™, hereafter "Mirasol", a commercially available aqueous solution of abrasive silica particles. Mirasol, commercially available from Precision Colloids, LLC of Cartersville, Ga., contains approximately 30 weight percent silica ($SiO_2$) particles, which generally have an effective diameter of approximately 70 nanometers. Mirasol 3070 coated with activator contains the above-described Mirasol with for example iron acetate activator coated/absorbed onto at least a portion of the surface of the silica particles, i.e., on about 70 percent of the surface area of each silica particle. Mirasol having as an activator, i.e., cationic iron is hereafter Mirasol/Fe—Ac, or copper which is hereafter Mirasol/Cu—Ac, provided the activator. Generally, the compounds that form free radicals at an accelerated rate when contacted by either the iron activator or the copper activator (or both) include hydrogen peroxide ($H_2O_2$), persulfate, periodic acid, and/or peracetic acid. Unless otherwise specified, water formed the balance of the slurries.

A first example concerns two CMP compositions, Example 16A with 3% $H_2O_2$ and Example 16B with 5% peracetic acid, both at pH 2, which are particularly suited to CMP of a wafer, such as a silicon wafer, having a tungsten layer or feature on its surface. The components of the two compositions and the approximate amounts thereof, as well as the approximate pH of the compositions, are set forth in Table 13.

TABLE 13

| CMP Slurry Compositions for Example 16A and Example 16B | | | | |
|---|---|---|---|---|
| | $H_2O_2$ | Peracetic Acid | Mirasol | Mirasol w/ Fe—Ac |
| Example 16A | 3 wt. % | 0 wt. % | 5 wt. % | 0.5 wt. % |
| Example 16B | 0 wt. % | 5 wt. % | 5 wt. % | 0.5 wt. % |

Each of the Example 16A and 16B were used in a conventional CMP process performed on a silicon substrate at least partially layered with a tungsten film of about 8000 Angstroms (A) in thickness. The process parameters for both included a carrier pressure of about 6 pounds per square inch (psi), a carrier speed of about 90 revolutions per minute (rpm), a platen speed of about 90 rpm, and a flow rate for the CMP composition used of about 175 milliliters per minute (ml/min). The processes differed only in terms of which CMP composition was used. The results of each CMP process in terms of the approximate material (tungsten) removal rate in Angstroms per minute (A/mm) and the approximate within-wafer nonuniformity percentage (% WIWNU) are set forth in Table 14.

TABLE 14

CMP Results on Tungsten Using Example 16A or Example 16B

|  | Removal Rate (A/mm) | Nonuniformity (% WIWNU) |
| --- | --- | --- |
| Example 16A | 5040 | 10.9 |
| Example 16B | 5077 | 7.42 |

Both the sample with 3% hydrogen peroxide and the sample with 5% peracetic acid had about the same tungsten removal rates, which is not surprising because the moles of oxidizer per liter of slurry was within 20% of one another. As mentioned previously, in CMP processes, and particularly modern or advanced CMP processes, it is desirable to obtain acceptable or optimal, such as increased, material removal rates while using acceptable or optimal, such as not unduly high, carrier pressures. In the CMP of tungsten-layered wafers, a good carrier pressure is about 9 psi or less, such as about 6 psi, and a good outcome at a pressure of about 6 psi is a removal rate of greater than about 5000 A/mm. Further, obtaining polished wafers with uniformity values of from about 3 to about 12% WLWNM percent is considered a good result. While the foregoing examples of process parameters, outcomes and results are often desirable, other suitable outcomes and results are contemplated herein.

In the CMP processes performed with Example 16A and Example 16B, desirable tungsten removal rates of about 5040 and 5077 A/mm, respectively, were obtained. Additionally, the surfaces of the polished wafers were substantially uniform, having 10.9 and 7.42% WIWNU, respectively. Example 16B is generally preferred over Example 16A, given its higher removal rate and better uniformity value (lower % WIWNU). It should be noted that while there is a general preference for compositions that provide high removal rates, other factors, such as good uniformity values (for example, low % WIWNU), efficient use of oxidizer, and good storage and handling characteristics, are also important considerations in the evaluation of a composition of the present invention.

A second example of the composition of the present invention concerns two CMP compositions, Example 16C and Example 16D, which were used in the CMP of a silicon wafer that had a copper layer or feature on its surface. In this example, the copper layer had a thickness of about 15,000 A. The oxidizer in Example 16C was 1.5% peracetic acid and in Example 16D was hydroxylamine (commercially available in an aqueous composition as HDA®, EKC Technology, Inc.). Hydroxylamine is not generally considered a per-type oxidizer, and Fenton-type reactions with hydroxylamine are not generally known. The two compositions also differed in terms of pH, Composition C having a pH of about 2 and Composition D having a pH of about 6.7. The components of the two compositions and the approximate amounts thereof, as well as the approximate pH of the compositions, are set forth in Table 15.

TABLE 15

CMP Slurry Compositions for Example 16C and Example 16D

|  | HDA ® | Peracetic Acid | Mirasol | Mirasol w/Fe—Ac | pH |
| --- | --- | --- | --- | --- | --- |
| Example 16C | 0 wt. % | 1.5 wt. % | 5 wt. % | 0.5 wt. % | 2 |
| Example 16D | 4 wt. % | 0 wt. % | 5 wt. % | 0.5 wt. % | 6.7 |

Each of the Examples 16C and 16D were used in a conventional CMP process performed on a silicon wafer at least partially layered with copper. When Example 16C was polished, the process parameters included a carrier pressure of about 4 psi, a carrier speed of about 40 rpm, a platen speed of about 40 rpm, and a flow rate for the Example 16C of about 100 ml/min. When Example 16D was polished, the process parameters included a carrier pressure of about 4 psi, a carrier speed of about 75 rpm, a platen speed of about 75 rpm, and a flow rate for the Example 16D of about 175 ml/mm. The parameters of each CMP process are set forth in Table 16 and the results thereof in terms of the approximate material (copper) removal rate and the approximate within-wafer nonuniformity percentage are set forth in Table 17.

TABLE 16

CMP Process Using Example 16C or Example 16D

|  | Carrier Pressure (psi) | Carrier Speed (rpm) | Platen Speed (rpm) | Flow Rate (ml/min) |
| --- | --- | --- | --- | --- |
| Example 16C | 4 | 40 | 40 | 100 |
| Example 16D | 4 | 75 | 75 | 175 |

TABLE 17

CMP Results on Copper Using Example 16C or Example 16D

|  | Removal Rate (A/mm) | Nonuniformity (% WIWNU) |
| --- | --- | --- |
| Example 16C | ~15,000 | Not measurable |
| Example 16D | 7,800 | 8.87 |

As mentioned previously, in CMP processes, and particularly modern or advanced CMI processes, it is desirable to obtain acceptable or optimal, such as increased, material removal rates while using acceptable or optimal, such as not unduly high, carrier pressures. In the CMP of copper-layered wafers, a good carrier pressure is about 6 psi or less, such as about 4 psi, and a good outcome at a pressure of about 4 psi is a removal rate of greater than about 7000 A/mm. While the foregoing examples of process parameters, outcomes and results are often desirable, other suitable outcomes and results are contemplated herein.

In the CMP process performed with Example 16C, an unusually high copper removal rate was obtained, such that all of the copper was removed. This result prevented measurement of a uniformity value. Example C, with only 1.5% peracetic acid, is also a useful composition of the present invention, although it may be a bit too aggressive in terms of removal rate for some applications such as the polishing of very thin layers of copper on a substrate. The polishing compositions of this invention must be carefully controlled to be used with copper, or too high a substrate removal rate may result. Accordingly, for some applications, a CMP process using Example C may be altered by diluting the composition, diluting the activator-coated abrasive and/or oxidizing agent components of the composition, changing the composition flow rate, or the like.

In the CMP process performed with Example 16D, using the activator-coated abrasive with a hydroxylamine activator, a desirable copper removal rate was obtained. Additionally, the surface of the wafer polished using Example 16D was substantially uniform. Example D is thus a desirable composition of one embodiment of the present invention.

Another example compares the CMP compositions Example 16B and Example 16E to similar prior art compositions, each of which were used in the CMP of a silicon wafer that had a tungsten layer on its surface, the layer being of about 8000 A in thickness. Example 16 B was compared to a similar comparative example, Example C1, and Example E was compared to a similar comparative example, Example C-2. Neither of comparative examples C-1 and C-2 contained activator-coated abrasive. Example E and comparative example 2 contained ethylene glycol, the purpose of which was to boost the removal rate. The pH of all four compositions was about 2. The components of the four compositions and the approximate amounts thereof (balance water) are set forth in Table 18 below.

TABLE 18

CMP Examples 16 B and 16 E and Comparative Examples C-1 and C-2

| Weight %: | $H_2O_2$ | Peracetic Acid | Mirasol | Mirasol/ Fe—Ac | Ethylene Glycol |
|---|---|---|---|---|---|
| Example 16 B | 0 | 5 | 5 | 0.5 | 0 |
| Comp. Ex. C-1 | 0 | 5 | 5 | 0 | 0 |
| Example 16 E | 3 | 0 | 5 | 0.5 | 0.25 |
| Comp. Ex. 2 | 3 | 0 | 5 | 0 | 0.25 |

Each of the four compositions were used in a conventional CMP process having the same process parameters as previously described in the first example and set forth in Table 3 above. Each of Comparative Examples C-1 and C-2 were tested twice, in a Trail A and a Trial B, respectively. The results of each CMP process in terms of the approximate material (tungsten) removal rate in A/mm and the approximate % WIWNU are set forth in Table 19.

TABLE 19

CMP Results Using Ex 16B or 16E or Comparative Examples C-1 or C-2

| | Removal Rate (A/mm) | Nonuniformity (% WIWNU) |
|---|---|---|
| Example 16 B | 5080 | 7.4 |
| Comp. Ex. C-1, Trial A | 2220 | 7.0 |
| Comp. Ex. C-1, Trial B | 2470 | 6.9 |
| Example 16 E | 4480 | 4.6 |
| Comp. Ex. 2, Trial A | 1560 | 3.4 |
| Comp. Ex. 2, Trial B | 1580 | 3.3 |

The utility of somewhat larger amounts (e.g., between 0.2% and 1% by weight of the slurry) of activator-coated abrasive, in this case iron ion activator bonded directly to silica with no inorganic stabilizers, is clear from the above examples. In terms of the tungsten removal rate, Examples 16B and 16E each outperformed Comparative Examples C-1 and C-2 by over 200 percent. More importantly, the non-uniformity was very low, that is, between 4.6% and 7.4%. The CMP performances of Example 16B and Example 16E are impressive, even when the moderate decreases in surface uniformity are considered.

The above examples had 5% uncoated abrasive and 0.5% coated abrasive. We found that the amount of non-activator-coated abrasive could be reduced, provided there was sufficient activator-coated abrasive, and the result was excellent polishing characteristics. Example 16-F used a slurry having 5% peracetic acid, 2.5% Mirasol, and 0.5% Mirasol with Fe-Acetate at pH 2. The etch rate through tungsten was 4300 angstroms per minute, and the percent nonuniformity was very low, between 2.7% and 5.6% for multiple samples. This compares favorable with the 7.4% WIWNU observed when a substrate was polished with example 16B, having a similar polishing slurry composition but twice the uncoated silica. These results demonstrate that the activator-coated abrasive is an effective and potent component in the compositions of this invention.

The minor increases in the Nonuniformity with the activator coated abrasives may in part be due to using a mixture of a relatively small quantity of highly activator-coated abrasive (about 70% of outer surface coated with activator) and a greater amount of abrasive without activator. It is believed that the free radicals generated in the polishing composition have a relatively short lifespan, and increases in polishing rate due to the higher concentrations of free radicals is a fairly local phenomenon restricted to the volume very near (e.g., perhaps within a few microns or less) the activator-coated particle. It is believed that a more uniform mixture comprising either only abrasive with activator, where the activator is both present in a small percentage of the surface area, or alternatively a mixture of activator-coated abrasive and non-activator-coated abrasive where the weight ratio thereof is between 0.2:1 to about 2:1, will reduce non-uniformity.

Example 17

Example 17 I used a composition having 0.1% Mirasol with Fe-acetate activator, 3% peracetic acid, and 5% Mirasol. This composition exhibited superior CMP etch rate over a similar composition without the activator for copper, ranging from 2200 to 4700 angstroms per minute at different processing conditions, but the best nonuniformity observed in these tests was 13.7%. This is somewhat higher than is desirable. While iron is a superior activator, especially for tungsten polishing, other metals have been found to work. Example 17 F used a composition having 0.1% Mirasol with copper activator, 5% peracetic acid, and 5% Mirasol. This composition exhibited superior CMT etch rate over a similar composition without the activator.

Example 17 G used a composition having 0.2% Mirasol with Mn (as the acetate salt) activator, 5% peracetic acid, and 5% Mirasol. This composition exhibited superior CMP etch rate over a similar composition without the activator. Example 17 H used a composition having 0.5% Mirasol with Mn-acetate activator, 3% hydrogen peroxide, and 5% Mirasol. This composition exhibited superior CMP etch rate over a similar composition without the activator, but the rate for titanium was greatly enhanced while the rate for tungsten improved only marginally: for tungsten the removal rate was 246 angstroms per minute; for TEOS the removal rate was 778 angstroms per minute; and for titanium the removal rate was >2200 angstroms per minute. Manganese is a less effective activator than either iron or copper as an activator, but this activator can be useful.

One place where a less aggressive activator is useful is when polishing copper substrates. For polishing copper metal disposed on substrates, the activators copper and/or manganese are very useful. Example 17 J used a composition having 0.5% Mirasol with Mn-acetate activator, 5% hydrogen peroxide, and 5% Mirasol. This composition exhibited superior CMP substrate removal rate, about 2380 angstroms per minute, over a similar composition without the activator which had etch rates of 270 to 380 angstroms per minute, for copper. Further, those wafers polished without activator had about three times the nonuniformity as those wafers polished with the slurry of this invention, which exhibited nonuniformity between 8.8 and 11.9%.

Example 18

The next example shows slurry stability. This effective activator-coated abrasive component functions optimally in commercial settings when it is relatively, if not substantially, stable. Slurry stability is a desirable characteristic in the composition, as it facilitates control of the CMP process. Thus, tests were conducted to determine the relative stability of the activator-coated abrasive used in the composition of the present invention, as compared with that of a soluble promoter of similar chemical composition, in the presence of an oxidizing agent, in two other compositions.

In these slurry stability tests, the activator-coated abrasive was Mirasol/Fe—Ac, and an oxidizing agent in the form of hydroxylamine and had a pH of about 7. The first "free promoter" composition was composed of normal abrasive in the form of silica particles, soluble promoter in the form of iron nitrate, and oxidizing agent in the form of hydroxylamine, and had a pH of about 7. The second "free promoter" composition was composed of all of the components of the first "free promoter" composition except for the abrasive component. The three test compositions were prepared as set forth below. A activator-coated abrasive preparation was obtained by adding an appropriate amount of the activator-coated abrasive to 50 milliliters of water, while a first "free promoter" preparation was obtained by adding the silica particles to 50 ml of water, and then adding an appropriate amount of the iron nitrate to the water-abrasive mixture to give the same iron content in the slurry. The amount of abrasive in the first "free promoter" preparation was similar to the amount of activator-coated abrasive used in the "coated activator" preparation. A second "free promoter" preparation containing only iron nitrate dissolved in 50 ml of water (i.e., no abrasive) was also prepared.

The same designated amount of 50% hydroxylamine was added to each of these preparations to obtain the three test compositions. At a pH of over 6, hydroxylamine is a good reducing agent, the stability of which is extremely sensitive to trace metals in solution. hydroxylamine reacts easily with many soluble transition metal ion promoters, such as cobalt, copper and iron ions, resulting in the reduction of the metal ions by at least one oxidation level and the formation of by-products including nitrogen gas, ammonia ($NH_3$), water, and possibly heat, depending on the concentration of the hydroxylamine. A high level of reactivity, or a very fast reaction rate, is a sign of relative instability.

When the hydroxylamine component was added to obtain the "activator-coated abrasive" composition, little color change, little or no outgassing, and little or no precipitation were observed. When the first "free promoter" composition containing silica abrasive was formed, an immediate color change (light orange to brown), substantial outgassing, and precipitation were observed. When the second "free promoter" composition containing no abrasive was formed, an even more immediate color change (light orange to very dark brown) and similar outgassing, as compared to the first "free promoter" composition, were observed. The "activator-coated abrasive" composition was clearly more stable than the two relatively unstable "free promoter" compositions tested. The slurry remained useable, that is, had a CMP rate on tungsten and TEOS of at least about one half of the CMP rate for a freshly prepared formulation, after 24 hours.]

Another aspect of slurry stability is the stability of the abrasive in terms of remaining stabilized in the liquid carrier. As previously discussed, the stabilizers, and most particularly boric acid-based stabilizers, can alter the zeta potential of particles and can thereby greatly increase the suspension stability. In the absence of stabilizers, or in addition to stabilizers, the presence of certain ions can promote slurry stability. A series of tests were performed to determine the pot life of slurries of this invention. We have found through a series of experiments that adding sulfate, either as an acid or as a salt, can extend the colloidal stability of a slurry comprising ~80 nm iron-coated silica to up to about 5 days. The ferric coating, in the absence of salts or stabilizers, results in colloids of ~80 nm iron-coated silica that settle out to a commercially unacceptable amount in only about a day.

Example 19 and Comparative Example

This example illustrates use of boron-modified silica, in particular a silica of mean diameter between 40 to 55 nanometers manufactured as described in Example 6, following a procedure was used for the preparation of boron-coated silica as described in U.S. Pat. No. 6,743,267 (issued to DuPont AirProducts Nanomaterials, inventors: P. Jernakoff, and J. Siddiqui). Approximately 1 kg of an acidic form of AMBERLITE™ IR-120 ion exchange resin (Rohm and Haas Company, Philadelphia, Pa.) was prepared. This ion exchange resin was then added incrementally to 12 kg of SYTON™ HT 50 (12 kg, approximately 2.27 gallons, DuPont Air Products NanoMaterials L.L.C., Tempe, Ariz.) in 2.50 kg of deionized water, with agitation, until the slurry pH was about 2. Subsequently, the mixture was passed through a 500-mesh screen to remove the resin and afforded deionized SYTON™ HT 50.

The boric acid stabilizer was also added as previously described. A solution of 268 g of boric acid powder (Fisher Scientific, 2000 Park Lane, Pittsburgh, Pa., 15275) in 5.55 kg of deionized water was prepared and heated to 55-65° C. Deionized and wetted SYTON™ HT 50 (14.5 kg) was then added to the boric acid solution slowly over about 1.2 hours by adding it at approximately 200 ml/minute and maintaining the temperature greater than 52° C. while agitating the mixture. After this addition was completed, heating at 60° C. and agitation of the mixture were continued for 5.5 hours to afford boron surface-modified colloidal silica. This boron surface-modified colloidal silica was characterized for colloid stability over 15 days using a Colloidal Dynamics instrument (11-Knight Street, Building E8, Warwick, R.I., 02886), and was found to exhibit both constant pH (pH approximately 6.6) and zeta potential (zeta potential approximately −58 millivolts) over the 15-day test period. The percentage of surface sites of this surface-modified colloidal silica occupied by boron-containing compound(s) was approximately 98%.

Comparative Example 19-A, Step 2: After preparing the boron-coated silica, in step 2, the boron-coated silica was used for polishing tungsten wafers in comparative Example 19-A. In comparative Example 19-A, the components of the slurry formulation are: 1) 13.0 grams of boron-surface-modified Colloidal silica; 2) 30 ppm of 30% nitric acid in water; 3) 947 grams of De-ionized water; and 4) 40 grams Hydrogen peroxide. The procedure for mixing this 1.0 Kg batch size slurry was as follows. In a 2-liter beaker, 947 grams of de-ionized water were transferred. Under agitation, 13.0 grams of boron coated silica was added slowly during a period of three minutes. After completing the addition of the boron coated colloidal silica, 40 grams of hydrogen peroxide was added during a period of 4 minutes to the silica sol mixture. The mixture was agitated for additional 4 minutes. After 4 minutes of agitation, under agitation, 30 ppm of 30% nitric acid was added. After stirring the mixture for 4 minutes, pH was 4.7, and zeta-potential was −141 mV.

Example 19-B, Step 2, used the previously described method of adding ferric ions to boron-surface modified silica to manufacture Iron-Boron coated silica. The slurry composition consisted of: 13.0 grams Boron-modified colloidal silica described above further modified with 16 ppm (based on the weight of the slurry, providing 3.7 ppm of ferric ions) of Ferric nitrate; 10 ppm of Nitric acid; 947 grams of De-ionized water; and 40 grams of Hydrogen peroxide. The Step 2 procedure for mixing the 1.0 Kg batch size slurry was as follows. In a 2-liter beaker, 947 grams of de-ionized water was transferred. After adding water to the beaker, it was kept under agitation using a magnetic stirrer. Under agitation, 13 grams of boron modified colloidal silica was added slowly during a period of 3 minutes. After completing the addition of the boron modified colloidal silica, 3.7 ppm of ferric ions (in the form of ferric nitrate) and the nitric acid were added to the dispersion. After completing the addition of ferric nitrate, the dispersion was stirred for additional 5 minutes, followed by the addition of 40.0 grams of hydrogen peroxide to the silica sol mixture. The mixture was agitated for additional 4 minutes, the pH of the polishing mixture was 4.7.

In Examples 19-C and 19-D, the polishing compositions were prepared using the procedure described in Example 2, however, the concentration of "iron" ion on the boron modified silica was increased from 3.6 ppm to 5.7 ppm in Example 19-C, and 7.6 ppm of "ferric" ion in Example 19-D. Example 19-E is same as Examples 19-C and 19-D, except the amount of "ferric" ion concentration on the boron modified silica surface was increased to the 57 ppm level.

Evidence for iron coating on the boron modified silica was obtained using two experimental methods, 1) zeta potential measurements of the coated abrasive as measured by Colloidal Dynamics, and 2) free ferric ion concentration in the dispersion using ICP-MS (Inductive coupled Plasma mass spectroscopy. Measurement of immobilized iron on the abrasive surface using Zeta potential of iron coated silica is shown in the data in table TZBN, zeta potential data of boric acid modified silica (example 19-A), and different concentrations of ferric ions immobilized on the boric acid coated silica (examples 19-B to 1 9-E) are summarized. Clearly as the concentration of ferric ion increased form 3.6 ppm to 57 ppm lower amounts of iron, the zeta potential increased about 13.5 mV per ppm Fe ions added, but the increase "per ppm Fe ion added" was much lower at 57 ppm Fe added. Measurement of free ferric ions in the solution phase of "iron-boron" coated silica dispersion supports this conclusion. Using ICPMS, the amount of free iron ion in known concentration of ferric nitrate solutions was measured using an appropriate calibration curve. The solution part of the "iron-boric" coated silica dispersion was separated from the abrasive part, and the solution part was tested for ferric ion concentration. The measured value was less than 0.1 ppm, which suggests iron coating on the boric acid modified silica. The two experiments, as described above, conclusively suggest that ferric ions readily coated boric acid modified silica via acid-base reaction, where ferric ion is a Lewis acid, and boric acid modified silica is a Lewis base.

The polishing formulations were used to polish tungsten and PETEOS wafers, the results are summarized in table Tvbm. For all polishing experiments, Mirra® polishing tool, manufactured by Applied Materials, 3050 Bowers Avenue, Santa Clara, Calif., 95054, was used. The polishing compositions were used to polish CVD tungsten blanket wafers and PETEOS blanket wafers (PETEOS, plasma enhanced tetraethoxy silane, dielectric oxide layer) using a polishing tool. The blanket wafers were purchased from Silicon Valley Microelectronics, 1150 Campbell Ave Calif. 95126. The PETEOS wafers had a film thickness specification of 15,000 Å PETEOS. The CVD tungsten wafers had film stack thickness specifications of 8000 Å CVD tungsten/250 Å titanium/ 6300 Å thermal oxide. The polishing conditions on the Mirra® were set as follows: Flow rate of polishing composition=120 ml/min (milliliters per minute); Retaining ring (psi) =6.8 psi; Membrane pressure=3.5 psi; Inner tube pressure=6.3 psi; Platen speed=120 revolutions per minute (RPM); and Head speed=130 RPM. The substrate was effectively planarized using the above comparative polishing composition under the stated conditions. The tungsten, PETEOS removal rates, and tungsten to PETEOS selectivity is shown in example in table 20.

TABLE 20

Effect of Composite "Iron - Boron" coated Silica on Removal Rates

|  | Comp Ex 19-A, Control, b-modified silica | Ex 19-B B—Fe modified silica (3.6 ppm Fe) | Ex 19-C B—Fe modified silica (5.7 ppm Fe) | Ex 19-D, B—Fe modified silica (7.6 ppm Fe) | Ex 19-E: B—Fe modified silica (57 ppm Fe) |
|---|---|---|---|---|---|
| Colloidal silica | 1.3 wt % | 1.3 wt % | 1.3 wt % | 1.3 wt % | 1.3 wt % |
| Zeta potential | −141 mV | −92.3 mV | −64.2 mV | −39.3 mV | +39.9 mV |
| H2O2 (wt %.) | 4 | 4 | 4 | 4 | 4 |
| Water (wt. %) | 94.7 | 94.7 | 94.7 | 94.7 | 94.65 |
| pH | 4.7 | 4.7 | 4.2 | 3.9 | 3.8 |
| W RR (A/min) | 427 | 3800 | 5540 | 6230 | 7600 |
| TEOS RR(A/min) | 58 | 35 | 50 | 93 | 83 |
| W:TEOS Selectivity | 7 | 109 | 111 | 67 | 92 | of ferric ions, zeta potential increased from (minus) −141 mV (no ferric ions) to −39.3 mV for the particles having 7.6 ppm ferric ion on the surface. Interestingly, a charge reversal occurred on the "iron-boron" coated silica as the concentration of ferric ion increased to 57 PPM, the zeta potential increased to +39.9 mV for the "iron boric " coated silica. Zeta potential data is presented in table Tvbm. The increase in the zeta potential is direct evidence that the iron was indeed being absorbed onto or bound with the boron-stabilized silica. With In Table 20, example 19-A is the comparative example with boron coated silica whereas examples 19-B to 19-E contain different amounts of "ferric" ions coated on the boron coated silica. The boron coated silica with no "ferric" ion on the silica surface gave very low tungsten removal of 427 A/min, and "ferric" ion coated silica in Example 19-B with 3.6 PPM of "ferric" ions gave tungsten removal rate of 3804 A/min, a 9× fold increase in tungsten removal rate. Even higher rates were observed with the higher amounts of iron added to the boron-surface-modified silica abrasive. Clearly data show that "ferric" ion coating on the boron coated silica increased tungsten removal rates dramatically. A dramatic increase in the tungsten removal rates with "ferric" ion coated boron coated silica strongly suggests that abrasive particles during chemical planarization of tungsten acts as a powerful Fenton's reagent for the decomposition of hydrogen peroxide, thus dramatically increasing tungsten removal rates and excellent tungsten to PETEOS selectivity. Surprisingly, the rate of polishing of PETEOS was about the same for the control sample 19-A as for the B—Fe-modified silica abrasive.

Example 20

It has been found that CMP polishing compositions comprising an iron-boron surface-modified silica, a peroxide-type oxidizing agent, and ascorbic acid or a derivative thereof possess high stability with regard to maintaining near constant levels of components over long periods and consequently maintaining propensity for affording high removal rates over long periods in comparison to otherwise identical compositions without ascorbic acid (or a derivative thereof) being present. The second benefit of adding ascorbic acid or a derivative thereof is that it is effective in reducing iron ion contamination on the polished surface of wafers. As ascorbic acid (or a derivative thereof) removes metal contamination during polishing, this eliminates additional cleaning or buffing steps during the fabrication of semiconductor devices.

Zeta potential measurements were made using a Colloidal Dynamics instrument, manufactured by Colloidal Dynamics Corporation, 11 Knight Street, Building E8, Warwick, R.I. 02886. This instrument measures the zeta potential (surface charge) of colloidal particles, such as surface-modified colloidal silica particles. The CMP tool that was used is a Mirra®, manufactured by Applied Materials, 3050 Boweres Avenue, Santa Clara, Calif., 95054. The polishing conditions on the Mirra® were set as follows: Flow rate of polishing composition=120 ml/min (milliliters per minute); Retaining ring=6.8 psi; Membrane pressure=3.5 psi; Inner tube=6.3 psi; Platen speed=120 rpm; and Head speed=130 rpm. A Rohm and Haas Electronic Materials IC1010™ pad, supplied by Rohm and Haas Electronic Materials, 3804 East Watkins Street, Phoenix, Ariz., 85034, was used on the platen for the blanket wafer studies. The blanket wafers used in this work were purchased from Silicon Valley Microelectronics, 1150 Campbell Ave, Calif., 95126. PETEOS wafers had 15,000 Å on silicon, Tungsten wafers had 10,000 Å CVD over 5000 Å thermal oxide on silicon; and Titanium nitride wafers had 3000 Å TiN over 3000 Å thermal oxide. Rohm and Haas Electronic Materials IC1010™ pads were used for polishing. The IC1010™ pad consists of a rigid microporous polyurethane with a radial grooving pattern top pad and a Suba™ IV impregnated felt sub-pad. Rohm and Haas Electronic Materials is based in Newark, Del. PETEOS thickness was measured with a Nanometrics, model, #9200, manufactured by Nanometrics Inc, 1550 Buckeye, Milpitas, Calif. 95035-7418. The metal films were measured with a ResMap CDE, model 168, manufactured by Creative Design Engineering, Inc, 20565 Alves Dr, Cupertino, Calif., 95014. This tool is a four-point probe sheet resistance tool. Twenty-five and forty nine-point polar scans were taken with the respective tools at 3-mm edge exclusion. Planarity measurements were conducted on a P-15 Surface Profiler manufactured by KLA® Tencore, 160 Rio Robles, San Jose, Calif. 95161-9055.

A batch of boric acid modified silica was prepared as discussed in previous example 6, said boric acid modified silica having 268 g boric acid added onto 12 kg of SYTON® HT 50. The boric acid-stabilized silica was over a 15 day period found to exhibit both constant pH (pH approximately 6.6) and zeta potential (zeta potential approximately −58 millivolts). The percentage of surface sites of this surface-modified colloidal silica occupied by boron-containing compound(s) was approximately 98%.

Comparative Example 20-A had 43.5 grams Boron surface-modified Colloidal silica in 823 grams of water, to which was added 38 ppm of Ferric nitrate nonhydrate (7.6 ppm ferric ion), as well as 30 ppm Nitric acid to control the pH, and 133.3 grams aqueous 30% hydrogen peroxide. After stirring the mixture for 4 minutes, the pH was 4.7, and the zeta-potential −39.3 mV. In Example 20-B, the formulation was same as Example 20-A, the only difference being the addition of 200 ppm of ascorbic acid at the last step during the preparation of the polishing formulation. The polishing characteristics of these slurries were measured immediately after preparing the slurry, again at 24 hours, and finally again after six days. The data is presented in Table 21.

TABLE 21

Effect of Ascorbic acid on the Stabilization of a CMP slurry Containing $H_2O_2$ in the Presence of Iron-Boron surface-modified Silica

| | Comp Ex 20-A: Zero time | Comp Ex 20-A: 24 hours | Comp Ex 20-A: Six days | Ex 20-B: Zero time | Ex 20-B: 24 Hours | Ex 20-B: Six days |
|---|---|---|---|---|---|---|
| B/Fe (7.6 ppm) surface-modified colloidal silica | 43.5 g | 43.5 g | 43.5 g | 43.5 g | 43.5 g | 43.5 g |
| Ascorbic acid (ppm) | 0 | 0 | 0 | 200 | 200 | 200 |
| $H_2O_2$ (30 wt.) | 133.3 g | 133.3 g | 133.3 g | 133.3 g | 133.3 g | 133.3 g |
| Water (wt.) | 823 g | 823 g | 823 g | 823 g | 823 g | 823 g |
| pH | 3.9 | 4.1 | 3.9 | 4.1 | 3.8 | 3.9 |
| Tungsten RR (Å/min) | 6590 | 5856 | 3832 | 6430 | 6236 | 5479 |
| TEOS RR (Å/min) | 189 | 168 | 135 | 249 | 210 | 184 |
| TiN RR (Å/min) | 1037 | 820 | 917 | 1458 | 1532 | 1519 |
| W:TiN Selectivity | 6.3 | 7.1 | 4.2 | 4.4 | 4.0 | 3.6 |
| W:TEOS Selectivity | 35 | 35 | 28 | 26 | 29 | 30 |

It can be seen that in the absence of ascorbic acid chelator, there is about a 11% degradation in substrate removal rates after a CMP slurry of this preferred embodiment of the invention. This modest amount of degradation can be commercially acceptable, but after six days, the tungsten removal rate is so degraded (>40% loss of tungsten removal rate) as to be unacceptable. There is also a similar decline in the TEOS removal rate, but the TiN removal rate showed an initial decline over 24 hours but little change (or even a rebound) thereafter.

In contrast, with only 200 ppm of ascorbic acid added to the slurry, the decline in the tungsten removal rate was only 3% over 24 hours, which is commercially an excellent result, and the decline in the tungsten removal rate even after 6 days was only about 15%, which is commercially acceptable. Therefore, manufacturing processes are made easier because in normal operations a tank of slurry can be prepared and used without taking into account slurry degradation, and even when production is interrupted the slurry remains useful for several days. Another advantage of ascorbic acid addition was in maintaining a consistent titanium nitride removal rate from time zero to six days. Also, addition of ascorbic acid increases the titanium nitride removal rate. This is advantageous because the TiN is generally used as a very thin barrier layer, and once reached the manufacturer will not wish the have long polishing times to remove residual TiN, where such long polishing times will increase tungsten erosion.

It is well known that tungsten and titanium nitride removal rates are sensitive to the concentration of $H_2O_2$, so in a separate set of experiments, the rate of decomposition of $H_2O_2$ with and without ascorbic acid or/and ascorbic acid derivates in the slurry formulation was investigated. The slurries used for hydrogen peroxide stability nominally had the compositions of Example 20-A, but started with about 4.3% hydrogen peroxide. To one aliquot, 200 ppm ascorbic acid was added, providing a slurry much like that described in Example 20-B. In a second aliquot, 200 ppm of ascorbic palminate was added to the slurry. Finally, as a control, in a third aliquot, 200 ppm of acetic acid was added. Both the aliquot having 200 ppm ascorbic acid and the aliquot having 200 ppm of ascorbic palminate showed substantially no decline (less than 0.2% absolute concentration) over 8 days. In contrast, the aliquot having 200 ppm acetic acid saw the hydrogen peroxide concentration drop from 4.3% at time zero to 2.1% at day six, and further fell to 1.6% by day eight. Clearly the data suggest that slurry formulations with ascorbic acid or ascorbic palmitate stabilized the slurry. This explains as to why the addition of ascorbic acid (and ascorbic acid derivatives such as ascorbic palmitate) in the slurry formulations stabilized the titanium nitride and tungsten removal rates for several days.

The next set of experiments showed the effect of adding ascorbic acid (to polishing formulations containing iron-boron surface-modified colloidal silica) on iron ion contamination on the polished PETEOS wafers after polishing. Example 20-C had boron modified silica coated with 3.6 PPM of ferric ions, with no ascorbic acid added. Two slurries used had the same compositions as examples 20-A and 20-B, containing Boron modified silica coated with 7.6 PPM of ferric ions with no ascorbic acid (20-A) or with 200 ppm ascorbic acid (20-B). Additionally, two more control samples were prepared containing Boron modified silica coated with 7.6 PPM of ferric ions with no 200 ppm acetic acid (20-C) and with 800 ppm acetic acid (20-D). The slurries were used to polish PETEOS wafers using method described above. After the polishing experiment, iron ion concentration on the polished wafer surface was measured using TXRF (X-ray fluorescence spectrometry) method. First, we found that the amount of contamination of the polished wafer is proportional to the amount of ferric ions (activator ions) in the slurry. The slurry having 3.6 ppm total activator iron (and no acid) left 81.4×E10 ferric atoms per square centimeter of substrate, while the slurry having 7.3 ppm total activator iron (and no acid) left 205×E10 ferric atoms per square centimeter of substrate. The addition of only 200 ppm of ascorbic acid to the slurry having 7.3 ppm total activator iron provided a remarkable reduction in the iron contamination, leaving only 13.2×E10 ferric atoms per square centimeter of substrate. This is only about 6% of the iron contamination from a similar slurry without the ascorbic acid. Acetic acid had little effect. The addition of 200 ppm of acetic acid to the slurry having 7.3 ppm total activator iron left only 212×E10 ferric atoms per square centimeter of substrate, about the same as is left by a slurry having no acid. Increasing the amount of acetic acid to 800 ppm reduced subsequent iron contamination only slightly, to 188×E10 ferric atoms per square centimeter of substrate.

Example 21

A similar set of experiments to determine the effectiveness of ascorbic acid on reducing the iron contamination of substrate surfaces were run on slurries comprising commercially available iron-coated silica. In particular, this example provides data on the efficiency for reducing iron ion contamination on polished wafer surfaces after CMP using (i) MicroPlanar® CMP3600 ™ alone versus (ii) formulations derived from the addition of ascorbic acid to MicroPlanar® CMP3600™. MicroPlanar® CMP3600™ is a commercially available tungsten CMP slurry from DuPont Air Products NanoMaterials L.L.C., Tempe, Ariz. The formulation modification of CMP3600™ in these examples is the inclusion of ascorbic acid to reduce the iron ion contamination level on the PETEOS wafer; after CMP and standard post CMP cleaning with dilute ammonia solution. Ascorbic acid was shown to be efficient at reducing trace iron ion contamination on the wafer surface post CMP.

Polishing of PETEOS blanket wafers was done under the following conditions: Polish Tool used was an Ebara EPO222D, and measurements were made using a Rigaku TXRF-3 pt(0,0; 0,50 and −50,0), a KLA Tencor SP1 (10 mm E), a 4 Dimension 4 point probe (49 pt line), and a KLA Tencor F5x (49 pt line). The results that were obtained are summarized below in Table 22. It is seen that the addition of 400 ppm of ascorbic acid to MicroPlanar® CMP3600™ resulted in a significant reduction in iron ion contamination of the wafer surface after performing CMP and standard post CMP cleaning with dilute ammonia solution. This reduction in iron ion contamination did not decrease the tungsten removal rate.

At the same time, the data clearly shows that use of boron-stabilized ferric ion coated silica slurries having less than 10 ppm activator and 200 ppm ascorbic acid (such as were tested in Example 20) provided a much lower level of iron contamination than was achieved using the commercial slurry, even with the addition of 400 ppm ascorbic acid.

TABLE 22

Effect of Ascorbic Acid Added to a CMP3600 ™ Iron-coated Silica-containing Slurry having 4% hydrogen peroxide

| Example No | Ascorbic Acid at point-of-use | Iron Ion contamination on PETEOS Wafer After Post CMP Cleaning and Rinsing | Tungsten Removal rate Å/min |
|---|---|---|---|
| Comp. Ex. 21-A | 0 ppm | 376.7 × E10 atoms/cm$^2$ | 4010 |
| Ex. 21-B | 100 ppm | 356.6 × E10 atoms/cm$^2$ | 4576 |
| Ex. 21-C | 400 ppm | 93.5 × E10 atoms/cm$^2$ | 4147 |

Addition of lactic acid instead of ascorbic acid into the same slurry provided the results in Table 23.

TABLE 23

Effect of Lactic Acid Added to a CMP3600 ™ Iron-coated Silica-containing Slurry having 4% hydrogen peroxide

| Example No | Lactic Acid at point-of-use | Iron Ion contamination on PETEOS Wafer After Post CMP Cleaning and Rinsing | Tungsten Removal rate Å/min |
|---|---|---|---|
| Comp. Ex. 21-A | 0% | 376.7 × E10 atoms/cm$^2$ | 4010 |
| Ex. 21-D | 0.14% | 62.4 × E10 atoms/cm$^2$ | 4981 |
| Ex. 21-E | 0.28% | 38.5 × E10 atoms/cm$^2$ | 5367 |
| Ex. 21-E | 0.42% | 30.3 × E10 atoms/cm$^2$ | 5282 |

It is seen that the addition of 0.1% to 0.5% of lactic acid to MicroPlanarW CMP3600™ resulted in a significant reduction in iron ion contamination of the wafer surface after performing CMP and standard post CMP cleaning with dilute ammonia solution. The relatively large, e.g., 0.1% to 0.5%, of a chelator like lactic acid appears not only to effectively reduce the amount of iron contamination of the substrate, but also provides a significant increase in the tungsten removal rate.

Example 22

It is important that a slurry can retain activator on the abrasive particles even at higher ascorbic acid concentrations. Generally, slurries are sold as concentrates. In one embodiment, a slurry concentrate may comprise for example 0.5% to 4% activator-free abrasive, such as silica having an average diameter between about 80 nm and 250 nm, for example between 150 nm and 200 nm in diameter; from 0.5% to 4% activator-coated abrasive, such as iron coated silica, where the total activator iron in the slurry concentrate is between 30 and 300 ppm, for example between 150 and 250 ppm, and wherein the total ascorbic acid in the slurry concentrate is between 600 ppm and 6000 ppm, for example between 1200 and 3000 ppm, where the slurry concentrate is to be diluted and mixed with an oxidizer prior to use, where the total dilution is between about 1 part slurry concentrate per about 2 part to about 6 parts fluid (usually predominately water with some oxidizer). Generally, such high concentrations of ascorbic acid will over long periods of time (weeks to a few months, as are often encountered in manufacturing, shipping, and using product) strip much of the activator from a suspended abrasive. At low pH such as pH 3 virtually all the activator can be stripped from the abrasive by the more concentrated ascorbic acid solution. Increasing the pH of the composition to between 6 and 7 will stabilize activator such that a significant fraction of the activator remains on the surface of the abrasive particles.

If the abrasive is first coated with a stabilizer, in particular a boric acid-based stabilizer, prior to coating the abrasive with activator, then the activator is more tenacious and a greater fraction will remain attached onto the surface of the abrasive, as compared to for example activator absorbed directly onto the abrasive. Without being bound by theory, we believe the boric acid ligand is a stronger base then the silica-oxygen ligand. Also, the —Si—O—Si—O— bond length is greater than the —O—B—O—B—O— bond length, so ionically the iron is more tightly and tenaciously attached to a boron-oxygen surface that to a silicon-oxygen surface. The most preferred slurry concentrate has boron-iron-surface-modified abrasive material, where the pH of the slurry concentrate is between 5 and 7, say between 6 and 6.5. The addition of the boron also allows the zeta potential to be either negative or positive, depending on the amount of activator iron absorbed onto the abrasive. The amount of stabilizer and activator can be varied to provide a desired zeta potential between about −120 mV to about +30 mV.

The above examples are meant to illustrate certain aspects of the invention, but are not intended to limit the invention in any way.

The invention claimed is:

1. A slurry composition for chemical-mechanical polishing a substrate, said slurry composition comprising:
   a) a fluid comprising water and at least one oxidizing compound that produces free radicals when contacted with an activator, and wherein the fluid pH is between about 2 to about 8; and
   b) a plurality of abrasive particles having a surface comprising:
      i) a stabilizer selected from borate, tungstate, aluminate, phosphoric acid, pyrophosphoric acid. stannate, a silanol, and mixtures thereof, wherein if the particle is alumina then the stabilizer is not aluminate; wherein the stabilizer is bonded to said surface and
      ii) at least one activator selected from ions or compounds of Ce, Cu, Fe, and mixtures thereof disposed on said surface, wherein said activator metal is present in an amount between about 0.2 ppm and 12 ppm based on the weight of the slurry.

2. The slurry composition of claim 1 wherein the activator is present in an amount between about 3 ppm and 8 ppm.

3. The slurry composition of claim 1 wherein said stabilizer forms a layer between at least a portion of said activator and said particle surface.

4. The slurry of claim 1 further comprising an α, β-dihydroxy enolic compound.

5. The slurry of claim 4, wherein the pH of the fluid is between about 6 and about 7.

6. The slurry of claim 1, wherein the activator is selected from Cu, Fe, and mixtures thereof.

7. The slurry of claim 6, wherein a stabilizer is selected from borate, tungstate, aluminate, and mixtures thereof.

* * * * *